United States Patent
Tanaka

(10) Patent No.: US 6,898,125 B2
(45) Date of Patent: May 24, 2005

(54) SEMICONDUCTOR DEVICE AND METHOD FOR DRIVING THE SAME

(75) Inventor: Yoshiyuki Tanaka, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 47 days.

(21) Appl. No.: 10/382,990

(22) Filed: Mar. 7, 2003

(65) Prior Publication Data

US 2004/0095830 A1 May 20, 2004

(30) Foreign Application Priority Data

Mar. 7, 2002 (JP) ........................................ 2002-062327

(51) Int. Cl.$^7$ .............................................. G11C 11/34
(52) U.S. Cl. .............................. 365/185.22; 365/185.04
(58) Field of Search ....................... 365/185.22, 185.04; 395/425

(56) References Cited

U.S. PATENT DOCUMENTS

| 5,097,445 A | 3/1992 | Yamauchi .................. 365/195 |
| 5,175,840 A | * 12/1992 | Sawase et al. .............. 711/103 |

FOREIGN PATENT DOCUMENTS

JP      10-301855      11/1998

* cited by examiner

Primary Examiner—M. Tran
(74) Attorney, Agent, or Firm—McDermott Will & Emery LLP

(57) ABSTRACT

A semiconductor device has a memory cell array composed of a plurality of electrically rewritable nonvolatile memory cells and output disabling means for disabling data held in the memory cell array from being outputted to the outside. The output disabling means disables the outputting of the data when the power supply is turned ON and removes the disabling of the outputting of the data if a specified operational procedure is performed to the memory cell array.

43 Claims, 17 Drawing Sheets

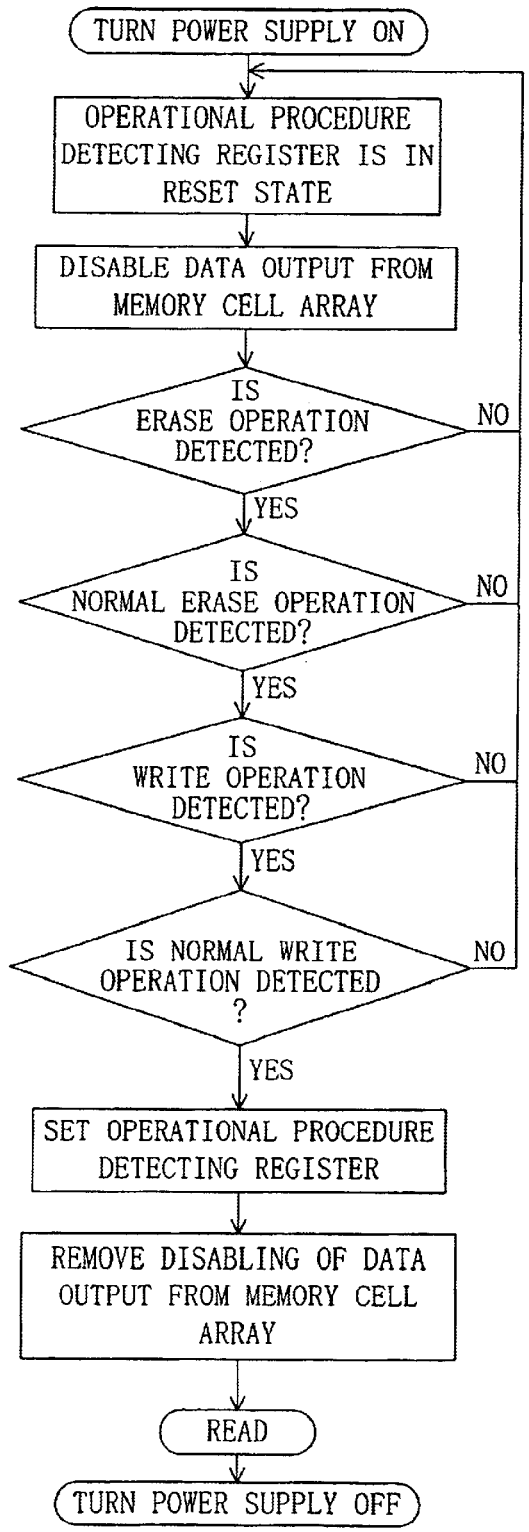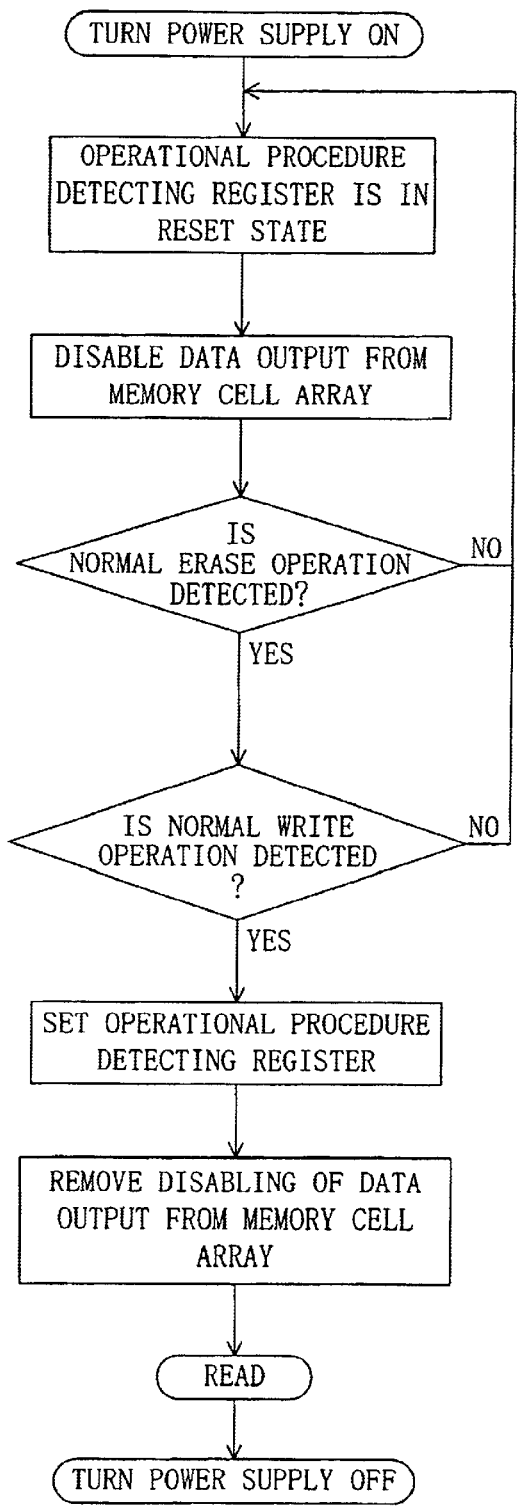

SEMICONDUCTOR DEVICE AND METHOD FOR DRIVING THE SAME

BACKGROUND OF THE INVENTION

The present invention relates to a semiconductor device comprising an electrically erasable and writable nonvolatile memory. More particularly, it relates to a semiconductor device which allows a rewrite operation performed to a nonvolatile memory from the outside thereof and security protection of data written in the nonvolatile memory and to a method for driving the same.

In recent years, there has been implemented a semiconductor device comprising an electrically erasable and writable nonvolatile memory (EEPROM: Electrically Erasable and Programmable Read Only Memory) which is designed to enable a rewrite operation (i.e., an erase operation and a write operation) to be performed to the EEPROM from the outside thereof through connection to a device such as a ROM writer. For example, an EEPROM-embedded microcomputer having an EEPROM storing a program to be processed by a central processing unit (CPU) allows a user to rewrite the program from the outside and thereby enables the CPU to execute a process desired by the user.

However, the foregoing semiconductor device which allows a rewrite operation from the outside also allows the reading of data to the outside so that it is necessary to provide a security protecting function for disabling a read operation from the outside and thereby protect data held in the EEPROM from being improperly used by an outsider. In providing the security protecting function, it is essential to enable an authorized user to perform a rewrite operation and a read operation if required, while enabling security protection.

A description will be given herein below to a semiconductor device having a security protecting function as a conventional embodiment.

FIG. 17(a) shows a functional configuration of the semiconductor device according to a first conventional embodiment.

As shown in FIG. 17(a), a semiconductor device 1001 according to the first conventional embodiment comprises: a CPU 1002; a RAM (Random Access Memory) 1003; a control circuit 1004; and a nonvolatile memory block 1005 for storing data and has: a control signal input terminal 1006; an address input terminal 1007; and a data I/O (input/output) terminal 1008 to allow a rewrite operation and a read operation to be performed to the nonvolatile memory block 1005 from the outside. As circuits for controlling the operations from the outside, there are provided a rewrite control circuit 1009, an external I/O controller 1010, and an erased state detecting circuit 1011. The nonvolatile memory block 1005 is constituted by a memory cell array 1012 having a plurality of EEPROM cells arranged in rows and columns, an I/O controller 1013 for controlling an operation to the memory cell array 1012, a sense amplifier 1014, and a decoder 1015.

If an operation is performed to the nonvolatile memory block 1005 from the outside, e.g., a device such as a ROM writer is connected and an instruction specifying an operation and address information on a memory cell to which the operation is to be performed are inputted to the control signal input terminal 1006 and the address input terminal 1007, respectively. If a write operation is performed, data for wiring is further inputted to the data I/O terminal 1008. The instruction and the address inputted to the control signal input terminal 1006 and the address input terminal 1007 are generated by the rewrite control circuit 1009 into a control signal 1101 and an address signal 1102, respectively, which are inputted to the I/O controller 1013. Data for writing that has been received by the data I/O terminal 1008 is inputted as a data signal 1103 to the I/O controller 1013 by the external I/O controller 1010.

The I/O controller 1013 performs an operation to the memory cell array based on the control signal 1101, the address signal 1102, and the data signal 1103. In a read operation, the I/O controller outputs the data signal 1103 as data held in the memory cell array 1012 to the external I/O controller 1010. In a verify operation, the I/O controller outputs a verify result signal 1104 indicative of the result of determining whether or not a write operation has been performed normally to the external I/O controller 1010.

The erased state detecting circuit 1011 is constituted to read data from the memory cell array 1012 when a power supply is ON, detect whether or not each of the memory cells in the memory cell array 1012 is in an erased state through the read operation, and raise the read disable remove signal 1105 to the HIGH level if it is detected that each of the memory cells in the memory cell array 1012 is in the erased state.

The external I/O controller 1010 disables the data signal 1103 from being outputted to the outside when the read disable remove signal 1105 inputted from the erased state detecting circuit 1011 is LOW and removes the disabling of the outputting of the data signal 1103 to the outside when the read disable remove signal 1105 is HIGH.

Thus, in the semiconductor device 1001 according to the first conventional embodiment, the disabling of the outputting of the data signal 1103 is removed only when the memory cell array 1012 is in the erased state. Even if an outsider tries to read data written in the memory cell array 1012, the outputting of data to the outside is prevented unless data in each of the memory cells in the memory cell array 1012 is erased. This protects the security of data written in the memory cell array 1012.

A semiconductor device according to a second conventional embodiment comprises: a first nonvolatile memory block for storing data; and a second nonvolatile memory block for read disabling the first nonvolatile memory block. The second nonvolatile memory block read disables the first nonvolatile memory block when data serving as, i.e., a password code is written in the second nonvolatile memory block.

In the semiconductor device according to the second conventional embodiment, read disable is removed only when a password code is inputted thereto from the outside and the inputted password code matches a password code held in the second nonvolatile memory block. This allows the security protection of the data written in the first nonvolatile memory block.

However, the semiconductor device according to the first conventional embodiment allows an outsider to improperly read the data held in the memory cell array 1012 by using the following procedure.

FIG. 17(b) is a graph for illustrating a method for improperly reading data held in the nonvolatile memory block in the semiconductor device according to the first conventional embodiment, which shows an example of respective current characteristics in memory cells in the erased state and in a written state. In the graph, the abscissa represents a gate voltage Vg and the coordinate represents a memory cell current Idcell when the gate voltage Vg is applied to the memory cell.

In a normal read operation as shown in FIG. 17(b), the memory cell is determined to be in the erased state if the memory cell current Idcell when the voltage V1 for reading is applied as the gate voltage Vg is larger than a read determination current I1, while it is determined to be in the written state if the memory cell current Idcell is smaller than the read determination current I1, due to different current characteristics in the memory cell in the erased state and in the memory cell in the written state, whereby "1" or "0" is read as the data stored in the memory cell.

If the voltage V2 higher than the normal voltage V1 is used as the gate voltage Vg, however, the cell current in the memory cell in the written state becomes larger than the read determination current I1 so that the memory cell is determined by mistake to be in the erased state.

Depending on the structure of the semiconductor device, there is also an exemplary case where a memory cell is determined to be in the written state if the memory cell current Idcell is larger than the read determination current I1, while it is determined to be in the erased state if the memory cell current Idcell is smaller than the read determination current I1. In this case also, the memory cell in the written state is determined by mistake to be in the erased state if a voltage lower than the voltage V1 for reading is used as the gate voltage Vg.

By thus intentionally setting the gate voltage Vg to be applied to the memory cell in the memory cell array 1012 to an abnormal value in the read operation, the outsider can cause the erased state detecting circuit 1011 to determine by mistake that each of the memory cells is in the erased state. Consequently, the read disable remove signal 1105 becomes HIGH as a result of the false determination by the erased state detecting circuit 1011 without performing an erase operation to the memory cell array 1012 so that the setting of output disable is removed in the external I/O controller 1010. In this manner, the outsider can improperly read the data held in the memory cell array 1012.

As a method for applying such an abnormal gate voltage, a ROM writer which allows the manipulation of a power supply voltage for an operational test or the like, e.g., can be used. It is also possible to apply an abnormal voltage directly to the gate by using a test probe or the like.

Thus, the semiconductor device according to the first conventional embodiment has the problem of allowing the outsider to improperly read the data held in the memory cell array 1012 by using an abnormal gate voltage.

SUMMARY OF THE INVENTION

It is therefore an object of the present invention to solve the foregoing conventional problem and thereby ensure security protection in a semiconductor device having a rewritable nonvolatile memory without performing a setting operation from the outside.

To attain the object, a first method for driving a semiconductor device according to the present invention is a method for driving a semiconductor device including a memory cell array composed of a plurality of electrically rewritable nonvolatile memory cells, and output disabling means for disabling, when a power supply is ON, data held in the nonvolatile memory cells from being outputted to the outside, the method comprising the step of removing the disabling of the outputting of the data by the output disabling means when a specified operational procedure is performed to the memory cell array.

The first method for driving the semiconductor device enables security protection of the data held in the memory cell array by using the output disabling means without performing the setting from the outside and prevents the data held in the memory cell array from being read unless the user is authorized and knows a specified operational procedure to the memory cell array so that security protection using the operational procedure as a key is achieved.

In the first method for driving a semiconductor device according to the present invention, the specified operational procedure preferably includes a first procedural step of verifying that the nonvolatile memory cells are in an erased state and a second procedural step of verifying that specified data has been written in the nonvolatile memory cells after the first procedural step.

The arrangement removes output disable after the verification of the state in which the data held in the memory cell array is erased so that the security of the data held in the memory cell array is protected. The arrangement also removes output disable after the verification of the state in which data is written so that, even if false determination of the state in the memory cell array is intended by using an abnormal gate voltage, it is impossible to cause the false determination of the data written state through the manipulation of the gate voltage so that an improper read operation is prevented reliably.

In the first method for driving a semiconductor device according to the present invention, the specified operational procedure preferably includes a third procedural step of erasing the data written in the nonvolatile memory cells before the first procedural step and a fourth procedural step of writing data in the memory cell array between the first and second procedural steps.

In the first method for driving a semiconductor device according to the present invention, the specified operational procedure preferably repeatedly performs the second and fourth procedural steps in succession for each specified number of memory cells.

The arrangement increases the reliability of a write operation and renders the specified operational procedure more precise so that the data held in the memory cell array is protected more reliably.

In the first method for driving a semiconductor device according to the present invention, the specified operational procedure preferably includes a fifth procedural step of performing a write operation to each of the nonvolatile memory cells prior to the first procedural step.

The arrangement allows more reliable security protection of the data held in the memory cell array, reduces variations in threshold voltage from one memory cell to another, and reduces errors in determining the reading of data so that the reliability of the data held in the memory cell array is increased.

In the first method for driving a semiconductor device according to the present invention, the specified operational procedure preferably includes a fifth procedural step of performing a write operation to each of the nonvolatile memory cells prior to the third procedural step.

In the first method for driving a semiconductor device according to the present invention, the specified operational procedure preferably includes a sixth procedural step of performing, to any one of the nonvolatile memory cells exhibiting an abnormal threshold value in the memory cell array, an operation of restoring the nonvolatile memory cell to a normal threshold value after the second procedural step.

The arrangement allows more reliable security protection of the data held in the memory cell array and reduces errors in determining the reading of data caused by an abnormal threshold voltage so that the reliability of the data held in the memory cell array is increased.

A second method for driving a semiconductor device according to the present invention is a method for driving a semiconductor device including a memory cell array composed of a plurality of electrically rewritable nonvolatile memory cells, the memory cell array being divided into a plurality of erase units from which data is erased simultaneously, and output disabling means for disabling, when a power supply is turned ON, data held in the nonvolatile memory cells from being outputted to the outside on a per erase-unit basis, the method comprising the step of removing, if a specified operational procedure is performed to one of the plurality of erase units in the memory cell array, the disabling of the outputting of data held in the one of the erase units by the output disabling means.

The second method for driving a semiconductor device not only achieves the same effects as achieved by the first method for driving a semiconductor device but also allows, if only a part of the data held in the memory cell array is to be read, the specified operational procedure to be performed only to the erase unit in which required data is held. This prevents an unnecessary operation from degrading the reliability of the nonvolatile memory cells.

In the second method for driving a semiconductor device according to the present invention, the specified operational procedure preferably includes a first procedural step of verifying that the one of the erase units is in an erased state and a second procedural step of verifying that specified data has been written in the one of the erase units after the first procedural step.

In the second method for driving a semiconductor device according to the present invention, the specified operational procedure preferably includes a third procedural step of erasing data written in the one of the erase units prior to the first procedural step and a fourth procedural step of writing data in the one of the erase units between the first and second procedural steps.

In the second method for driving a semiconductor device according to the present invention, the specified operational procedure preferably includes repeatedly performing the second and fourth procedural steps in succession for each specified number of memory cells.

In the second method for driving a semiconductor device according to the present invention, the specified operational procedure preferably includes a fifth procedural step of performing a write operation to each of the nonvolatile memory cells in the one of the erase units prior to the first procedural step.

In the second method for driving a semiconductor device according to the present invention, the specified operational procedure preferably includes a fifth procedural step of performing a write operation to each of the nonvolatile memory cells in the one of the erase units prior to the third procedural step.

In the second method for driving a semiconductor device according to the present invention, the specified operational procedure preferably includes a sixth procedural step of performing, to any one of the nonvolatile memory cells exhibiting an abnormal threshold voltage in the memory cell array, an operation of restoring the nonvolatile memory cell to a normal threshold value after the second procedural step.

A first semiconductor device according to the present invention comprises: a memory cell array composed of a plurality of electrically rewritable nonvolatile memory cells; output disabling means for disabling data held in the nonvolatile memory cells from being outputted to the outside; and operational procedure detecting means for detecting whether or not an operation to the memory cell array has been performed in accordance with a specified operational procedure, the output disabling means disabling the outputting of the data held in the nonvolatile memory cells when a power supply is turned ON, while removing the disabling of the outputting of the data held in the nonvolatile memory cells based on a result of the detection by the operational procedure detecting means.

In the first semiconductor device according to the present invention, the output disabling means removes the disabling of the outputting of the data held in the memory cell array only when the operational procedure detecting means detects the specified operational procedure. This enables security protection of the data held in the memory cell array using the operational procedure as a key.

Preferably, the first semiconductor device according to the present invention further comprises: a memory controller for controlling the operation to the memory cell array; and an external I/O (input/output) controller for controlling inputting and outputting of data held in the nonvolatile memory cells from and to the outside, wherein the output disabling means is provided in the memory controller to disable the outputting of the data to the external I/O controller and thereby disable the outputting of the data to the outside.

The arrangement prevents an outsider to improperly retrieve the data held in the memory cell array by analyzing a data signal transmitted between the external I/O controller and the memory controller and enables more reliable security protection.

Preferably, the first semiconductor device according to the present invention further comprises: a memory I/O controller for controlling the operation to the memory cell array; and a CPU for controlling inputting and outputting of the data held in the nonvolatile memory cells from and to the outside, wherein the output disabling means is provided in the memory I/O controller to disable the outputting of the data to the CPU and thereby disable the outputting of the data to the outside.

The arrangement prevents an outsider to improperly retrieve the data held in the memory cell array by analyzing a data signal transmitted between the memory cell array and the CPU and enables more reliable security protection.

Preferably, the first semiconductor device according to the present invention further comprises: abnormal operation detecting means for detecting whether or not the operation to the memory cell array is a normal operation, wherein the output disabling means does not remove the disabling of the outputting of the data held in the nonvolatile memory cells if the abnormal operation detecting means detects abnormality.

The arrangement reliably prevents the use of an improper reading method which attempts to remove the disabling of the outputting of the data held in the memory cell array to the outside by performing an abnormal operation.

In the first semiconductor device according to the present invention, the abnormal operation detecting means preferably detects whether or not the operation to the memory cell array is a normal operation based on a voltage used in the operation to the memory cell array.

The arrangement reliably prevents the use of an improper read disable removing method which intentionally causes false determination of the reading of data by manipulating the gate voltage used for a read operation and allows more reliable security protection.

In the first semiconductor device according to the present invention, the abnormal operation detecting means preferably detects whether or not the operation to the memory cell array is a normal operation depending on whether or not the operation to the memory cell array is included in the specified operational procedure.

In the arrangement, an attempt to improperly read data by using an operation not defined as the specified operation is determined to be an abnormal operation and a read operation is disabled so that an improper read operation is prevented reliably.

Preferably, the first semiconductor device according to the present invention further comprises: a data generating circuit for generating dummy data different from the data held in the nonvolatile memory cells, wherein the output disabling means outputs the dummy data if it disables the outputting of the data held in the nonvolatile memory cells.

If an outsider tries to improperly read the data held in the memory cell array, the arrangement can mislead the outsider to recognize the outputted dummy data as the data held in the memory cell array and the outsider cannot distinguish the presence or absence of the security protecting function. This allows more reliable security protection.

In the first semiconductor device according to the present invention, the data generating circuit preferably generates fixed data.

In the first semiconductor device according to the present invention, the data generating circuit preferably generates unspecified data by causing a transition in address information.

In the first semiconductor device according to the present invention, the data generating circuit preferably generates scramble data by rearranging the data held in the nonvolatile memory cells.

A second semiconductor device according to the present invention comprises: a memory cell array composed of a plurality of electrically rewritable nonvolatile memory cells; output disabling means for disabling data held in the nonvolatile memory cells from being outputted to the outside; operational procedure detecting means for detecting whether or not a specified operational procedure has been performed to the nonvolatile memory cells composing the memory cell array; and a volatile register for storing a result of the detection by the operational procedure detecting means, the register being brought into a set state if the operational procedure detecting means detects the specified operational procedure, the output disabling means disabling the outputting of the data held in the nonvolatile memory cells if the register is in a reset state and enabling the outputting of the data held in the nonvolatile memory cells if the register is in the set state.

In the second semiconductor device according to the present invention, the register is brought into the reset state when the power supply is turned ON. This allows automatic security protection of the data held in the memory cell array through the turning ON of the power supply without setting output disable from the outside. By using the operational procedure as a key, a semiconductor device capable of security protection from an outsider is implemented.

Preferably, the second semiconductor device according to the present invention further comprises: a memory controller for controlling an operation to the memory cell array; and an external I/O controller for controlling inputting and outputting of the data held in the nonvolatile memory cells from and to the outside, wherein the output disabling means is provided in the memory controller to disable the outputting of the data to the external I/O controller and thereby disable the outputting of the data to the outside.

Preferably, the second semiconductor device according to the present invention further comprises: a memory I/O controller for controlling an operation to the memory cell array; and a CPU for controlling inputting and outputting of the data held in the nonvolatile memory cells from and to the outside, wherein the output disabling means is provided in the memory I/O controller to disable the outputting of the data to the CPU and thereby disable the outputting of the data to the outside.

Preferably, the second semiconductor device according to the present invention further comprises: abnormal operation detecting means for detecting whether or not an operation to the memory cell array is a normal operation, wherein the output disabling means does not remove the disabling of the outputting of the data held in the nonvolatile memory cells if the abnormal operation detecting means detects abnormality.

In the second semiconductor device according to the present invention, the abnormal operation detecting means preferably detects whether or not the operation to the memory cell array is a normal operation based on a voltage used in the operation to the memory cell array.

In the second semiconductor device according to the present invention, the abnormal operation detecting means preferably detects whether or not the operation to the memory cell array is a normal operation depending on whether or not the operation to the memory cell array is included in the specified operational procedure.

Preferably, the second semiconductor device according to the present invention further comprises: a data generating circuit for generating dummy data different from the data held in the nonvolatile memory cells, wherein the output disabling means outputs the dummy data when it disables the outputting of the data held in the nonvolatile memory cells.

In the second semiconductor device according to the present invention, the data generating circuit preferably generates fixed data.

In the second semiconductor device according to the present invention, the data generating circuit preferably generates unspecified data by causing a transition in address information.

In the second semiconductor device according to the present invention, the data generating circuit preferably generates scramble data by rearranging the data held in the nonvolatile memory cells.

A third semiconductor device according to the present invention comprises: a memory cell array composed of a plurality of electrically rewritable nonvolatile memory cells, the memory cell array being divided into a plurality of erase units from which data is erased simultaneously; output disabling means for disabling data held in the nonvolatile memory cells in each of the erase units from being outputted to the outside on a per erase-unit basis; operational procedure detecting means for detecting whether or not a specified operational procedure has been performed to one of the plurality of erase units in the memory cell array on a per erase-unit basis; and a register unit composed of a plurality of volatile registers for storing, in a one-to-one correspondence to the plurality of erase units, results of the detection performed by the operational procedure detecting means on a per erase-unit basis, the register unit bringing, if the operational procedure detecting means detects the specified operational procedure to one of the plurality of erase units, the one of the registers corresponding to the one of the erase units into a set state, the output disabling means disabling, if one of the plurality of registers is in a reset state, the outputting of data held in the erase unit corresponding to the one of the registers and enabling, if the one of the registers is in the set state, the outputting of the data held in the erase unit corresponding to the one of the registers.

The third semiconductor device according to the present invention not only achieves the same effects as achieved by the second semiconductor device but also removes read disable on a per erase-unit basis. This obviates the necessity to perform an unnecessary erase operation and prevents the degradation of the reliability of the memory cell array.

Preferably, the third semiconductor device according to the present invention further comprises: a memory controller for controlling an operation to the memory cell array; and an external I/O controller for controlling inputting and outputting of the data held in the nonvolatile memory cells from and to the outside, wherein the output disabling means is provided in the memory controller to disable the outputting of the data to the external I/O controller and thereby disable the outputting of the data to the outside.

Preferably, the third semiconductor device according to the present invention further comprises: a memory I/O controller for controlling an operation to the memory cell array; and a CPU for controlling inputting and outputting of the data held in the nonvolatile memory cells from and to the outside, wherein the output disabling means is provided in the memory I/O controller to disable the outputting of the data to the CPU and thereby disable the outputting of the data to the outside.

Preferably, the third semiconductor device according to the present invention further comprises: abnormal operation detecting means for detecting whether or not an operation to the one of the erase units is a normal operation, wherein the output disabling means does not remove the disabling of the outputting of the data held in the one of the erase units if the abnormal operation detecting means detects abnormality.

In the third semiconductor device according to the present invention, the abnormal operation detecting means preferably detects whether or not the operation to the one of the erase units is a normal operation based on a voltage used in the operation to the one of the erase units.

In the third semiconductor device according to the present invention, the abnormal operation detecting means preferably detects whether or not the operation to the one of the erase units is a normal operation depending on whether or not the operation to the one of the erase units is included in the specified operational procedure.

Preferably, the third semiconductor device according to the present invention further comprises: a data generating circuit for generating dummy data different from the data held in the nonvolatile memory cells, wherein the output disabling means outputs the dummy data when it disables the outputting of the data held in the nonvolatile memory cells.

In the third semiconductor device according to the present invention, the data generating circuit preferably generates fixed data.

In the third semiconductor device according to the present invention, the data generating circuit preferably generates unspecified data by causing a transition in address information.

In the third semiconductor device according to the present invention, the data generating circuit preferably generates scramble data by rearranging the data held in the nonvolatile memory cells.

BRIEF DESCRIPTION OF THE DRAWINGS

FIGS. 3(a) and 3(b) are flow charts illustrating a reading method in the semiconductor device according to the first embodiment;

DETAILED DESCRIPTION OF THE INVENTION

Embodiment 1

A first embodiment of the present invention will be described with reference to the drawings.

Figure 1:
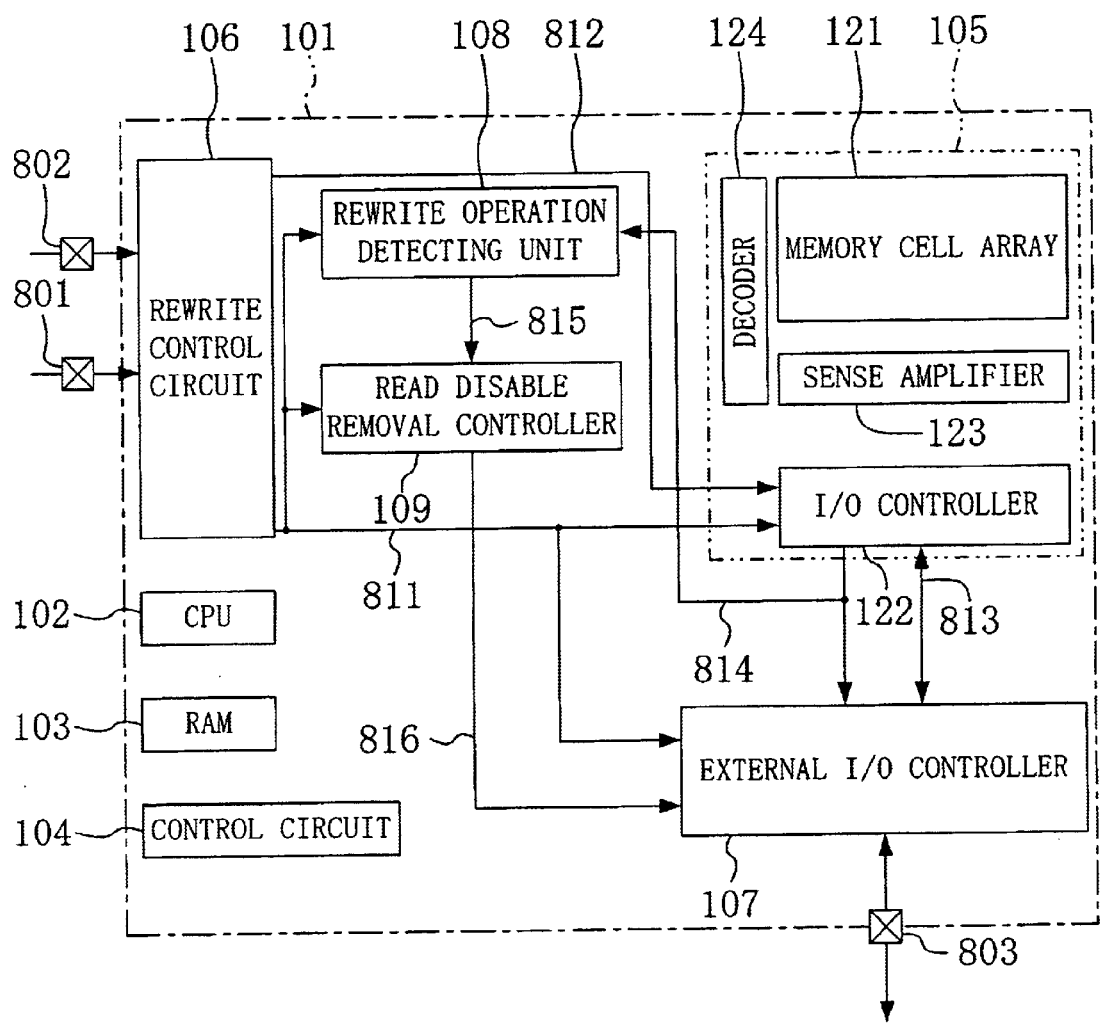
FIG. 1 is a functional block diagram showing a semiconductor device according to a first embodiment of the present invention.

FIG. 1 shows a functional configuration of a semiconductor device according to the first embodiment.

As shown in FIG. 1, the semiconductor device 101 according to the present embodiment comprises: a CPU 102 for controlling the operation of the semiconductor device 101; a RAM 103 for temporarily storing a program executed by the CPU 102 and data; a control circuit 104 for controlling the CPU 102 and the RAM 103; and a nonvolatile memory block 105 for storing data. The CPU 102, the RAM 103, the control circuit 104, and the nonvolatile memory block 105 are connected to each other via a line such as a control bus, though they are not depicted.

The semiconductor device 101 according to the present embodiment is designed to enable rewrite, read, and like operations to be performed to the nonvolatile memory block 105 from the outside by connecting a device such as a ROM writer to the semiconductor device 101. Accordingly, the semiconductor device 101 has, as connecting means to the outside, a control signal input terminal 801 for receiving an instruction to the nonvolatile memory block 105, an address input terminal 802 for receiving address information, and a data I/O terminal 803 for receiving data to be written in the nonvolatile memory block 105 and outputting data read out of the nonvolatile memory block 105. The control signal input terminal 801 and the address input terminal 802 are connected to the nonvolatile memory block 105 via a rewrite control circuit 106, while the data I/O terminal 803 is connected to the nonvolatile memory block 105 via an external I/O controller 107. To disable the reading of data held in the nonvolatile memory block 105 to the outside, a rewrite operation detecting unit 108 and a read disable removal controller 109 are provided in connected relation to the external I/O controller 107.

In the semiconductor device 101 according to the present embodiment, a program to be executed by the CPU 102 is stored in the nonvolatile memory block 105. The reading out of the program stored in the nonvolatile memory block 105 to the RAM 103 and to the control circuit 104 allows the CPU 102 to be implemented as a microcomputer for performing a specified process. The user of the semiconductor device 101 is allowed to cause the semiconductor device 101 to perform a desired process by rewriting the program held in the nonvolatile memory block 105 from the outside.

In the semiconductor device 101 according to the present embodiment, the CPU 102, the RAM 103, and the control circuit 104 need not necessarily be provided. The semiconductor device 101 may also be implemented as, e.g., a semiconductor device for storage such as a memory card. In that case also, the user of the semiconductor device 101 is allowed to store data such as personal information in the nonvolatile memory block 105 from the outside and rewrite the data if necessary.

The present embodiment is characterized in that data in the nonvolatile memory block 105 can be rewritten from the outside as desired by the user and has a security protecting function for disabling the reading of the data in the nonvolatile memory block 105 to the outside of the semiconductor device such that it is not improperly used by an outsider.

The following is a specific description of the individual components of the semiconductor device 101 according to the present embodiment.

The rewrite control circuit 106 is a circuit for generating a control signal 811 and an address signal 812 based on an instruction and address information inputted from the outside via the control signal input terminal 801 and the address input terminal 802. The control signal 811 is a signal indicative of an operation performed to the nonvolatile memory block 105, e.g., a write operation, an erase operation, a read operation, or the like. The address signal 812 is a signal indicative of the address of a memory cell in the nonvolatile memory block 105.

The nonvolatile memory block 105 is constituted by: a memory cell array 121 composed of EEPROMs in which a plurality of nonvolatile memory cells are arranged in rows and columns; an I/O controller 122 for controlling an operation performed to the memory cell array 121 based on the control signal 811 and the address signal 812 inputted from the rewrite control circuit 106; a sense amplifier 123 for amplifying data held in the memory cell array 121 and outputting the amplified data to the I/O controller 122; and a decoder 124 for selecting among memory cells in the memory cell array 121 based on the address signal 812.

The I/O controller 122 is constituted to drive the decoder 124 such that the memory cell at the address indicated by the address signal 812 is selected and drive the memory cell array 121 and the sense amplifier 123 such that the operation indicated by the control signal 811 is performed to the memory cell selected by the decoder 124.

In addition to an erase operation, a write operation, and a read operation, operations indicated by the control signal 811 include an erase verify operation for determining whether or not the erase operation has been performed normally and a write verify operation for determining whether or not the write operation has been performed normally. They may also include a pre-program operation for writing data in each of the memory cells to reduce variations in threshold voltage from one memory cell to another and a reverse operation for performing a weak write or erase operation to a memory cell having a threshold voltage changed to an abnormal value for the restoration of a normal threshold voltage. These operations will be described later in detail.

A description will be given next to the rewrite operation detecting unit 108 and to the read disable removal controller 109.

Figure 2A:
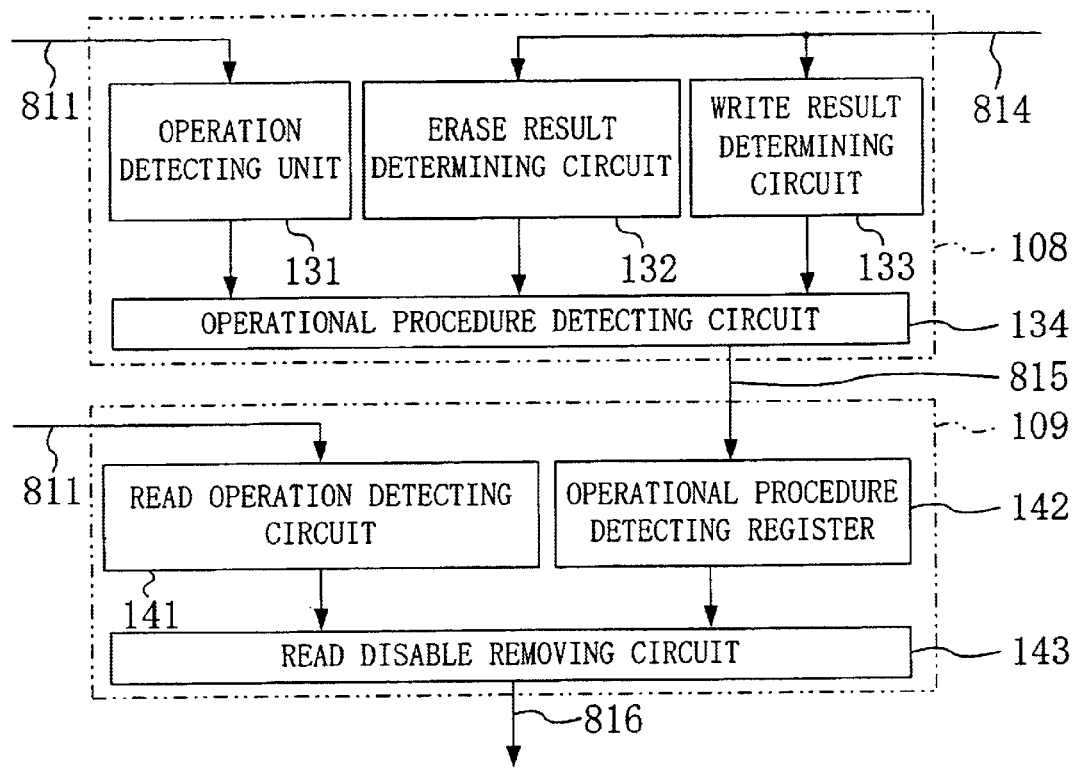
FIG. 2(a) is a functional block diagram showing a rewrite operation detecting unit and a read disable removal controller in the semiconductor device according to the first embodiment and FIG. 2(b) is a functional block diagram showing an external I/O controller in the semiconductor device according to the first embodiment.

FIG. 2(a) shows respective functional configurations of the rewrite operation detecting unit 108 and the read disable removal controller 109 according to the present embodiment.

As shown in FIG. 2(a), the rewrite operation detecting unit 108 according to the present embodiment is constituted by: an operation detecting circuit 131 for detecting an operation performed to the memory cell array 121; an erase result determining circuit 132 for detecting whether or not an erase operation to the memory cell array 121 has been performed normally; a write result determining circuit 133 for detecting whether or not a write operation to the memory cell array 121 has been performed normally; and an operational procedure detecting circuit 134 for detecting whether or not a specified operational procedure has been performed to the memory cell array 121.

The operation detecting circuit 131 is a circuit for detecting the operation that has been performed to the memory cell array 121 based on the control signal 811 inputted from the rewrite control circuit 106. For example, the operation detecting circuit 131 detects that a write operation has been performed to the memory cell array 121 upon receiving the control signal 811 indicative of a write operation.

The erase result determining circuit 132 and the write result determining circuit 133 are circuits for determining whether or not an erase operation and a write operation have been performed normally based on the verify result signal 814 inputted from the I/O controller 122. Since the verify result signal 814 is generated in the same signal line in each of the erase verify operation and the write verify operation, it is determined whether the inputted verify result signal 814 is a signal resulting from the erase verify operation or a signal resulting from the write verify operation in accordance with the result of detection performed by the operation detecting circuit 131.

The operational procedure detecting circuit 134 is a circuit for determining whether or not a specified operational procedure has been performed to the memory cell array 121 based on the respective results of detection performed by the operation detecting circuit 131, the erase result determining circuit 132, and the write result determining circuit 133 and outputting "1" if it is determined that the specified operational procedure has been performed to each of the memory cells in the memory cell array 121, while outputting "0" otherwise, each as an operational procedure detect signal 815. It is to be noted that "0" and "1" generally represent two states that can be distinguished as different signal levels and therefore may be either a low potential state and a high potential state or a high potential state and a low potential state, which will also hold true in the following description.

The specified operational procedure to the memory cell array 121 is an operational procedure in which, e.g., an erase operation, the verification of a normal erase operation, a write operation, and the verification of a normal write operation are performed in succession.

As shown in FIG. 2(a), the read disable removal controller 109 is constituted by: a read operation detecting circuit 141 for detecting a read operation based on the control signal 811; an operational procedure detecting register 142 for storing the result of detection performed by the operational procedure detecting circuit 134; and a read disable removing circuit 143 for controlling whether or not read disable is removed.

The read operation detecting circuit 141 is a circuit for determining whether or not the control signal 811 inputted from the rewrite control circuit 106 is a signal indicative of a read operation.

If the operational procedure detect signal 815 inputted from the operational procedure detecting circuit 134 is "1", a write operation is performed so that the operational procedure detecting register 142 is brought into a set state.

If the operational procedure detect signal 815 inputted from the operational procedure detecting circuit 134 is "0", an erase operation is performed so that the operational procedure detecting register 142 is brought into a reset state. Since the operational procedure detecting register 142 is volatile, it is in the reset state when a power supply for the semiconductor device 101 is When a read operation is detected by the read operation detecting circuit 141, the read disable removing circuit 143 sets a read disable remove signal 186 to "0" if the operational procedure detecting register 142 is in the reset state (erased state) and sets the read disable remove signal 186 to "1" if the operational procedure detecting register 142 is in the set state (written state).

A description will be given next to the external I/O controller 107.

Figure 2B:
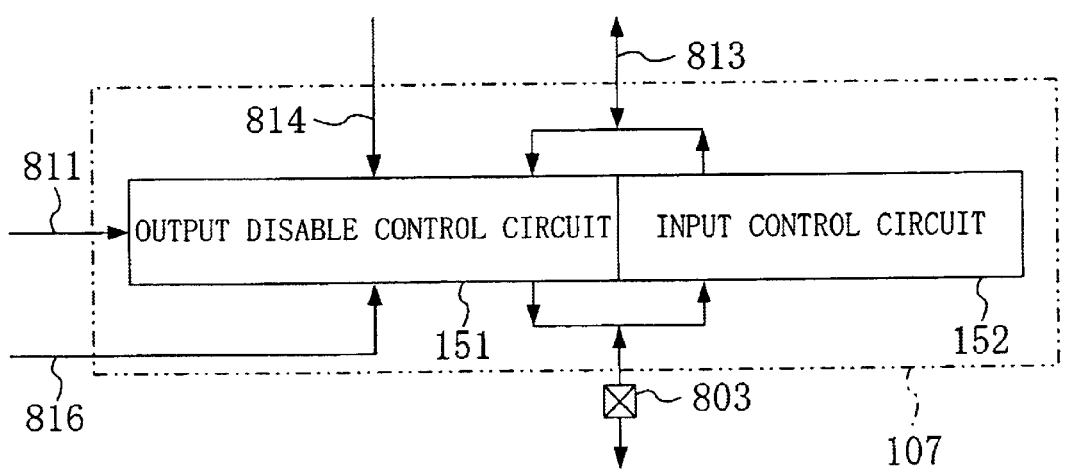

FIG. 2(b) shows a functional configuration of the external I/O controller 107 according to the present embodiment.

As shown in FIG. 2(b), the external I/O controller 107 is constituted by: an output disable control circuit 151 for controlling the outputting of the data signal 813 and the verify result signal 814 to the outside; and an input control circuit 152 for generating data inputted from the outside into the data signal 813.

If the control signal 811 is indicative of a read operation and the read disable remove signal 816 is "1", the external I/O control circuit 151 outputs the data signal 813 inputted from the I/O controller 122 to the outside via the data I/O terminal 803. Otherwise, the external I/O control circuit 151 disables the outputting of the data signal 813. It is to be noted that the verify result signal 814 is outputted to the outside via the output disable control circuit 151 and the data I/O terminal 803 irrespective of the read disable remove signal 816.

A description will be given herein below to the operation of the semiconductor device 101 according to the present embodiment thus constituted.

The description will be given first to operations performed from the outside of the semiconductor device 101 to the memory cell array with reference to FIGS. 2(a) and 2(b).

A write operation is performed by inputting an instruction to perform a write operation to the control signal input terminal 801, inputting address information indicative of a memory cell in the memory cell array 121 to which the write operation is to be performed, and inputting input data to the data I/O terminal 803, each from the outside.

As a result, the rewrite control circuit 106 is driven to generate a signal indicative of a write operation as the control signal 811 and a signal indicative of an address in the memory cell array 121 as the address signal 812 and output the generated signals to the I/O controller 122. On the other hand, the input control circuit 152 is driven to output, as the data signal 813, the input data inputted from the data I/O terminal 803 to the data I/O controller 122. Upon receiving the control signal 811 indicative of the write operation, the I/O controller 122 controls the decoder 124 such that it selects the memory cell at the address indicated by the address signal 812, while controlling the memory cell array 121 such that data inputted as the data signal 813 from the outside is written in the memory cell.

It is also possible to consecutively perform write operations starting from a leading address on a per byte basis or on a per page basis.

A write verify operation is performed by inputting an instruction to perform a write verify operation to the control signal input terminal 801, inputting address information indicative of a memory cell in the memory cell array 121 to which a write verify operation is to be performed to the address input terminal 802, and inputting input data for comparison to the data I/O terminal 803, each from the outside.

As a result, the control signal 811 indicative of the write verify operation and the address signal 812 indicative of the address to which an erase verify operation is to be performed are inputted from the rewrite control circuit 106 to the I/O controller 122 and the data signal 813 for comparison is inputted from the input control circuit 152 to the I/O controller 122 in the same manner as in the write operation. Upon receiving the control signal 811 indicative of the write verify operation, the I/O controller 122 first controls the decoder 124 such that it selects the memory cell at the address indicated by the address signal 812, while driving the memory cell array 121 and the sense amplifier 123 such that the data written in the memory cell is read as a sense amplifier signal 813. Then, the data read as the sense amplifier signal is compared with the data inputted as the data signal 813, whereby it is determined whether or not the write operation has been performed normally. If the read data and the data inputted as the data signal 813 match completely, it is determined that the write operation has been performed normally so that "1" is outputted as the verify result signal 814. Otherwise, "0" is outputted.

A method for performing the write verify operations is not limited to the method in which the instruction to perform the write verify operation is inputted from the outside. The write verify operation described above may also be performed after the write operation as a sequential operation. In this case, the data for comparison need not be inputted from the outside. The determination may also be performed by, e.g., making a comparison between the input data held in a buffer portion in the write operation and the data read as the sense amplifier signal.

An erase operation and the erase verify operation are performed by inputting respective instructions to perform the erase operation and the erase verify operation to the control signal input terminal 801 and inputting address information indicative of the address to which the operations are to be performed to the address input terminal 802. As a result, the respective control signals 811 indicative of the erase operation and the erase verify operation are inputted to the I/O controller 122 via the rewrite control circuit 106.

Upon receiving the control signal 811 indicative of the erase operation, the I/O controller 122 controls the decoder 124 such that it selects the memory cell at the address indicated by the address signal 812, while controlling the memory cell array 121 such that the memory cell selected by the decoder 124 is brought into the erased state. Upon receiving the control signal 811 indicative of the erase verify operation, the I/O controller 122 drives the memory cell array 121, the sense amplifier 123, and the decoder 124 such that the data written in the memory cell indicated by the address signal 812 is read as a sense amplifier signal. Then, if each of the data sets read as the sense amplifier signals indicates the erased state, it is determined that the erase operation has been performed normally so that "1" is outputted as the verify result signal 814. Otherwise, "0" is outputted as the verify result signal 814.

A method for performing the erase verify operation is not limited to the method in which the instruction to perform the erase verify operation is inputted from the outside. The erase verify operation described above may also be performed after the erase operation as a sequential operation.

A read operation is performed by inputting an instruction to perform a read operation to the control signal input terminal 801 and inputting address information indicative of an address to which the read operation is to be performed to the address input terminal 802, each from the outside.

As a result, the control signal 811 indicative of the read operation and the address signal 812 indicative of the address to which the read operation is to be performed are inputted from the rewrite control circuit 106 to the I/O controller 122. Upon receiving the control signal 811 indicative of the read operation, the I/O controller 122 drives the memory cell array 121, the sense amplifier 123, and the decoder 124 such that the data written in the memory cell indicated by the address signal 812 is read as a sense amplifier signal and outputs the read sense amplifier signal as the data signal 813 to the output disable control circuit 151. If the read disable remove signal 816 is "1", the output disable control circuit 151 outputs the data signal 813 to the outside via the data I/O terminal 803. If the read disable remove signal 816 is "0", the output disable control circuit 151 disables the outputting of the data signal 813 so that the operation of reading data to the outside is not completed.

The description will be given next to a method for reading data held in the memory cell array 121 to the outside with reference to the drawings.

FIG. 3(*a*) shows an operational procedure for removing the disabling of a read operation to the outside of the semiconductor device 101 according to the first embodiment.

As shown in FIG. 3(*a*), a power supply for the semiconductor device 101 is turned ON first. At this time, the operational procedure detecting register 142 of the rewrite operation detecting unit 108 is in the reset state since it is volatile. Accordingly, the read disable removing circuit 143 sets the read disable remove signal 816 to "0" so that the output disable control circuit 151 of the external I/O controller 107 disables the outputting of the data signal 813 inputted from the nonvolatile memory block 105 to the data I/O terminal 803. In short, the output disable control circuit 151 assuredly disables the outputting of data held in the memory cell array 121 to the outside when the power supply is turned ON.

Next, an erase instruction is inputted to the control signal input terminal 801 and address information indicative of each of the memory cells is inputted to the address input terminal 802, each from the outside. As a result, the control signal 811 indicative of an erase operation is inputted to the I/O controller 122 so that the erase operation is performed to each of the memory cells. Subsequently to the erase operation, the control signal 811 is inputted to the operation detecting circuit 131 so that operational procedure detecting circuit 134 detects that the erase operation has been performed to each of the memory cells.

Next, an erase verify instruction is inputted to the control signal input terminal 801 and address information indicative of each of the memory cells is inputted to the address input terminal 802, each from the outside. As a result, the control signal 811 indicative of the erase operation is inputted to the I/O controller 122 of the nonvolatile memory block 105 so that an erase verify operation is performed to each of the memory cells. Subsequently to the erase verify operation, the erase result determining circuit 132 determines whether or not the erase operation has been performed normally to each of the memory cells upon receiving the verify result signal 814.

The erase verify operation need not necessarily be performed by inputting the erase verify instruction from the outside. The erase verify operation may also be performed sequentially to an erase operation by giving an instruction to perform the erase operation from the outside.

Next, a write instruction, an address indicating each of the memory cells, and data for writing are inputted from the outside to the control signal input terminal 801, to the address input terminal 802, and to the data I/O terminal 803, respectively, whereby a write operation to each of the memory cells in the memory cell array 121 is performed. Upon receiving the control signal 811, the operation detecting circuit 131 detects that the write operation has been performed to each of the memory cells.

Next, a write verify instruction, addresses indicative of each of the memory cells, and data for comparison are inputted from the outside to the control signal input terminal 801, to the address input terminal 802, and to the data I/O terminal 803, respectively, whereby the write verify operation to each of the memory cells in the memory cell array 121 is performed. Subsequently to the write verify operation, the write result determining circuit 133 determines whether or not the write operation to each of the memory cells has been performed normally upon receiving the verify result signal 814.

The write verify operation need not necessarily be performed by inputting the write verify instruction from the outside. The write verify operation may also be performed sequentially to a write operation by giving an instruction to perform the write operation from the outside. The write operation and the write verify operation may also be performed to each of the memory cells by alternately performing the write operations and the write verify operations in succession starting from a leading address on a per byte basis or on a per page basis.

In the foregoing operations, if the erase operation is detected first by the operation detecting circuit 131, the normal erase operation is then verified by the erase result determining circuit 132, the write operation is detected thereafter by the operation detecting circuit 131, the normal operation is verified subsequently by the write result determining circuit 133, and it is further verified that these operations have been performed to each of the memory cells in the memory cell array 121 based on the address signal 812, the operational procedure detecting circuit 134 sets the operational procedure detect signal 815 to "1" so that the operational procedure detecting register 142 is brought into the set state.

If the operation detecting circuit 131 detects any operation other than the erase operation and the write operation in the respective procedural steps in which the erase operation and the write operation should be detected or if the normal erase operation and the normal write operation are not verified by the erase result determining circuit 132 and by the write result determining circuit 133, the operational procedure detecting circuit 134 sets the operational procedure detect signal 815 to "0" so that the operational procedure detecting register 142 remains in the reset state and the read disable removing circuit 143 sets the read disable remove signal 816 to "0". Consequently, the output disable control circuit 151 disables the outputting of the data signal 813 inputted from the I/O controller 122 to the data I/O terminal 803 so that the data held in the memory cell array is not outputted even if an instruction to perform a read operation is inputted from the outside.

Thus, only when the erase operation, the verification of a normal erase operation, the write operation, and the verification of a normal write operation have been performed successively to each of the memory cells in the memory cell array 121, the operational procedure detecting register 142 is brought into the set state and the read disable remove signal 816 is set to "1" so that the read disabled state in the output disable control circuit 151 is removed and a read operation to the outside is enabled.

Thereafter, the read enabled state is maintained until the power supply is turned OFF. When the power supply is turned ON next time, the operational procedure detecting register 142 is brought into the reset state again so that the output disable control circuit 151 disables the outputting of the data inputted from the I/O controller 122 to the data I/O terminal 803.

Thus, in the semiconductor device 101 according to the first embodiment, the read disabled state in the output disable control circuit 151 is removed by using, as a key, the sequential operational procedure of performing an erase operation to the memory cell array 121 first, then verifying that the erase operation has been performed normally, performing a write operation thereafter, and subsequently verifying that the write operation has been performed normally. Even if an outsider tries to read data in the memory cell array 121, the reading of the data cannot be performed unless he knows the sequential operational procedure so that security protection is ensured.

Since the operational procedure used as the key includes the erase operation, even if the outside tries to read data written in the memory cell array 121, a read operation is enabled only after the erase operation. This prevents the outsider from reading the data held in the memory cell array 121 and allows the security protection of a program or personal information.

Since the operational procedure used as the key includes the procedural step of performing the write verify operation for verifying the written state, the outsider is prevented from improperly reading the data held in the memory cell array 121 by causing the false determination of the result of reading data through the manipulation of the gate voltage using a device such as a ROM writer. Specifically, since there is no such situation in which the data written in each of the memory cells is the same and it is normally impossible to write different data sets in the individual memory cells through the manipulation of the gate voltage, the outsider cannot cause the false determination of the result of the write verify operation so that the security of data held in the memory cell array 121 is protected reliably.

In addition, since the outputting of the data signal 813 is disabled by the output disable control circuit 151 if the operational procedure detecting register 142 is in the reset state, the power supply is turned ON and a read operation to the outside is performed. In other words, the security of data held in the memory cell array 121 can be protected without setting output disable from the outside. Since the setting of output disable obviates the necessity for an extra nonvolatile memory, the cost of the semiconductor device 101 can be reduced.

Variations of Method for Read Operation to the Outside

As stated previously, the operational procedure required to read data held in the memory cell array 121 to the outside is defined by the structure of the operational procedure detecting circuit 134 so that it is not limited to the method in which an erase operation, the verification of a normal erased state, a write operation, and the verification of a normal written state are performed successively. A description will be given herein below to variations of the operational procedure.

FIG. 3(*b*) shows an operational procedure for removing the disabling of a read operation to the outside in a semiconductor device according to a first variation of the first embodiment.

As shown in FIG. 3(*b*), in the first variation of the first embodiment, the disabling of a read operation to the outside of the semiconductor device 101 is removed by sequentially performing the turning ON of the power supply, the verification of a normal erase operation, and the verification of a normal write operation.

Since the present variation has a security protecting function equal to that of the first embodiment and does not need the erase operation if the erased state is preliminarily set, it is sufficient to perform only the erase verify operation and the unneeded erased operation can be omitted. This reduces a load on the memory cell resulting from the erase operation and prevents the degradation of reliability.

Figure 4A:
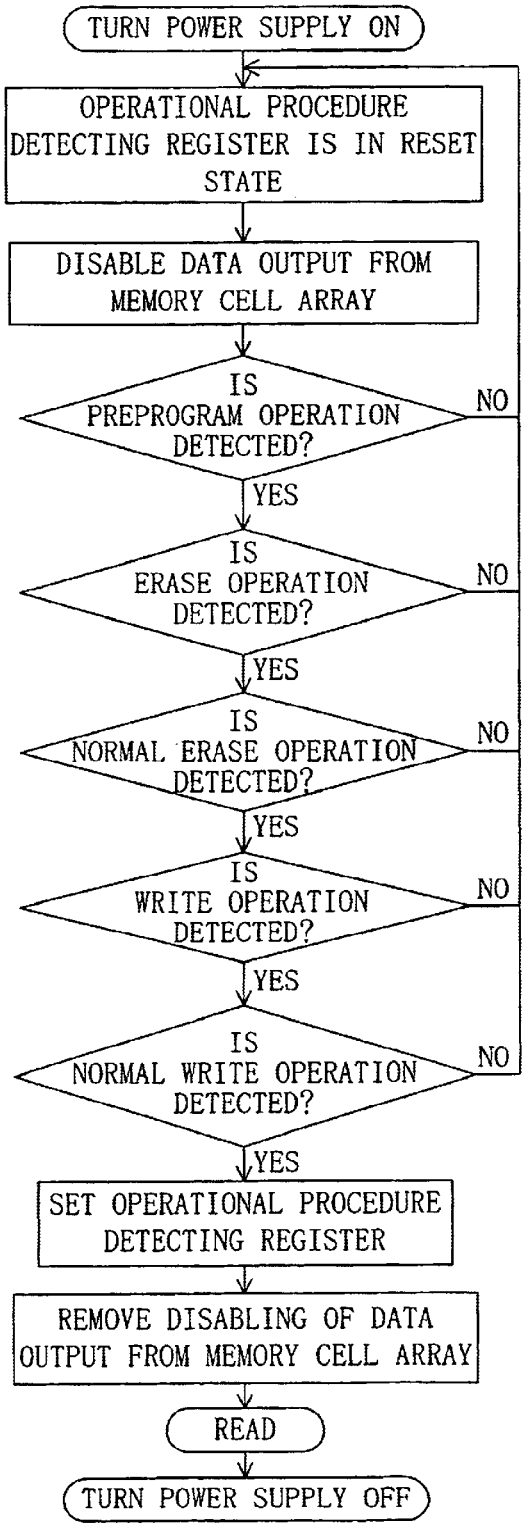
FIGS. 4(a) and 4(b) are flow charts illustrating the reading method in the semiconductor device according to the first embodiment.

FIG. 4(a) shows an operational procedure for removing the disabling of a read operation from the outside in a semiconductor device according to a second variation of the first embodiment.

As shown in FIG. 4(a), in the second variation of the first embodiment, the disabling of the reading of data held in the memory cell array 121 to the outside is removed by performing a pre-program operation first and then performing a rewrite operation and a verify operation to each of the memory cells in the memory cell array 121 in accordance with the same procedure as used in the first embodiment.

The preprogram operation is defined here as an operation of performing a write operation prior to an erase operation and thereby allowing all the memory cells to have equal threshold values. Specifically, in the preprogram operation, the I/O controller 122 drives the memory cell array 121, the sense amplifier 123, and the decoder 124 upon receiving the control signal 811 indicative of the preprogram operation from the outside of the semiconductor device 101 via the control signal input terminal 801 and the rewrite control circuit 106 and thereby performs a write operation to each of the memory cells.

Since the foregoing preprogram operation prevents an extreme reduction in threshold voltage resulting from the erase operation performed with respect to a memory cell in an erased state and reduces variations in threshold voltage from one memory cell to another, an error in the determination of reading can be prevented.

The second variation need not perform all of an erase operation, an erase verify operation, and a write verify operation after the preprogram operation. For example, it is also possible to perform only the erase verify operation and the write verify operation in the same manner as in the first variation.

Figure 4B:
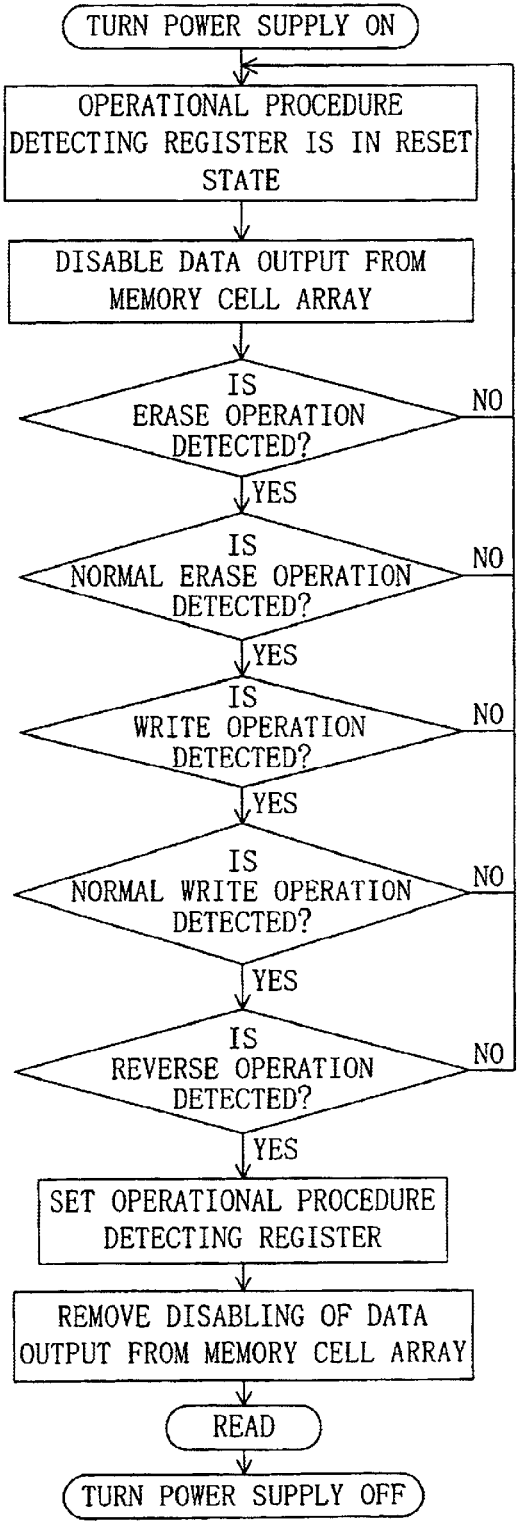

FIG. 4(b) shows the operational procedure for removing the disabling of a read operation to the outside of the semiconductor device according to a third variation of the present embodiment.

As shown in FIG. 4(b), the third variation of the first embodiment performs a rewrite operation and a verify operation in accordance with the same procedure as used in the first embodiment and then performs a reverse operation, whereby the disabling of a read operation to the outside of the semiconductor device is removed.

The reverse operation is defined here as an operation of performing a write operation or an erase operation at a lower voltage than in a normal operation to a memory cell having a threshold voltage that has changed to an abnormal value after the erase operation. Specifically, in the reverse operation, the I/O controller 122 drives the memory cell array 121, the sense amplifier 123, and the decoder 124 upon receiving the control signal 811 indicative of the reverse operation from the outside via the control signal input terminal 801 and the rewrite control circuit 106 to detect a memory cell having a threshold voltage changed to an abnormal value and then performs a write operation or an erase operation to the memory cell at a voltage lower than in a normal operation.

This allows the memory cells to have equal threshold values and improves the reliability of the memory cell array.

The third variation need not perform all of an erase operation, an erase verify operation, and a write verify operation prior to the reverse operation. For example, it is also possible to perform only the erase verify operation and the write verify operation in the same manner as in the first variation. The third variation may be combined with the second variation such that the pre-program operation is performed prior to the erase operation.

According to the second or third variation, the operational procedure required to remove read disable is more complicated so that more reliable security protection is performed. In addition, the probability of false determination caused by an abnormal threshold value in the operation of reading data held in the memory cell array 121 can be lowered by performing the operation of reducing variations in threshold voltage from one memory cell to another in the memory cell array 121 so that the data is stored more reliably.

To provide another variation, the operational procedure according to the first embodiment can also be limited to a method in which a write operation to each of the memory cells and the verification of a normal write operation are performed by repeatedly performing the write operation and a write verify operation in succession to each specified number of memory cells on a per byte basis or on a per page basis starting from the leading address. Specifically, when the write operation and the write verify operation are detected in the operation detecting circuit 131, the operational procedure detecting circuit 134 sets the operational procedure detect signal 185 to "0" if the address signal 812 does not indicate the specified number of memory cells. This renders the operational procedure for removing read disable more precise and improves the reliability of a write operation.

If it is detected by the operational procedure detecting circuit 134 that the data written in each of the memory cells is the same (which indicates that each of the memory cells is in the erased or written state) after the completion of the write operation, it is also possible to prevent the situation in which each of the memory cells is in the same state after the write operation by setting the operational procedure detect signal 815 to "0". This reliably prevents the false determination of the result of a write verify operation through the manipulation of a gate voltage and thereby reliably protects the security of data held in the memory cell array 121.

Embodiment 2

A second embodiment of the present invention will be described herein below with reference to the drawings. The description of components having the same functional configurations as in the first embodiment will be omitted by retaining the same reference numerals.

Figure 5:
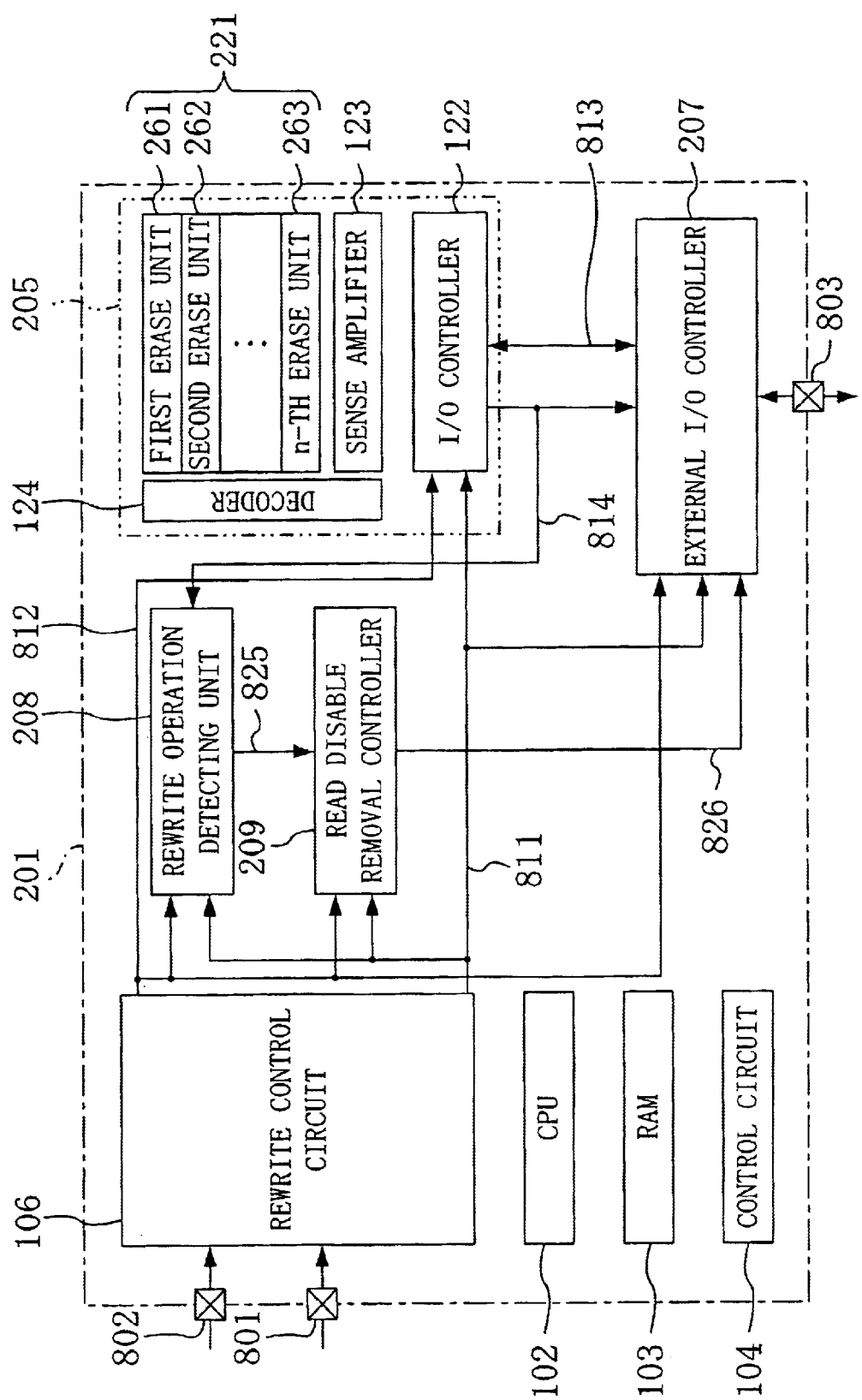
FIG. 5 is a functional block diagram showing a semiconductor device according to a second embodiment of the present invention.

FIG. 5 shows a functional configuration of a semiconductor device according to the second embodiment.

As shown in FIG. 5, the semiconductor device 201 according to the present embodiment comprises: the CPU 102; the RAM 103; the control circuit 104; and a nonvolatile memory block 205 for storing data. The semiconductor device 201 is also provided with the control signal input terminal 801, the address input terminal 802, and the data I/O terminal 803 as means for connection with the outside. The control signal input terminal 801 and the address input terminal 802 are connected to the nonvolatile memory block 205 via the rewrite control circuit 106, while the data I/O terminal 803 is connected to the nonvolatile memory block 205 via an external I/O controller 207. For the read disabling of data held in the nonvolatile memory block 205 to the outside, a rewrite operation detecting unit 208 and a read disable removal controller 209 are provided.

A specific description will be given herein below to the individual components of the semiconductor device according to the present embodiment.

The nonvolatile memory block 205 is constituted by a memory cell array 221 for storing data, the I/O controller 122, the sense amplifier 123, and the decoder 124. The memory cell array 221 is composed of flash EEPROMs and divided into n (n is an integer of 2 or more) blocks of a first erase unit 261, a second erase unit 262, . . . , and an n-th erase unit 263 such that an erase operation is performed simultaneously on a per erase-unit basis.

Operations to the memory cell array 221 include an erase operation, a write operation, a read operation, an erase verify operation, and a write verify operation in the same manner as in the first embodiment. They may also include the preprogram operation and the reverse operation.

Figure 6A:
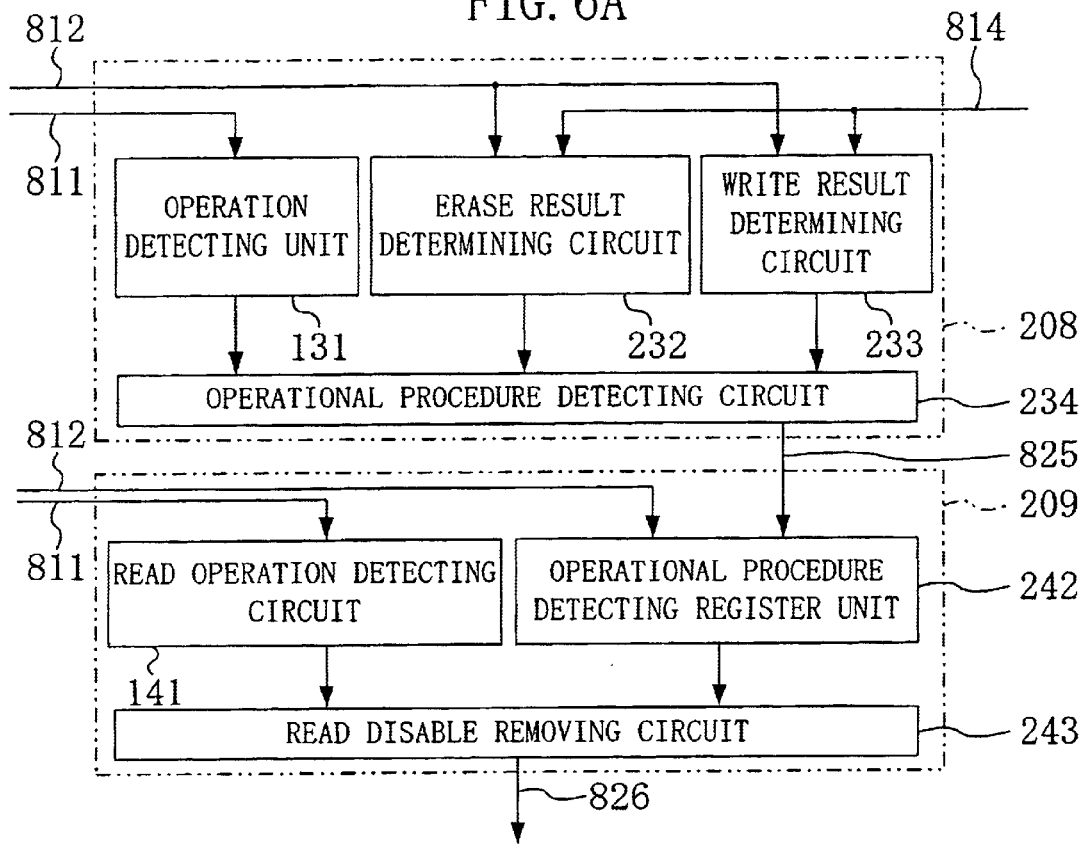
FIG. 6(a) is a functional block diagram showing a rewrite operation detecting unit and a read disable removal controller in the semiconductor device according to the second embodiment and FIG. 6(b) is a functional block diagram showing an external I/O controller in the semiconductor device according to the second embodiment.

FIG. 6(a) shows respective functional configurations of the rewrite operation detecting unit 208 and the read disable removal controller 209 according to the second embodiment.

As shown in FIG. 6(a), the rewrite operation detecting unit 208 according to the present embodiment is constituted by the operation detecting circuit 131, an erase result determining circuit 232 for detecting whether or not an erase operation to the memory cell array 221 has been performed normally, a write result determining circuit 233 for detecting whether or not a write operation to the memory cell array 221 has been performed normally, and an operational procedure detecting circuit 234 for detecting whether or not a specified operational procedure has been performed to the memory cell array 221.

The erase result determining circuit 232 and the write result determining circuit 233 are circuits for determining the erase unit to which a verify operation is to be performed based on the address signal 812 inputted from the rewrite control circuit 106 and determining whether or not each of the erase operation and the write operation has been performed normally on a per erase-unit basis based on the verify result signal 814 inputted from the I/O controller 122.

Specifically, when the verify result signal 814 is inputted and the operation detecting circuit 131 has detected that the verify result signal 814 represents the result of the erase verify operation, the erase result determining circuit 232 determines the erase unit to which the erase verify operation has been performed based on the address signal 812 and determines whether or not the erase operation to the erase unit has been performed normally based on the verify result signal 814.

On the other hand, when the verify result signal 814 is inputted and the operation detecting circuit 131 has detected that the verify result signal 814 represents the result of the write verify operation, the write result determining circuit 233 determines the erase unit wherein the memory cell to which the write verify operation has been performed is placed based on the address signal 812 and determines whether or not the write operation to each of the memory cells in the erase unit has been performed normally based on the address signal 812 and the verify result signal 814.

The operational procedure detecting circuit 234 determines, for each of the erase units, whether or not the specified operational procedure has been performed to the memory cell array 221 based on the results of detection and determination performed by the operation detecting circuit 131, the erase result determining circuit 232, and the write result determining circuit 233 and sets an operational procedure detect signal 825 to "1" if it is determined that the, specified operational procedure has been performed and otherwise sets the operational procedure detect signal 825 to "0".

The operational procedure detect signal 825 is composed of n signals corresponding to the first to n-erase units, respectively. If it is determined that the specified operational procedure has been performed to, e.g., the second erase unit 262, the operational procedure detect signal 825 corresponding to the second erase unit 825 is set to "1".

As also shown in FIG. 6(a), the read disable removal controller 209 according to the present embodiment is constituted by a read operation detecting circuit 141, an operational procedure detecting register unit 242 for storing the result of detection by the operational procedure detecting circuit 234 on a per erase-unit basis, and a read disable removing circuit 243 for controlling whether or not read disable should be removed on a per erase-unit basis. The operational procedure register unit 242 is provided with n registers consisting of a first register, second register, . . . , and an n-th register each composed of a nonvolatile memory cell. The n registers correspond to the first erase unit 261, the second erase unit 262, . . . , and the n-th erase unit 263, respectively.

The operational procedure detecting register unit 242 is constituted to select among the registers based on the address signal 812 and perform a write operation to the selected register based on the operational procedure detect signal 825. For example, when a signal indicative of the second erase unit 262 is inputted as the address signal 812, if the operational procedure detect signal 825 to the second erase unit 262 is set to "1", a write operation is performed to the second register so that it is brought into the set state. If the operational procedure detect signal 825 to the second erase unit 262 is set to "0", on the other hand, an erase operation is performed to the second register so that it is brought into the reset state. Each of the registers in the operational procedure detecting register unit 242 is in the reset state when a power supply for the semiconductor device 201 is turned ON since it is volatile.

The read disable removing circuit 243 is a circuit for outputting, if a read operation is detected by the read operation detecting circuit 141, a read disable remove signal 826 on a per erase-unit basis depending on the address signal 812 and on the written state of each of the registers in the operational procedure detecting register unit 242.

The read disable remove signal 826 is composed of n signals corresponding to the first to n-th erase units, respectively. For example, when a signal indicative of the second erase unit 262 is inputted as the address signal 812, "1" is outputted as the read disable remove signal 826 to the second erase unit 262 if the second register is in the set state and "0" is outputted as the read disable remove signal 826 to the second erase unit 262 if the second register is in the reset state.

Figure 6B:
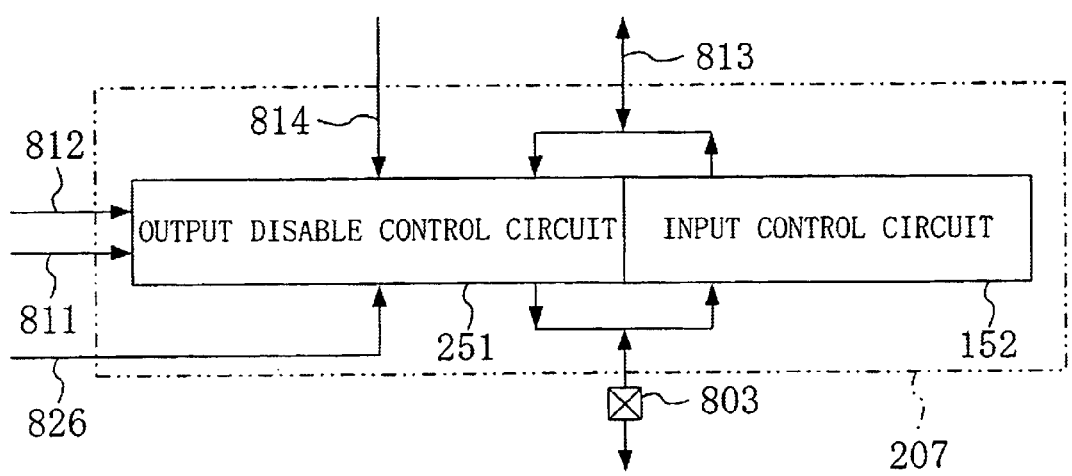

FIG. 6(b) shows a functional configuration of the external I/O controller 207 according to the present embodiment.

As shown in FIG. 6(b), the external I/O controller 207 according to the present embodiment is constituted by the input control circuit 152 and an output disable control circuit 252 for controlling the outputting of the data signal 813 and the verify result signal 814 to the outside.

The output disable control circuit 251 is a circuit for controlling, for each of the erase units in the memory cell array 221, the outputting of the data signal 813 and the verify result signal 814 to the outside based on the control signal 811, the read disable remove signal 826, and the address signal 812. Specifically, the output disable control circuit 251 outputs data inputted as the data signal 813 to the outside if the control signal 811 indicates a read operation and the read disable remove signal 826 to the erase unit indicated by the address signal 812 is set to "1" and otherwise disables the outputting of the data signal 813 to the outside. It is to be noted that the verify result signal 814 is outputted to the outside via the data I/O terminal 803 irrespective of the read disable remove signal 826.

A description will be given herein below to the operation of the semiconductor device 201 according to the present embodiment thus constituted.

The description will be given first to operations performed from the outside of the semiconductor device 201 to the nonvolatile memory cell block 205 with reference to FIGS. 5, 6(*a*), and 6(*b*).

Each of the operations performed from the outside to the nonvolatile memory block 205 according to the present embodiment is performed by inputting an instruction to perform the operation and address information on a memory cell, to which the operation is to be performed, to the control signal input terminal 801 and to the address input terminal 802, respectively, each from the outside in the same manner as in the first embodiment. In the write operation and the write verify operation, data for writing is inputted to the data I/O terminal 803. Based on the inputs, the rewrite control circuit 106 and the input control circuit 152 are driven to input the control signal 811, the address signal 812, and the data signal 813 to the I/O controller 122.

The write operation and the write verify operation can be performed in the same manner as in the first embodiment.

Upon receiving the control signal 811 indicative of the erase operation, the I/O controller 122 controls the decoder 124 such that it selects the erase unit indicated by the address signal 812, while controlling the memory cell array 221 to bring each of the memory cells in the erase unit into the erased state.

Upon receiving the control signal 811 indicative of the erase verify operation, the I/O controller 122 consecutively reads, as sense amplifier signals, the data sets written in the erase unit indicated by the address signal 812 starting from the leading address in the erased unit. If each of the data sets read as the sense amplifier signals indicates the erased state, it is determined that the erased operation has been performed normally so that "1" is outputted as the verify result signal 814. Otherwise, "0" is outputted as the verify result signal 814.

Upon receiving the control signal 811 indicative of a read operation, the I/O controller 122 drives the memory cell array 221, the sense amplifier 123, and the decoder 124 and outputs data written in the memory cell indicated by the address signal 812 as the data signal 813 to the output disable control unit 251. Then, the output disable control circuit 251 determines, based on the address signal 812, the erase unit to which the data signal 813 for reading inputted from the I/O controller 122 corresponds and outputs the data signal 813 to the outside via the data I/O terminal 803 if the one of the signals composing the read disable remove signal 826 which corresponds to the erase unit is set to "1". If the one of the signals composing the read disable remove signal 826 which corresponds to the erase unit is set to "0", the output disable control circuit 251 disables the outputting of the data signal 813 so that a read operation to the outside is not completed.

The description will be given next to a method for reading data held in the memory cell array 221 to the outside.

An operational procedure for removing the disabling of a read operation to the outside of the semiconductor device 201 according to the second embodiment is different from the operational procedure according to the first embodiment which is shown in FIG. 3(*a*) in that the reading of data held in the memory cell array 221 is disabled on a per erase-unit basis. In the following, a method for reading data from the second erase unit 262 will be described by way of example with reference to FIG. 3(*a*).

First, the power supply for the semiconductor device 201 is turned ON. At this time, each of the registers in the operational procedure detecting register unit 242 is in the reset state since it is volatile. Accordingly, each of the read disable remove signals 826 is set to "0" so that the output disable control circuit 251 of the external I/O controller 207 disables, for each of the erase units, the outputting of the data signal 813 inputted from the nonvolatile memory block 205 to the data I/O terminal 803. In short, the output disable control circuit 251 assuredly disables the outputting of data held in each of the erase units in the memory cell array 221 when the power supply is turned ON.

Then, the control signal 811 indicative of an erase operation and the address signal 812 indicative of the second erase unit 262 are inputted from the control signal input terminal 801 and the address input terminal 802 to the I/O controller 122 via the rewrite control circuit 106. Consequently, the erase operation is performed to each of the memory cells in the second erase unit 262 in the nonvolatile memory block 205. Subsequently to the erase operation, the control signal 811 is inputted to the operation detecting circuit 131 so that the operation detecting circuit 131 detects that the erase operation has been performed.

Then, the control signal 811 indicative of an erase verify operation and the address signal 812 are inputted from the control signal input terminal 801 and the address input terminal 802 to the I/O controller 122 via the rewrite control circuit 106. Consequently, the erase verify operation is performed to each of the memory cells in the second erase unit 262 in the nonvolatile memory block 205 and the result of the erase verify operation is outputted as the verify result signal 814. Subsequently to the erase verify operation, the ease result determining circuit 232 determines whether or not the erase operation to each of the memory cells in the second erase unit 262 has been performed normally based on the address signal 812 and the verify result signal 814 received thereby.

Then, the control signal 811 indicative of a write operation and the address signal 812 indicative of the second erase unit 262 are inputted from the control signal input terminal 801 and the address input terminal 802 to the I/O controller 122 via the rewrite control circuit 106, while the data signal 813 as input data is inputted from the data I/O terminal 803 to the I/O controller 122 via the external I/O controller 207. Consequently, the I/O controller 122 and the decoder 124 performs a write operation to the memory cell array 221 based on the address signal 812 and the data signal 813. Subsequently to the operation, the control signal 811 is inputted to the operation detecting circuit 131, which detects that the write operation has been performed.

Next, the control signal 811 indicative of a write verify operation and the address signal 812 indicative of each of the memory cells in the second erase unit 262 are inputted from the control signal input terminal 801 and the address input terminal 802 to the I/O controller 122 via the rewrite control unit 106, while the data signal 813 for comparison is inputted from the data I/O terminal 803 to the I/O controller 122 via the external I/O controller 207. Consequently, the write verify operation is performed to each of the memory cells in the second erase unit 262 and the result of the write verify operation is outputted as the verify result signal 814. Subsequently to the write verify operation, the write result determining circuit 233 determines whether or not the write operation to each of the memory cells in the second erase unit 262 has been performed normally based on the address signal 812 and the verify result signal 814 received thereby.

In the foregoing operations, if the erase operation is detected first by the operation detecting circuit 131, the normal erase operation to the second erase unit 262 is then verified by the erase result determining circuit 232, the write operation is detected thereafter by the operation detecting circuit 131, the normal operation to the second erase unit 262 is verified subsequently by the write result determining circuit 233, and it is further detected that these operations have been performed to each of the memory cells in the second erase unit 262, the operational procedure detecting circuit 234 sets the one of the signals composing the operational procedure detect signal 825 which corresponds to the second erase unit 262 to "1" so that the second register in the operational procedure detecting register unit 242 is brought into the set state.

If the operation detecting circuit 131 detects any operation other than the erase operation and the write operation in the respective procedural steps in which the erase operation and the write operation should be detected or if the erase result determining circuit 232 and the write result determining circuit 233 do not verify the normal erase operation and the normal write operation to the second erase unit, respectively, the operational procedure detecting circuit 234 sets the one of the signals composing the operational procedure detect signal 825 which corresponds to the second erase unit 262 to "0" so that the second register in the operational procedure detecting register unit 242 remains in the reset state and the read disable removing circuit 243 sets the one of the signals composing the read disable remove signal 826 which corresponds to the second erase unit 262 to "0". Consequently, the output disable control circuit 251 disables the outputting of the data signal 813 inputted from the second control unit 262 to the external I/O controller 207 so that, even if an instruction to perform a read operation to the second erase unit 262 is inputted from the outside, data held in the second erase unit 262 is not outputted.

Thus, the second register in the operational procedure detecting register unit 242 is brought into the set state and the one of the signals composing the read disable remove signal 826 which corresponds to the second erase unit 262 is set to "1" only when the erase operation, the verification of a normal erase operation, the write operation, and the verification of a normal write operation have been performed in succession to each of the memory cells in the second erase unit 262. As a result, the setting of read disable to the second erase unit 262 is removed in the output disable control circuit 251 and a read operation to the outside is enabled.

Thereafter, a read operation to the second erase unit 262 can be performed until the power supply is turned OFF. When the power supply is turned ON next time, each of the registers in the operational procedure detecting register unit 242 is brought into the reset state again so that the output disable control circuit 251 disables the outputting of the data signal 813 to the data I/O terminal 803. As a result, the security of data held in each of the erase units in the memory cell array 221 is brought into a protected state.

Although the method for reading data held in the memory cell array 221 to the outside has thus far been described by using the second erase unit 262 as an example, a read operation can similarly be performed independently to each of the other erase units on a per erase-unit basis.

It is also possible to enable, when the verification of a normal erase operation and the verification of a normal write operation have been performed successively to one of the erase units as in the first variation of the first embodiment shown in FIG. 3(*b*), the reading of the data stored in the erase unit to the outside by changing the setting of the operational procedure detecting circuit 234. It will easily be appreciated that, when the detection of a preprogram operation, the detection of an erase operation, the verification of a normal erase operation, a write operation, and the verification of a normal write operation have been performed successively to one of the erase units as in the second variation of the first embodiment shown in FIG. 4(*a*) or when the detection of an erase operation, the verification of a normal erase operation, a write operation, the verification of a normal write operation, and the detection of a reverse operation have been performed successively to one of the erase units as in the third variation of the first embodiment shown in FIG. 4(*b*), the reading of data stored in the erase unit may also be enabled.

It is also possible to implement the operational procedure limited to the method which repeatedly performs write operations and write verify operations to each specified number of memory cells starting from the leading address in succession and the operational procedure which prevents each of the memory cells in each of the erase units from being brought into the same state, in the same manner as in the first embodiment.

Thus, the second embodiment not only enables security protection, similarly to the first embodiment, but also removes read disable for each of the blocks serving as the erase units on a per block basis so that it is sufficient to perform a specified operation only to the erase unit of concern if the removal of read disable may be performed only locally and an erase operation need not be performed to each of the erase units. This prevents the degradation of the reliability of the memory cells caused by an unnecessary erase operation.

Embodiment 3

A third embodiment of the present invention will be described herein below with reference to the drawings. The description of components having the same functional configurations as in the first embodiment will be omitted by retaining the same reference numerals.

FIGS. 7(*a*) and 7(*b*) show a functional configuration of a semiconductor device according to the third embodiment.

As shown in FIG. 7(*a*), the semiconductor device 301 according to the present embodiment comprises: the CPU 102; the RAM 103; the control circuit 104; and a nonvolatile memory block 305 for storing data. The semiconductor device 301 is also provided with the control signal input terminal 801, the address input terminal 802, and the data I/O terminal 803 as means for connection with the outside. The control signal input terminal 801 and the address input terminal 802 are connected to the nonvolatile memory block 305 via the rewrite control circuit 106, while the data I/O terminal 803 is connected to the nonvolatile memory block 305 via an external I/O controller 307. For the read disabling of data held in the nonvolatile memory block 305 to the outside, the rewrite operation detecting unit 108 and the read disable removal controller 109 are provided.

The nonvolatile memory block 305 is constituted by the memory cell array 121, an I/O controller 322 for controlling an operation to the memory cell array 121, the sense amplifier 123, and the decoder 124.

The rewrite operation detecting unit 108 and the read disable removal controller 109 according to the present embodiment are similarly constituted to the rewrite operation detecting unit and the read disable removal controller according to the first embodiment which are shown in FIG. 2(a). The rewrite operation control unit 108 is constituted by the operation detecting circuit 131, the erase result determining circuit 132, the write result determining circuit 133, and the operational procedure detecting circuit 134. The read disable removal controller 109 is constituted by the read operation detecting circuit 141, the operational procedure detecting register 142, and the read disable removing circuit 143. However, the read disable remove signal 816 outputted from the read disable removing circuit 143 is inputted to a data output disable control circuit 362 of the I/O controller 322.

The external I/O controller 307 is a circuit for outputting, as the data signal 813, data inputted from the outside via the data I/O terminal 803 to the I/O controller 322 and outputting the data signal 813 and the verify result signal 814, each inputted from the I/O controller 322, to the outside via the data I/O terminal 803.

The present embodiment is different from the first embodiment in that the read disable remove signal 816 inputted from the read disable removal controller 109 is inputted to the I/O controller 322 and read disable is performed by the I/O controller 322.

A description will be given to the I/O controller 322 according to the present embodiment.

Figure 7A:
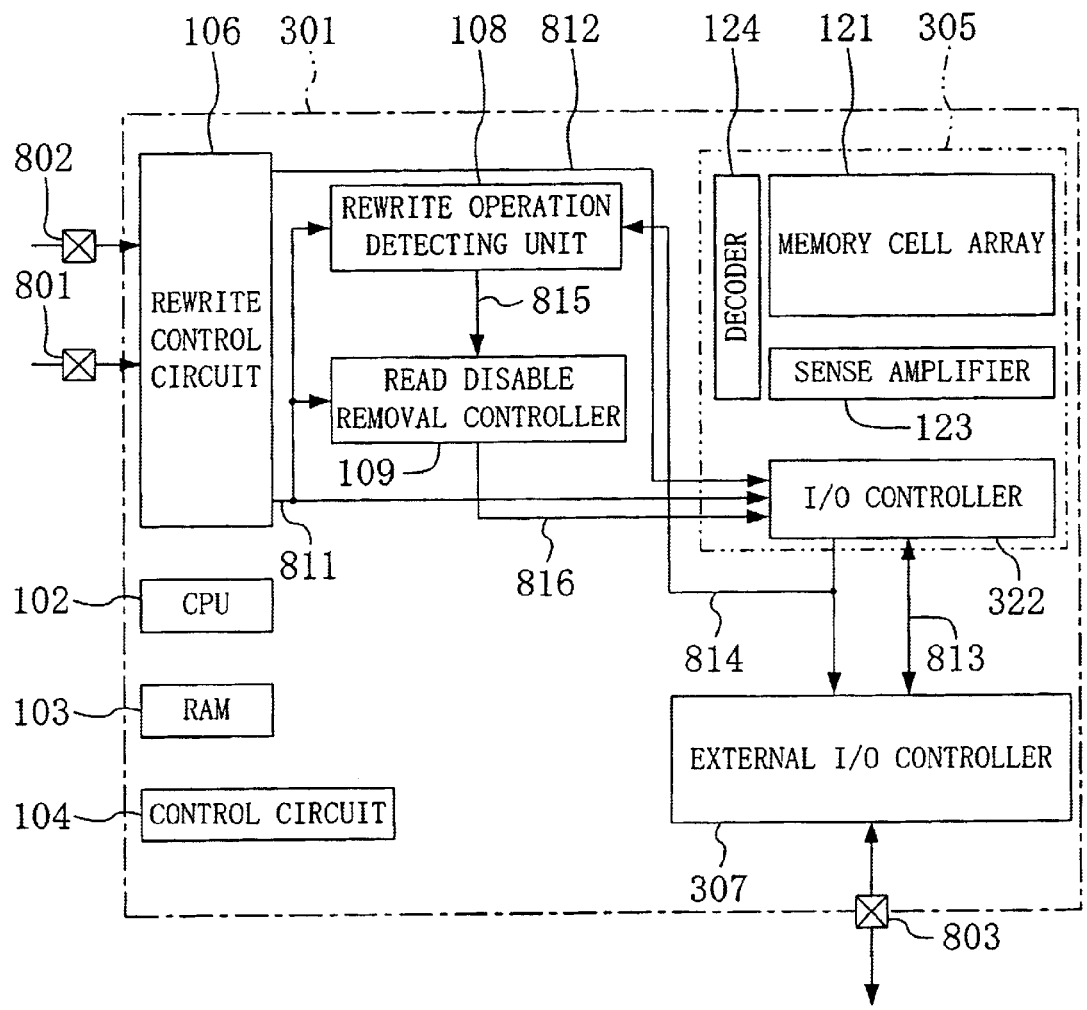
FIG. 7(a) is a functional block diagram showing a semiconductor device according to a third embodiment of the present invention and FIG. 7(b) is a functional block diagram showing an I/O controller in the semiconductor device according to the third embodiment.
Figure 7B:
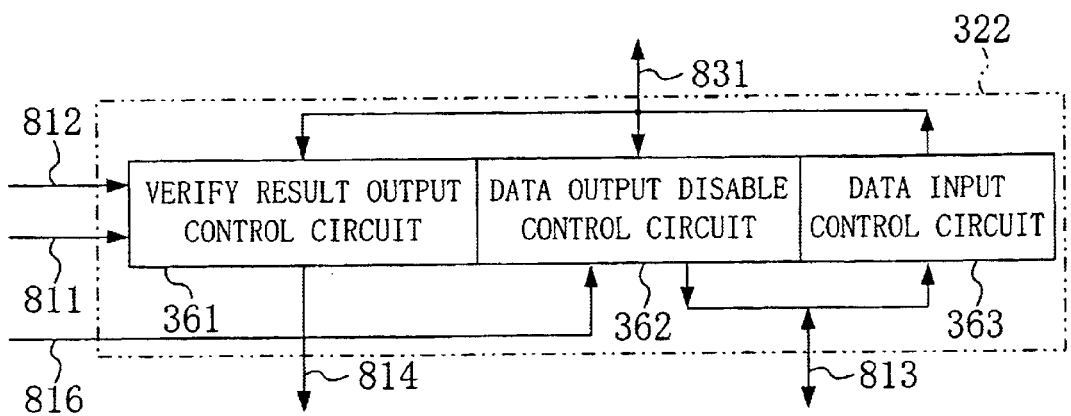

FIG. 7(b) shows a functional configuration of the I/O controller 322 according to the present embodiment.

As shown in FIG. 7(b), the I/O controller 322 according to the present embodiment is constituted by a verify result control circuit 361 for determining whether or not an operation to the memory cell array has been performed normally and outputting the result of determination, the data output disable control circuit 362 for controlling the outputting of data held in the memory cell array 121, and a data input control circuit 363 for controlling the inputting of data to the memory cell array 121.

The data input control circuit 363 is a circuit for writing, as a sense amplifier signal 831, the data inputted as the data from the external I/O controller 307 in the memory cell array 121 based on the control signal 811 and the address signal 812. The data output disable control circuit 362 is a circuit for controlling, based on the control signal 811 and the address signal 812, whether or not the data read as the sense amplifier signal 831 from the memory cell array 121 should be outputted as the data signal 813.

If a signal indicative of a read operation is outputted as the control signal 811 and the read disable remove signal 816 is set to "1", the data output disable control circuit 362 outputs the sense amplifier signal 831 as the data signal 813 to the external I/O controller 307 and otherwise disables the outputting of the data signal 813.

The verify result output control circuit 361 controls an erase verify operation and a write verify operation to the memory cell array 121 based on the control signal 811 and the address signal 812 and outputs the result as the verify result signal 814 to the external I/O controller 307.

A description will be given herein below to the operation of the semiconductor device 301 according to the present embodiment thus constituted.

The description will be given first to operations performed from the outside of the semiconductor device 301 to the nonvolatile memory block 305 with reference to FIGS. 2(a), 7(a), and 7(b).

Each of the operations performed from the outside to the nonvolatile memory block 305 according to the present embodiment is performed by inputting an instruction to perform the operation and address information on a memory cell, to which the operation is to be performed, to the control signal input terminal 801 and to the address input terminal 802, respectively, each from the outside. In a write operation and a write verify operation, data for writing is inputted to the data I/O terminal 803. Based on the inputs, the rewrite control circuit 106 and the external I/O controller 307 are driven to input the control signal 811, the address signal 812, and the data signal 813 to the I/O controller 322.

Upon receiving the control signal 811 indicative of a write operation, the I/O controller 322 controls the decoder 124 such that it selects the memory cell at the address indicated by the address signal 812. On the other hand, the data input control circuit 363 controls the memory cell array 121 such that the data inputted as the data signal 813 from the outside is written in the memory cell.

Write operations may also be performed consecutively starting from a leading address on a per byte basis or on a per page basis.

Upon receiving the control signal 811 indicative of a write verify operation, the I/O controller 322 controls the decoder 124 such that it selects the memory cell at the address indicated by the address signal 812. The verify result output control circuit 361 drives the memory cell array 121 and the sense amplifier 123 such that the data written in the memory cell is read as the sense amplifier signal 831. Then, it is determined by the verify result output control circuit 361 whether or not the write operation has been performed normally by making a comparison between the data read as the sense amplifier signal 831 and the data inputted as the data signal 813. If the read data and the data inputted as the data signal 813 match completely, it is determined that the write operation has been performed normally so that "1" is outputted as the verify result signal 814. Otherwise, "0" is outputted as the verify result signal 814.

Upon receiving the control signal 811 indicative of an erase operation, the I/O controller 322 controls the decoder 124 such that it selects the memory cell indicated by the address signal 812, while controlling the memory cell array 121 such that the selected memory cell is brought into the erased state.

Upon receiving the control signal 811 indicative of the erase verify operation, the verify result output control circuit 361 drives the memory cell array 121, the sense amplifier 123, and the decoder 124 such that the data sets written in the memory cells are read as the sense amplifier signals 831. If each of the data sets read as the sense amplifier signals 831 indicates the erased state, it is determined that the erase operation has been performed normally so that "1" is outputted as the verify result signal 814. Otherwise, "0" is outputted as the verify result signal 814.

If the control signal 811 indicative of a read operation is inputted to the I/O controller 322, the data output disable control circuit 362 drives the memory cell array 121, the sense amplifier 123, and the decoder 124 and reads, as the sense amplifier signal 831, the data written in the memory cell indicated by the address signal 812. If the read disable remove signal 816 is set to "1", the data output disable control circuit 362 outputs the sense amplifier signal 831 as the data signal 813 to the external I/O controller 307. If the read disable remove signal 816 is set to "0", the data output disable control circuit 362 performs a control operation such that the data signal 813 is not generated from the sense amplifier signal 831 and therefore a read operation is not performed.

A description will be given next to a method for reading data held in the memory cell array 121 to the outside with reference to the drawings.

An operational procedure for removing the disabling of a read operation to the outside of the semiconductor device 301 according to the third embodiment is the same as the operational procedure according to the first embodiment shown in FIG. 3(a) except that the I/O controller 322 disables the operation of reading data held in the memory cell array 121 to the outside. Referring to FIG. 3(a), the method of a read operation to the memory cell array 121 according to the present embodiment will be described herein below.

First, a power supply for the semiconductor device 301 is turned ON. At this time, the operational procedure detecting register 142 is in the reset state so that the read disable removing circuit 143 outputs "0" as the read disable remove signal 816. As a result, the outputting of the data read as the sense amplifier signal 831 is disabled. In short, the data output disable control circuit 362 assuredly disables the outputting of the data held in the memory cell array 121 from the nonvolatile memory block 305 when the power supply is turned ON.

Then, an erase operation, an erase verify operation, a write operation, and a write verify operation are performed successively each from the outside in the same manner as in the first embodiment.

In the foregoing operations, if the erase operation is detected first by the operational detecting circuit 131, the normal erase operation is then verified by the erase result determining circuit 132, the write operation is detected thereafter by the operation detecting circuit 131, and the normal operation is verified subsequently by the write result determining circuit 133, the operational procedure detecting circuit 134 sets the operational procedure detect signal 815 to "1".

If the operation detecting circuit 131 detects any operation other than the erase operation and the write operation in the respective procedural steps in which the erase operation and the write operation should be detected or if the normal erase operation and the normal write operation are not verified by the erase result determining circuit 132 and by the write result determining circuit 133, the operational procedure detecting circuit 134 sets the operational procedure detect signal 815 to "0" so that the operational procedure detecting register 142 remains in the reset state and the read disable removing circuit 143 sets the read disable remove signal 816 to "0". Consequently, the data output disable control circuit 362 performs a control operation such that the sense amplifier signal 831 inputted from the memory cell array 121 is not outputted as the data signal 813. Accordingly, the data held in the memory cell array 121 is not read from the nonvolatile memory block 305 even when an instruction to perform a read operation is inputted from the outside.

Thus, only when the erase operation, the verification of a normal erase operation, the write operation, and the verification of a normal write operation have been performed successively to each of the memory cells in the memory cell array 121, the operational procedure detecting register 142 is brought into the set state and the read disable remove signal is set to "1" so that the read disabled state in the data output disable control circuit 362 is removed and a read operation to the outside is enabled.

Thereafter, the read enabled state is maintained until the power supply is turned OFF. When the power supply is turned ON next time, the operational procedure detecting register 142 is brought into the reset state again so that the data output disable control circuit 362 disables the outputting of the data signal 813. This brings the security of data held in the memory cell array 121 into a protected state.

It is also possible to enable, only when the verification of a normal erase operation and the verification of a normal write operation have been performed successively as in the first variation of the first embodiment shown in FIG. 3(b), the reading of the data to the outside by changing the setting of the operational procedure detecting circuit 134. It will easily be appreciated that, only when the detection of a preprogram operation, the detection of an erase operation, the verification of a normal erase operation, a write operation, and the verification of a normal write operation have been performed successively as in the second variation of the first embodiment shown in FIG. 4(a) or only when the detection of an erase operation, the verification of a normal erase operation, a write operation, the verification of a normal write operation, and the detection of a reverse operation have been performed successively as in the third variation of the first embodiment shown in FIG. 4(b), the reading of the data to the outside may also be enabled.

It is also possible to perform the operational procedure limited to the method which repeatedly performs write operations and write verify operations to each specified number of memory cells starting from the leading address in succession and the operational procedure which prevents each of the memory cells from being brought into the same state, in the same manner as in the first embodiment.

Thus, the third embodiment not only enables security protection, similarly to the first embodiment, but also prevents the data held in the memory cell array 121 from being read from the nonvolatile memory block 305. This prevents an outsider from improperly using the data by, e.g., analyzing the data signal 813 between the I/O controller 322 and the external I/O controller 307 and allows more reliable security protection.

Embodiment 4

A fourth embodiment of the present invention will be described herein below with reference to the drawings. The description of components having the same functional configurations as in the second and third embodiments will be omitted by retaining the same reference numerals.

Figure 8A:
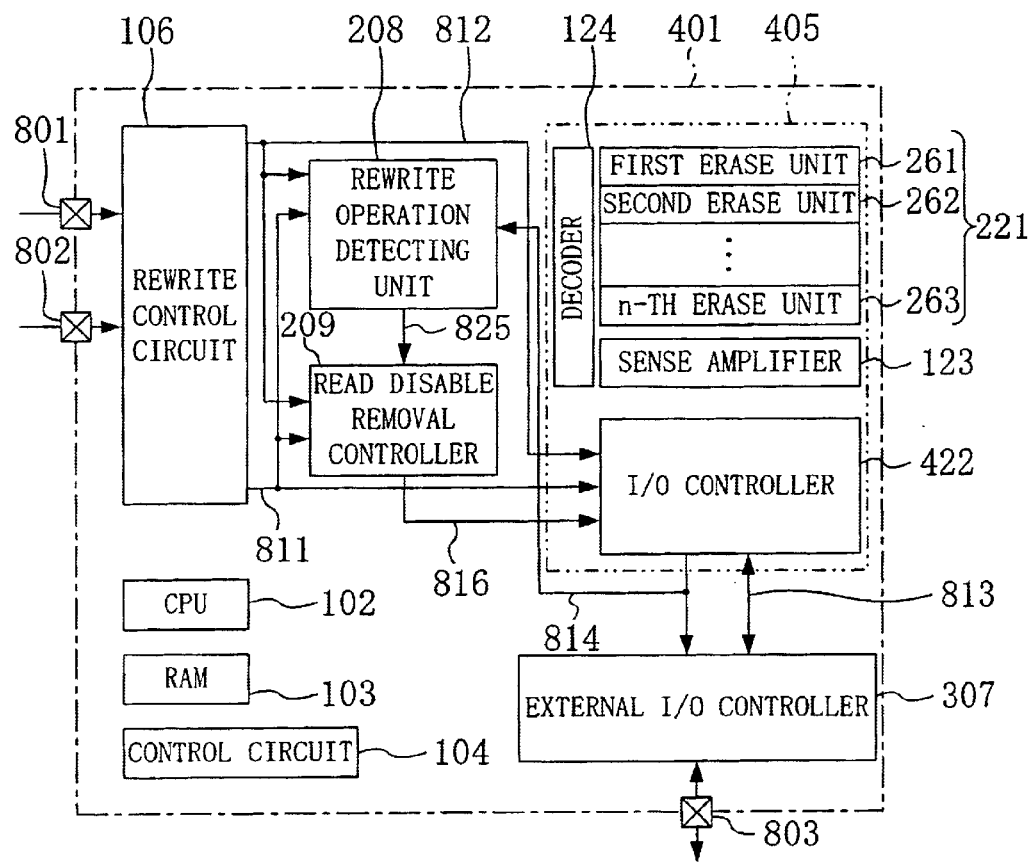
FIG. 8(a) is a functional block diagram showing a semiconductor device according to a fourth embodiment of the present invention and FIG. 8(b) is a functional block diagram showing an I/O controller in the semiconductor device according to the fourth embodiment.
Figure 8B:
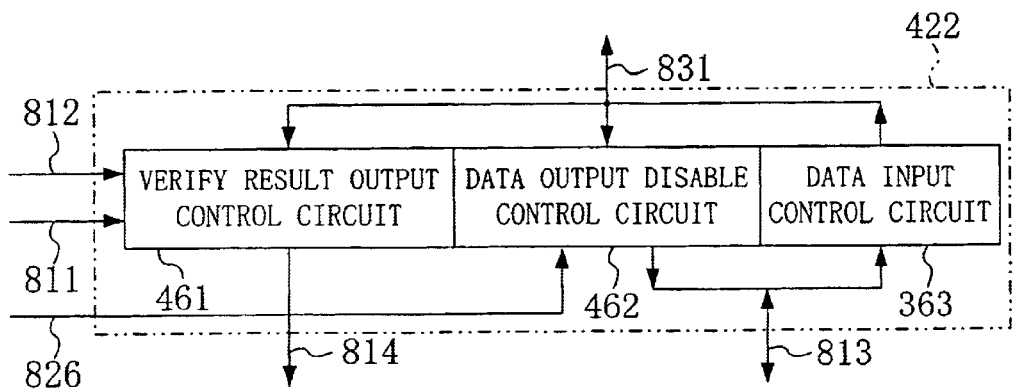

FIGS. 8(a) and 8(b) show a functional configuration of a semiconductor device according to the fourth embodiment. As shown in FIG. 8(a), the semiconductor device 401 according to the present embodiment comprises: the CPU 102; the RAM 103; the control circuit 104; and a nonvolatile memory block 405 for storing data. The semiconductor device 401 is also provided with the control signal input terminal 801, an address input terminal 802, and the data I/O terminal 803 as means for connection with the outside. The control signal input terminal 801 and the address input terminal 802 are connected to the nonvolatile memory block 405 via the rewrite control circuit 106, while the data I/O terminal 803 is connected to the nonvolatile memory block 405 via the external I/O controller 307. For the read disabling of data held in the nonvolatile memory block 505 to the outside, the rewrite operation detecting unit 208 and the read disable removal controller 209 are provided.

The nonvolatile memory block 405 is constituted by the memory cell array 221, an I/O controller 422 for controlling an operation to the memory cell array 221, the sense amplifier 123, and the decoder 124. The memory cell array 221 is composed of flash EEPROMs and divided into n (n is an integer of 2 or more) blocks of the first erase unit 261, the second erase unit 262, ..., and the n-th erase unit 263.

The rewrite operation detecting unit 208 and the read disable removal controller 209 according to the present embodiment are similarly constituted to the rewrite operation detecting unit 208 and the read disable removal controller 209 according to the second embodiment which are shown in FIG. 6(a). The rewrite operation detecting unit 208 is constituted by the operation detecting circuit 131, the erase result determining circuit 232, the write result determining circuit 233, and the operational procedure detecting circuit 234. The read disable removal controller 209 is constituted by the read operation detecting circuit 141, the operational procedure detecting register unit 242, and the read disable removing circuit 243. However, the read disable remove signal 826 outputted from the read disable removing circuit 243 is inputted to a data output disable control circuit 462 of the I/O controller 422.

The present embodiment is different from the second embodiment in that the read disable remove signal 826 is inputted from the read disable removal controller 209 to the I/O controller 422 which controls read disable.

A specific description will be given herein below to the individual components of the semiconductor device according to the present embodiment thus constituted.

FIG. 8(b) shows a functional configuration of the I/O controller 422 according to the present embodiment.

As shown in FIG. 8(b), the I/O controller 422 according to the present embodiment is constituted by a verify result output control circuit 461, the data output disable control circuit 462 for controlling the outputting of data held in the memory cell array 221, and a data input control circuit 363 for controlling the inputting of the data to the memory cell array 221.

The data output disable control circuit 462 is a circuit for controlling, based on the control signal 811 and the address signal 812, whether or not the data read as the sense amplifier signal 831 from the memory cell array 221 should be outputted as the data signal 813.

If the control signal 811 indicates a read operation and the read disable remove signal 826 to the erase unit indicated by the address signal 812 is set to "1", the data output disable control circuit 462 outputs the sense amplifier signal 831 as the data signal 813 to the external I/O controller 307 and otherwise disables the outputting of the data signal 813 to the outside. It is to be noted that the verify result signal 814 is outputted to the outside via the data I/O terminal 803 irrespective of the read disable remove signal 826.

A description will be given herein below to the operation of the semiconductor device 401 according to the present embodiment thus constituted.

The description will be given first to operations performed from the outside of the semiconductor device 401 to the nonvolatile memory cell block 405 with reference to FIGS. 6(a), 8(a), and 8(b).

Each of the operations performed from the outside to the nonvolatile memory block 405 according to the present embodiment is performed by inputting an instruction to perform the operation and address information on a memory cell, to which the operation is to be performed, to the control signal input terminal 801 and to the address input terminal 802, respectively, each from the outside in the same manner as in the first embodiment. In the write operation and the write verify operation, data for writing is inputted to the data I/O terminal 803. Based on the inputs, the rewrite control circuit 106 and the external I/O controller 307 are driven to input the control signal 811, the address signal 812, and the data signal 813 to the I/O controller 422.

The write operation and the write verify operation can be performed in the same manner as in the third embodiment.

Upon receiving the control signal 811 indicative of the erase operation, the I/O controller 422 controls the decoder 124 such that it selects the erase unit indicated by the address signal 812, while controlling the memory cell array 221 to bring each of the memory cells in the erase unit into the erased state.

Upon receiving the control signal 811 indicative of the erase verify operation, the verify result output control circuit 461 drives the memory cell array 221, the sense amplifier 123, and the decoder 124 such that data sets are read consecutively as the sense amplifier signals 831 starting from the leading address in the erase unit indicated by the address signal 812. If each of the data sets read as the sense amplifier signal 831 indicates the erased state, it is determined that the erase operation has been performed normally so that "1" is outputted as the verify result signal 814. Otherwise, "0" is outputted as the verify result signal 814.

If the control signal 811 indicative of a read operation is inputted to the I/O controller 422, the data output disable control circuit 462 drives the memory cell array 221, the sense amplifier 123, and the decoder 124 so that the data written in the memory cell indicated by the address signal 812 is read as the sense amplifier signal 831. At this stage, the data output disable control circuit 462 determines, based on the address signal 812, the erase unit to which the sense amplifier signal 831 read from the memory cell array 221 corresponds and outputs the sense amplifier signal 831 as the data signal 813 to the external I/O controller 307 if the one of the signals composing the read disable remove signal 826 which corresponds to the erase unit is set to "1". If the one of the signals composing the read disable remove signal 826 which corresponds to the erase unit is set to "0", the data output disable control circuit 462 disables the outputting of the data signal 813 so that a read operation to the outside is not completed. Since the data output disable control circuit 462 performs a control operation such that the data signal 813 is not generated from the sense amplifier signal 831, a read operation is not performed.

A description will be given next to a method for reading data held in the memory cell array 221 to the outside with reference to the drawings.

An operational procedure for removing the disabling of a read operation to the outside of the semiconductor device 401 according to the fourth embodiment is the same as the operational procedure according to the second embodiment except that the I/O controller 422 disables the operation of reading data held in the memory cell array 221 to the outside. By way of example, the method of a read operation to the second erase unit 262 will be described herein below with reference to FIG. 3(a).

First, a power supply for the semiconductor device 401 is turned ON. At this time, each of the registers in the operational procedure detecting register unit 242 is in the reset state so that each of the read disable remove signals 826 is set to "0". Accordingly, the data output disable control circuit 462 of the I/O controller 422 disables, for each of the erase units, the outputting of the data read as the sense amplifier signal 831 to the external I/O controller 307. In short, the data output disable control circuit 462 assuredly disables the outputting of data held in each of the erase units in the memory cell array 221 from the nonvolatile memory block 405 when the power supply is turned ON.

Then, an erase operation, an erase verify operation, a write operation, and a write verify operation are performed successively from the outside to each of the memory cells in the second erase unit 262 in the same manner as in the second embodiment.

In the foregoing operations, if the erase operation is detected first by the operation detecting circuit 131, the normal erase operation to the second erase unit 262 is then verified by the erase result determining circuit 232, the write operation is detected thereafter by the operation detecting circuit 131, and the normal operation to the second erase unit 262 is verified subsequently by the write result determining circuit 233, the operational procedure detecting circuit 234 sets the one of the signals composing the operational procedure detect signal 825 which corresponds to the second erase unit 262 to "1" so that the second register in the operational procedure detecting register unit 242 is brought into the set state.

If the operation detecting circuit 131 detects any operation other than the erase operation and the write operation in the respective procedural steps in which the erase operation and the write operation should be detected or if the erase result determining circuit 232 and the write result determining circuit 233 do not verify the normal erase operation and the normal write operation, respectively, the operational procedure detecting circuit 234 sets the one of the signals composing the operational procedure detect signal 825 which corresponds to the second erase unit 262 to "0" so that the second register in the operational procedure detecting register unit 242 remains in the reset state and the read disable removing circuit 243 sets the one of the signals composing the read disable remove signal 826 which corresponds to the second erase unit 262 to "0". Consequently, the data output disable control circuit 462 performs a control operation such that the sense amplifier signal 831 inputted from the second erase unit 262 is not outputted as the data signal 813 and, even if an instruction to perform a read operation is inputted from the outside, the data held in the second erase unit 262 is not read from the nonvolatile memory block 405.

Thus, the second register in the operational procedure detecting register unit 242 is brought into the set state and the one of the signals composing the read disable remove signal which corresponds to the second erase unit 262 is set to "1" only when the erase operation, the verification of a normal erase operation, the write operation, and the verification of a normal write operation have been performed in succession to each of the memory cells in the second erase unit 262. As a result, the setting of read disable to the second erase unit 262 is removed by the data output disable control circuit 462 and the reading of data held in the second erase unit 262 to the outside is enabled.

Thereafter, a read operation to the second erase unit 262 can be performed until the power supply is turned OFF. When the power supply is turned ON next time, each of the registers in the operational procedure detecting register unit 242 is brought into the reset state again so that the data output disable control circuit 462 disables the outputting of the data signal 813. As a result, the security of data held in each of the erase units in the memory cell array 221 is brought into a protected state.

Although the method for reading data held in the memory cell array 221 to the outside has thus far been described by using the second erase unit 262 as an example, a read operation can similarly be performed independently to each of the other erase units on a per erase-unit basis.

It is also possible to enable, when the verification of a normal erase operation and the verification of a normal write operation have been performed successively to one of the erase units as in the first variation of the first embodiment shown in FIG. 3(*b*), the reading of the data stored in the erase unit to the outside by changing the setting of the operational procedure detecting circuit 234. It will easily be appreciated that, when the detection of a preprogram operation, the detection of an erase operation, the verification of a normal erase operation, a write operation, and the verification of a normal write operation have been performed successively to one of the erase units as in the second variation of the first embodiment shown in FIG. 4(*a*) or when the detection of an erase operation, the verification of a normal erase operation, a write operation, the verification of a normal write operation, and the detection of a reverse operation have been performed successively to one of the erase units as in the third variation of the first embodiment shown in FIG. 4(*b*), the reading of data stored in the erase unit may also be enabled.

It is also possible to implement the operational procedure limited to the method which repeatedly performs write operations and write verify operations to each specified number of memory cells starting from the leading address in succession and the operational procedure which prevents each of the memory cells in each of the erase units from being brought into the same state, in the same manner as in the first embodiment.

Thus, the fourth embodiment not only achieves the same effect as achieved by the second embodiment but also prevents the data held in the memory cell array 221 from being outputted to the outside of the nonvolatile memory block 405. This prevents improper use of the data through the action of, e.g., analyzing the data signal 813 between the I/O controller 422 and the external I/O controller 307 and allows more reliable security protection.

Embodiment 5

A fifth embodiment of the present invention will be described herein below with reference to the drawings. The description of components having the same functional configurations as in the third embodiment will be omitted by retaining the same reference numerals.

Figure 9:
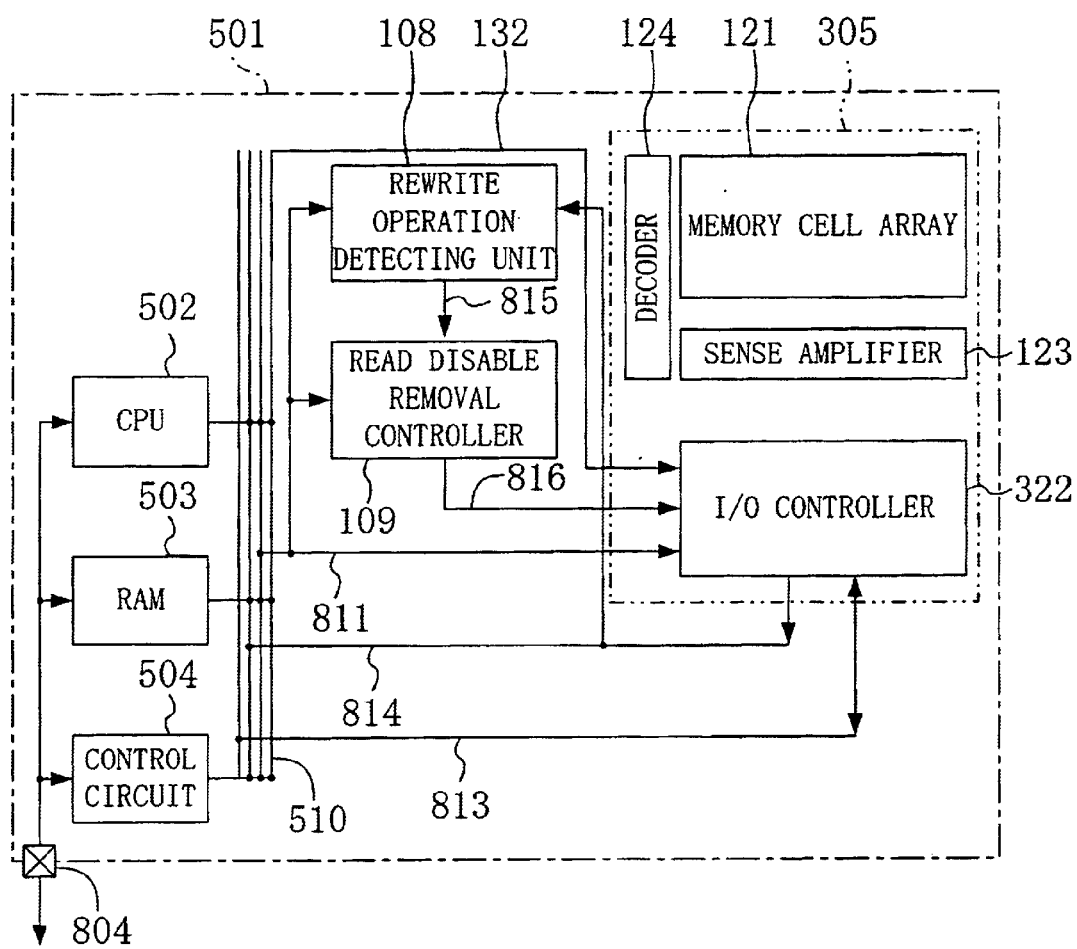
FIG. 9 is a functional block diagram showing a semiconductor device according to a fifth embodiment of the present invention.

FIG. 9 shows a functional configuration of a semiconductor device according to the fifth embodiment.

As shown in FIG. 9, the semiconductor device 501 according to the present embodiment comprises: a CPU 502; a RAM 503; a control circuit 504; and the nonvolatile memory block 305, which are connected to each other via a control bus 510. The semiconductor device 501 is also provided with an I/O terminal 804 as connecting means to the outside which is connected to each of the CPU 502, the RAM 503, and the control circuit 504. For the read disabling of data held in the nonvolatile memory block 305 to the outside, the rewrite operation detecting unit 108 and the read disable removal controller 109 are provided.

The nonvolatile memory block 305 is constituted by the memory cell array 121, the I/O controller 322, the sense amplifier 123, and the decoder 124. The I/O controller 322 is constituted by the verify result output control circuit 361, the data output disable control circuit 362, and the data input control circuit 363, similarly to the I/O controller 322 according to the third embodiment shown in FIG. 7(*b*).

The rewrite operation detecting unit 108 and the read disable removal controller 109 according to the present embodiment are similarly constituted to the rewrite operation detecting unit 108 and the read disable removal controller 109 according to the first embodiment which are shown in FIG. 2(*a*). The rewrite operation control unit 108 is constituted by the operation detecting circuit 131, the erase result determining circuit 132, the write result determining circuit 133, and the operational procedure detecting circuit 134. The read disable removal controller 109 is constituted by the read operation detecting circuit 141, the operational procedure detecting register 142, and the read disable removing circuit 143. However, the read disable signal 816 outputted from the read disable removing circuit 143 is inputted to a data output disable circuit 362 of the I/O controller 322.

The present embodiment is different from the third embodiment in that an operation from the outside to the nonvolatile memory block 305 is controlled via the CPU 502, the RAM 503, and the control circuit 504.

A description will be given herein below to the operation of the semiconductor device 501 according to the present embodiment thus constituted.

The description will be given first to operations performed from the outside of the semiconductor device 501 to the nonvolatile memory block 305 with reference to FIGS. 2(*a*), 7(*b*), and 9.

Each of the operations performed from the outside to the nonvolatile memory block 305 according to the present embodiment is performed by inputting control information including an instruction to perform the operation, address information on a memory cell to which the operation is to be performed, and data for writing to the I/O terminal 804. Based on the inputted control information, the CPU 502 generates the control signal 811, the address signal 812, and the data signal 813 and outputs them to the I/O controller 322 of the nonvolatile memory block 305.

Based on the operation indicated by the inputted control signal 811, the I/O controller 322 drives the memory cell array 121, the sense amplifier 123, and the decoder 124 so that a write operation, a write verify operation, an erase operation, an erase verify operation, and a read operation are performed in the same manner as in the third embodiment.

In the write verify operation and the erase verify operation, the verify result output control circuit 361 outputs the verify result signal 814 to the CPU 502. In the read operation, the data output disable control circuit 362 outputs the data signal 813 to the CPU 502 if the read disable remove signal 816 is set to "1". If the read disable remove signal 816 is set to "0", the data output disable control circuit 362 performs a control operation such that the data signal 813 is not generated from the sense amplifier signal 831 and therefore a read operation is not performed.

A description will be given next to a method for reading data held in the memory cell array 121 to the outside with reference to the drawings.

An operational procedure for removing the disabling of a read operation to the outside of the semiconductor device 501 according to the fifth embodiment is the same as the operational procedure according to the third embodiment except that an operation performed from the outside to the nonvolatile memory block 305 is controlled via the CPU 502. Referring to FIG. 3(*a*), the method of a read operation to the memory cell array 121 according to the present embodiment will be described herein below.

First, a power supply for the semiconductor device 501 is turned ON. At this time, the operational procedure detecting register 142 is in the reset state so that the read disable removing circuit 143 outputs "0" as the read disable remove signal 816. As a result, the outputting of the data read as the sense amplifier signal 831 is disabled. In short, the data output disable control circuit 362 assuredly disables the outputting of the data held in the memory cell array 121 from the nonvolatile memory block 305 to the CPU 502 when the power supply is turned ON.

Then, an erase operation, an erase verify operation, a write operation, and a write verify operation are performed successively from the outside via the CPU 502 by inputting the control information to the I/O terminal 804.

In the foregoing operations, if the erase operation is detected first by the operational detecting circuit 131, the normal erase operation is then verified in the erase result determining circuit 132, the write operation is detected thereafter by the operation detecting circuit 131, and the normal operation is verified subsequently by the write result determining circuit 133, the operational procedure detecting circuit 134 sets the operational procedure detect signal 815 to "1".

If the operation detecting circuit 131 detects any operation other than the erase operation and the write operation in the respective procedural steps in which the erase operation and the write operation should be detected or if the normal erase operation and the normal write operation are not verified by the erase result determining circuit 132 and by the write result determining circuit 133, the operational procedure detecting circuit 134 sets the operational procedure detect signal 815 to "0" so that the operational procedure detecting register 142 remains in the reset state and the read disable removing circuit 143 sets the read disable remove signal 816 to "0". Consequently, the data output disable control circuit 362 performs a control operation such that the sense amplifier signal 831 inputted from the memory cell array 121 is not outputted as the data signal 813. Accordingly, the data held in the memory cell array 121 is not read from the nonvolatile memory block 305 to the CPU 502 even when an instruction to perform a read operation is inputted from the outside.

Thus, only when the erase operation, the verification of a normal erase operation, the write operation, and the verification of a normal write operation have been performed successively to each of the memory cells in the memory cell array 121, the operational procedure detecting register 142 is brought into the set state and the read disable remove signal 816 is set to "1" so that the read disabled state in the data output disable control circuit 362 is removed and a read operation to the outside is enabled under the control of the CPU 502.

Thereafter, the read enabled state is maintained until the power supply is turned OFF. When the power supply is turned ON next time, the operational procedure detecting register 142 is brought into the reset state again so that the data output disable control circuit 362 disables the outputting of the data signal 813. This brings the security of data held in the memory cell array 121 into a protected state.

It is also possible to enable, only when the verification of a normal erase operation and the verification of a normal write operation have been performed successively as in the first variation of the first embodiment shown in FIG. 3(*b*), the reading of the data to the outside by changing the setting of the operational procedure detecting circuit 134. It will easily be appreciated that, only when the detection of a preprogram operation, the detection of an erase operation, the verification of a normal erase operation, a write operation, and the verification of a normal write operation have been performed successively as in the second variation of the first embodiment shown in FIG. 4(*a*) or only when the detection of an erase operation, the verification of a normal erase operation, a write operation, the verification of a normal write operation, and the detection of a reverse operation have been performed successively as in the third variation of the first embodiment shown in FIG. 4(*b*), the reading of the data may also be enabled.

It is also possible to perform the operational procedure limited to the method which repeatedly performs write operations and write verify operations to each specified number of memory cells starting from the leading address in succession and the operational procedure which prevents each of the memory cells from being brought into the same state, in the same manner as in the first embodiment.

Thus, the fifth embodiment not only enables security protection, similarly to the first embodiment, but also prevents the data held in the memory cell array 121 from being outputted to the outside of the nonvolatile memory block 305. This prevents improper use of the data through the action of, e.g., analyzing the data signal 813 on the control bus 510 and allows more reliable security protection.

Embodiment 6

A sixth embodiment of the present invention will be described herein below with reference to the drawings. The description of components having the same functional configurations as in the fourth embodiment will be omitted by retaining the same reference numerals.

Figure 10:
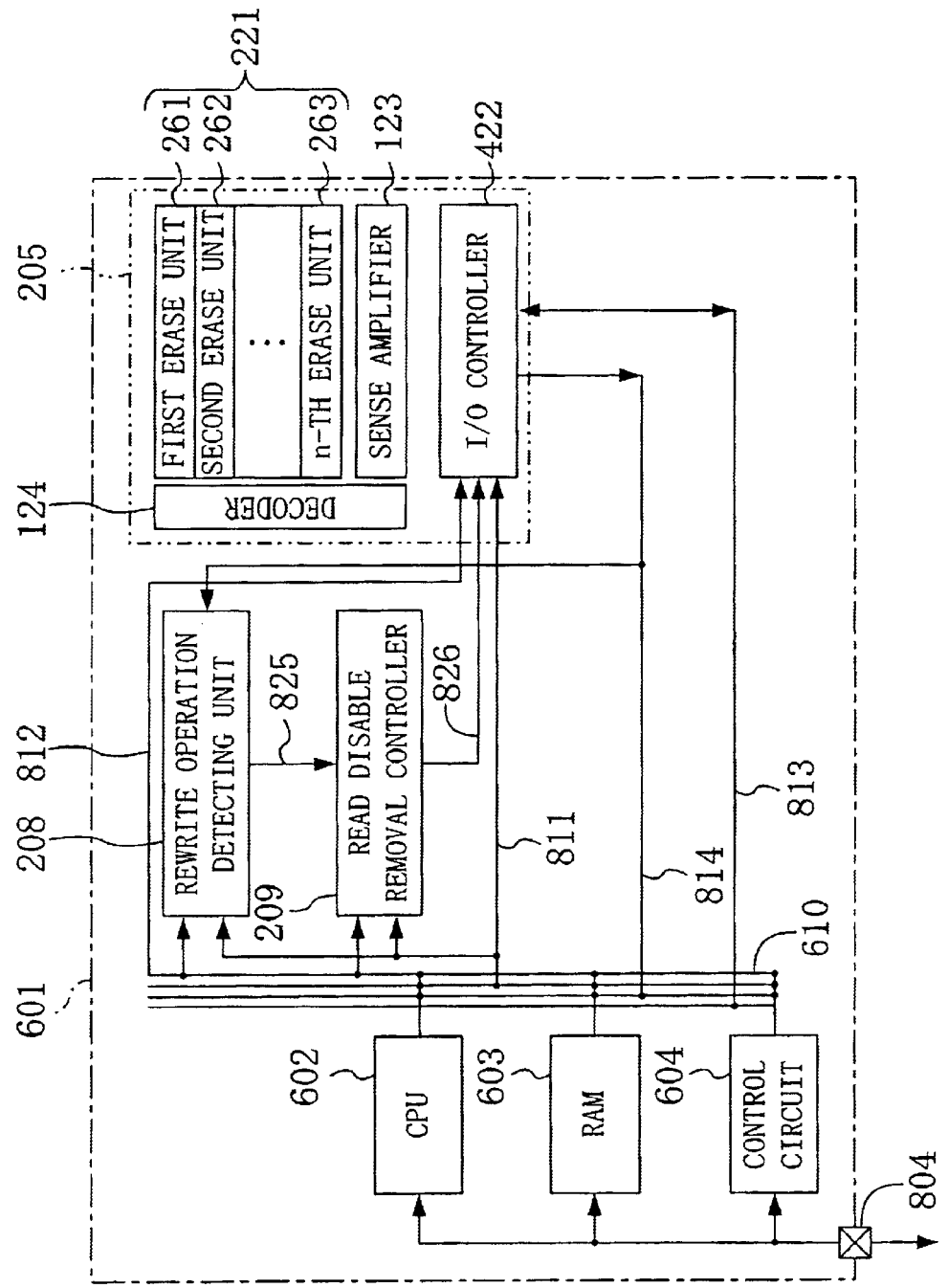
FIG. 10 is a functional block diagram showing a semiconductor device according to a sixth embodiment of the present invention.

FIG. 10 shows a functional configuration of a semiconductor device according to the sixth embodiment.

As shown in FIG. 10, the semiconductor device 601 according to the present embodiment comprises: a CPU 602; a RAM 603; a control circuit 604; and the nonvolatile memory block 405, which are connected to each other via a control bus 610. The semiconductor device 601 is also provided with the I/O terminal 804 as connecting means to the outside which is connected to each of the CPU 602, the RAM 603, and the control circuit 604. For the read disabling of data held in the nonvolatile memory block 405 to the outside, the rewrite operation detecting unit 208 and the read disable removal controller 209 are provided.

The nonvolatile memory block 405 is constituted by the memory cell array 221, the I/O controller 422, the sense amplifier 123, and the decoder 124. The memory cell array 221 is composed of flash EEPROMs and divided into n (n is an integer of 2 or more) blocks of the first erase unit 261, the second erase unit 262, . . . , and the n-th erase unit 263.

The I/O controller 422 is constituted by the verify result output control circuit 461, the data output disable control circuit 462, and the data input control circuit 363, similarly to the I/O controller 322 according to the third embodiment shown in FIG. 8(b).

The rewrite operation detecting unit 208 and the read disable removal controller 209 according to the present embodiment are similarly constituted to the rewrite operation detecting unit 208 and the read disable removal controller 209 according to the second embodiment shown in FIG. 6(a). The rewrite operation control unit 208 is constituted by the operation detecting circuit 131, the erase result determining circuit 232, the write result determining circuit 233, and the operational procedure detecting circuit 234. The read disable removal controller 209 is constituted by the read operation detecting circuit 141, the operational procedure detecting register unit 242, and the read disable removing circuit 243. However, the read disable signal 826 outputted from the read disable removing circuit 243 is inputted to a data output disable circuit 462 of an I/O controller 422.

The present embodiment is different from the fourth embodiment in that an operation from the outside to the nonvolatile memory block 405 is controlled via the CPU 602, the RAM 603, and the control circuit 604.

A description will be given herein below to the operation of the semiconductor device 601 according to the present embodiment thus constituted.

The description will be given first to operations performed from the outside to the nonvolatile memory block 405 with reference to FIGS. 6(a), 8(b), and 10.

Each of the operations performed from the outside to the nonvolatile memory block 405 according to the present embodiment is performed by inputting control information including an instruction to perform the operation, address information on a memory cell to which the operation is to be performed, and data for writing to the I/O terminal 804. Based on the inputted control information, the CPU 602 generates the control signal 811, the address signal 812, and the data signal 813 and outputs them to the I/O controller 422 of the nonvolatile memory block 405.

Based on the operation indicated by the inputted control signal 811, the I/O controller 422 drives the memory cell array 221, the sense amplifier 123, and the decoder 124 so that a write operation, a write verify operation, an erase operation, an erase verify operation, and a read operation are performed in the same manner as in the fourth embodiment.

In the write verify operation and the erase verify operation, the verify result output control circuit 461 outputs the verify result signal 814 to the CPU 602. In the read operation, the data output disable control circuit 462 outputs the data signal 813 to the CPU 602 if the read disable remove signal 826 is set to "1". If the read disable remove signal 826 is set to "0", the data output disable control circuit 462 performs a control operation such that the data signal 813 is not generated from the sense amplifier signal 831 and therefore a read operation is not performed.

A description will be given next to a method for reading data held in the memory cell array 221 to the outside with reference to the drawings.

An operational procedure for removing the disabling of a read operation to the outside of the semiconductor device 601 according to the fourth embodiment is the same as the operational procedure according to the fourth embodiment except that an operation performed from the outside to the nonvolatile memory block 405 is controlled via the CPU 602. By way of example, the method of a read operation to the second erase unit 262 will be described herein below with reference to FIG. 3(a).

First, a power supply for the semiconductor device 601 is turned ON. At this time, each of the registers in the operational procedure detecting register unit 242 is in the reset state so that each of the read disable remove signals 826 is set to "0". Accordingly, the data output disable control circuit 462 of the I/O controller 422 disables, for each of the erase units, the outputting of the data read as the sense amplifier signal 831 to the CPU 602. In short, the data output disable control circuit 462 assuredly disables the outputting of data held in each of the erase units in the memory cell array 221 from the nonvolatile memory block 405 when the power supply is turned ON.

Then, an erase operation, an erase verify operation, a write operation, and a write verify operation are performed successively from the outside to each of the memory cells in the second erase unit 262 in the same manner as in the first embodiment.

In the foregoing operations, if the erase operation is detected first in the operation detecting circuit 131, the normal erase operation to the second erase unit 262 is then verified in the erase result determining circuit 232, the write operation is detected thereafter in the operation detecting circuit 131, and the normal operation to the second erase unit 262 is verified subsequently by the write result determining circuit 233, the operational procedure detecting circuit 234 sets the one of the signals composing the operational procedure detect signal 825 which corresponds to the second erase unit 262 to "1" so that the second register in the operational procedure detecting register unit 242 is brought into the set state.

If the operation detecting circuit 131 detects any operation other than the erase operation and the write operation is detected in the respective procedural steps in which the erase operation and the write operation should be detected or if the erase result determining circuit 232 and the write result determining circuit 233 do not verify the normal erase operation and the normal write operation, respectively, the operational procedure detecting circuit 234 sets the one of the signals composing the operational procedure detect signal 825 which corresponds to the second erase unit 262 to "0" so that the second register in the operational procedure detecting register unit 242 remains in the reset state and the read disable removing circuit 243 sets the one of the signals composing the read disable remove signal 826 which corresponds to the second erase unit 262 to "0". Consequently, the data output disable control circuit 462 performs a control operation such that the sense amplifier signal 831 inputted from the second erase unit 262 in the memory cell array 221 is not outputted as the data signal 813 and, even if an instruction to perform a read operation is inputted from the outside, the data held in the second erase unit 262 is not read from the nonvolatile memory block 405.

Thus, the second register in the operational procedure detecting register unit 242 is brought into the set state and the one of the signals composing the read disable remove signal which corresponds to the second erase unit 262 is set to "1" only when the erase operation, the verification of a normal erase operation, the write operation, and the verification of a normal write operation have been performed in succession to each of the memory cells in the second erase unit 262. As a result, the setting of read disable to the second erase unit 262 is removed in the data output disable control circuit 462 and the reading of data held in the second erase unit 262 to the outside is enabled.

Thereafter, a read operation to the second erase unit 262 can be performed until the power supply is turned OFF. When the power supply is turned ON next time, each of the registers in the operational procedure detecting register unit 242 is brought into the reset state again so that the data output disable control circuit 462 disables the outputting of the data signal 813. As a result, the security of data held in each of the erase units in the memory cell array 221 is brought into a protected state.

It is also possible to enable, when the verification of a normal erase operation and the verification of a normal write operation have been performed successively to one of the erase units as in the first variation of the first embodiment shown in FIG. 3(*b*), the reading of the data stored in the erase unit to the outside by changing the setting of the operational procedure detecting circuit 234. It will easily be appreciated that, when the detection of a preprogram operation, the detection of an erase operation, the verification of a normal erase operation, a write operation, and the verification of a normal write operation have been performed successively to one of the erase units as in the second variation of the first embodiment shown in FIG. 4(*a*) or when the detection of an erase operation, the verification of a normal erase operation, a write operation, the verification of a normal write operation, and the detection of a reverse operation have been performed successively to one of the erase units as in the third variation of the first embodiment shown in FIG. 4(*b*), the reading of the data stored in the erase unit may also be enabled.

It is also possible to implement the operational procedure limited to the method which repeatedly performs write operations and write verify operations to each specified number of memory cells starting from the leading address in succession and the operational procedure which prevents each of the memory cells in each of the erase units from being brought into the same state, in the same manner as in the first embodiment.

Thus, the sixth embodiment not only achieves the same effect as achieved by the second embodiment but also prevents the data held in the memory cell array 221 from being outputted to the outside of the nonvolatile memory block 405. This prevents improper use of the data through the action of, e.g., analyzing the data signal 813 on the control bus 610 and allows more reliable security protection.

Embodiment 7

A seventh embodiment of the present invention will be described herein below with reference to the drawings. The description of components having the same functional configurations as in the first embodiment will be omitted by retaining the same reference numerals.

Figure 11:
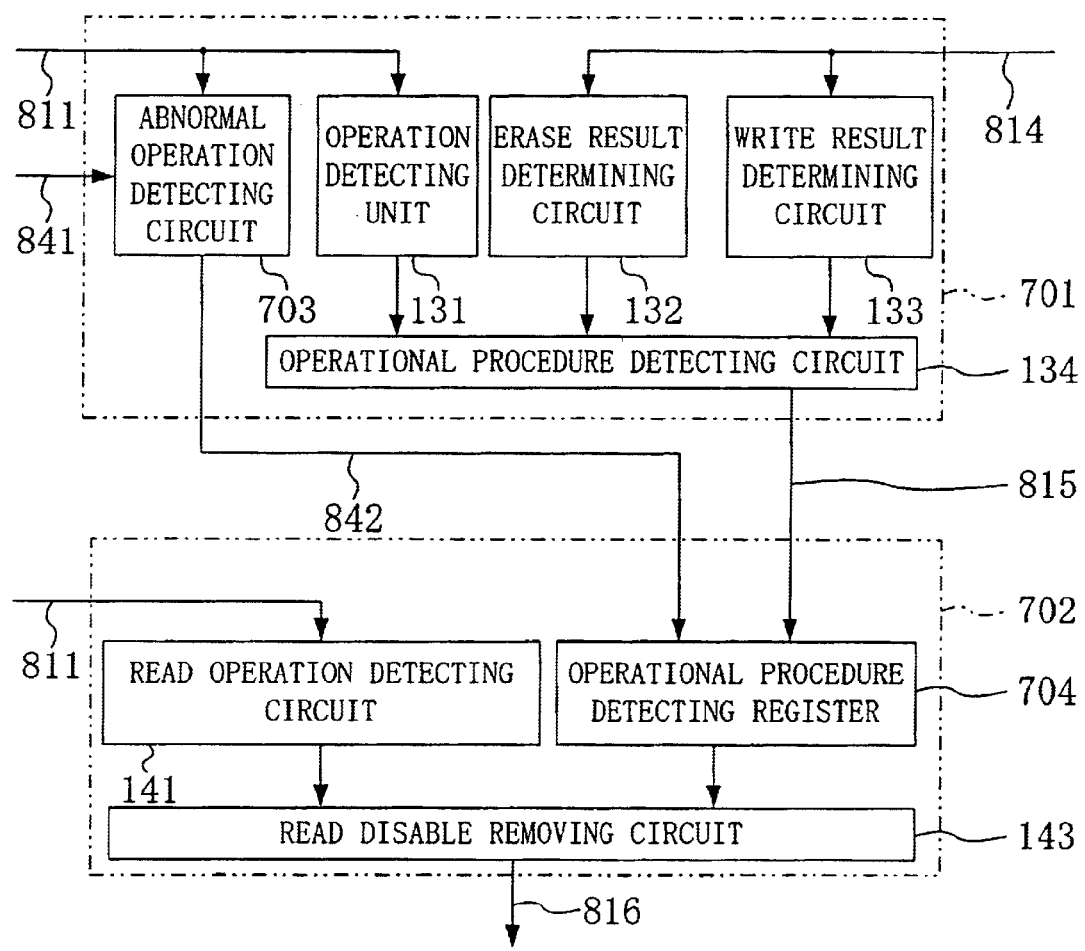
FIG. 11 is a functional block diagram showing a rewrite operation detecting unit and a read disable removal controller in a semiconductor device according to a seventh embodiment of the present invention.

The semiconductor device according to the seventh embodiment has a structure equal to that of the semiconductor device 101 according to the first embodiment shown in FIG. 1 and comprises: the CPU 102; the RAM 103; the control circuit 104; and the nonvolatile memory block 105. The nonvolatile memory block 105 is connected to the control signal input terminal 801 and to the address input terminal 802 via the rewrite control circuit 106, while it is connected to the data I/O terminal 803 via the external I/O controller 107. To disable the reading of data held in the nonvolatile memory block 105 to the outside, a write operation detecting unit 701 and a read disable removal controller 702 shown in FIG. 11 are provided in place of the write operation detecting unit 108 and the read disable removal controller 109 according to the first embodiment.

The nonvolatile memory block 105 according to the present embodiment is constituted by the memory cell array 121, the I/O controller 122, the sense amplifier 123, and the decoder 124, similarly to the nonvolatile memory block 105 shown in FIG. 1. The external I/O controller 107 comprises the output disable control circuit 151 and the input control circuit 152, similarly to the external I/O controller 107 according to the first embodiment shown in FIG. 2(*b*).

The semiconductor device according to the present embodiment is different from the first embodiment in that, if the rewrite operation detecting unit 701 detects an abnormal operation to the memory cell array 121, the read disable removal controller 702 does not enable the reading of data held in the memory cell array 121.

Referring to the drawings, a description will be given herein below to the rewrite operation detecting unit 701 and the read disable removal controller 702 in the semiconductor device according to the present embodiment.

FIG. 11 shows respective functional configurations of the rewrite operation detecting unit 701 and the read disable removal controller 702 in the semiconductor device according to the seventh embodiment.

As shown in FIG. 11, the rewrite operation detecting unit 701 according to the present embodiment has the operation detecting circuit 131, the erase result determining circuit 132, the write result determining circuit 133, and the operational procedure detecting circuit 134, similarly and equally to the rewrite operation detecting unit 108 according to the first embodiment. In addition, the rewrite operation detecting unit 701 also has an abnormal operation detecting circuit 703 for detecting an abnormal operation to the memory cell array 121.

On the other hand, the read disable removal controller 702 is constituted by the read operation detecting circuit 141, an operational procedure detecting register 704, and the read disable removing circuit 143.

The abnormal operation detecting circuit 703 sets an abnormal operation detect signal 842 to "1" based on the control signal 811 inputted from the rewrite control circuit 106 and an operating voltage 841 inputted from the nonvolatile memory block 105 if a voltage different from the voltage used for the operation indicated by the control signal 811 is inputted as the operating voltage 841. Otherwise, the abnormal operation detecting circuit 703 sets the abnormal operation detect signal 842 to "0". The abnormal operation detecting circuit 703 also sets the abnormal operation detect signal 842 to "1" if it detects the control signal 811 indicative of an operation not included in the operational procedure defined by the operational procedure detecting circuit 134.

As the operating voltage 841, the power supply voltage and the gate voltage applied to the memory cell array 121 are inputted. It is also possible to detect an abnormal operation by inputting a source voltage, a drain voltage, and the like.

The abnormal operation detecting circuit 703 may be constituted appropriately to detect, as an abnormal operation, an operation different from a normal operational condition or an operation not included in the operational procedure defined by the operational procedure detecting circuit 134 and set the abnormal operation detect signal 842 to "1" when it detects an abnormal operation. The detection of an abnormal operation is not limited to a method based on the operating voltage 841. It is also possible to use a method in which, e.g., a temperature detector is provided to detect an operation at an abnormal temperature, a method in which an optical detector is provided to detect the opening of a package, or the like.

The operational procedure detecting register 704 is brought into a set state or a reset state by a combination of the operational procedure detect signal 815 inputted from the operational procedure detecting circuit 134 and the abnormal operation detect signal 842 inputted from the abnormal operation detecting circuit 703. Specifically, the operational procedure detecting register 704 is brought into the set state only when the operational procedure detect signal 831 outputted from the operational procedure detecting circuit 134 is set to "1" and the abnormal operation detect signal 842 is set to "0". Otherwise, the operational procedure detecting register 704 is in the reset state.

The semiconductor device according to the present embodiment enables operations such as a write operation, a write verify operation, an erase operation, an erase verify operation, and a read operation to be performed from the outside to the nonvolatile memory block 105 in the same manner as in the first embodiment.

A description will be given next to a method for reading data held in the memory cell array 121 to the outside with reference to the drawings.

An operational procedure for removing the disabling of a read operation to the outside of the semiconductor device according to the seventh embodiment is the same as the operational procedure according to the first embodiment shown in FIG. 3(*a*) except that, if the abnormal operation detecting circuit 703 detects an abnormal operation, the reading of data to the outside is disabled. Referring to FIG. 3(*a*), the method of a read operation to the memory cell array 121 according to the present embodiment will be described herein below.

First, a power supply for the semiconductor device is turned ON. At this time, the operational procedure detecting register 704 is in the reset state so that the read disable removing circuit 143 outputs "0" as the read disable remove signal 816. Accordingly, the output disable control circuit 151 disables the outputting of the data signal 813 so that the data signal 813 inputted from the I/O controller 122 is not outputted to the outside of the semiconductor device and therefore the security of the data held in the memory cell array 121 is in the protected state.

Then, an erase operation, an erase verify operation, a write operation, and a write verify operation are performed successively from the outside in the same manner as in the first embodiment.

In the foregoing operations, if the erase operation is detected first by the operation detecting circuit 131, a normal erase operation is then detected by the erase result determining circuit 132, the write operation is detected thereafter by the operation detecting circuit 131, and a normal operation is detected subsequently by the write result determining circuit 133, the operational procedure detecting circuit 134 sets the operational procedure detect signal 815 to "1".

If another operation is detected by the operation detecting circuit 131 or if the normal erase operation and the write operation are not verified by the erase result determining circuit 132 and by the write result determining circuit 133, respectively, the operational procedure detecting circuit 134 sets the operational procedure detect signal 815 to "0" so that the operational procedure detecting register 704 remains in the reset state and the read disable removing circuit 143 sets the read disable remove signal to "0". Consequently, the output disable control circuit 151 performs a control operation such that the data signal 813 inputted from the I/O controller 122 is not outputted to the outside of the semiconductor device and, even if an instruction to perform a read operation is inputted from the outside, the data held in the memory cell array 121 is not outputted to the outside of the semiconductor device.

If an abnormal operation is detected by the abnormal operation detecting circuit 703, the abnormal operation detect signal 842 is set to "1" to bring the operational procedure detecting register 704 into the reset state and the read disable removing circuit 143 sets the read disable remove signal to "0". As a result, even when the operational procedure detecting circuit 134 detects the operational procedure defined as described above, the reading of the data held in the memory cell array 121 to the outside is disabled if the operational procedure is performed by operations using an abnormal voltage.

Thus, the operational procedure detecting register 704 is brought into the set state and the read disable remove signal 816 is set to "1" only when the erase operation, the verification of a normal erase operation, a write operation, and the verification of a normal write operation are performed successively by using a normal voltage to each of the memory cells in the memory cell array 121 so that the read disabled state in the output disable control circuit 151 is removed and the reading of the data held in the memory cell array 121 to the outside is enabled.

It is also possible to define that the verification of a normal erase operation and the verification of a normal write operation are performed successively by changing the setting of the operational procedure detecting circuit 134 in the same manner as in the first variation of the first embodiment shown in FIG. 3(*b*). It is obviously possible to define that the detection of a preprogram operation, the detection of an erase operation, the verification of a normal erase operation, a write operation, and the verification of a normal write operation are performed in the same manner as in the second variation of the first embodiment shown in FIG. 4(*a*). It is also possible to define that the detection of an erase operation, the verification of a normal erase operation, a write operation, the verification of a normal write operation, and the detection of a reverse operation are performed successively as in the second variation of the first embodiment shown in FIG. 4(*b*). In spite of these definitions, a reading operation to the outside is enabled only when the operations of the specified operational procedure are performed in succession and these operations are performed by using a normal voltage.

It is also possible to perform the operational procedure limited to the method which repeatedly performs write operations and write verify operations to each specified number of memory cells starting from the leading address in succession and the operational procedure which prevents each of the memory cells from being brought into the same state, in the same manner as in the first embodiment.

Thus, the seventh embodiment not only enables security protection, similarly to the first embodiment, but also brings the operational procedure detecting register 704 into the reset state if the normal operation detecting circuit 703 detects an abnormal operation to the memory cell array 121. This reliably prevents an operation using false determination of a read operation caused by, e.g., an abnormal gate voltage and allows more reliable security protection.

Although the present embodiment has described the semiconductor device obtained by applying the abnormal operation detecting circuit 703 to the rewrite operation detecting unit 108 according to the first embodiment, the same effect is achievable if the abnormal operation detecting circuit 703 according to the present embodiment is applied to the rewrite operation detecting unit 108 according to each of the third and fifth embodiments.

Embodiment 8

An eighth embodiment of the present invention will be described herein below with reference to the drawings. The description of components having the same functional configurations as in the first embodiment will be omitted by retaining the same reference numerals.

Figure 12:
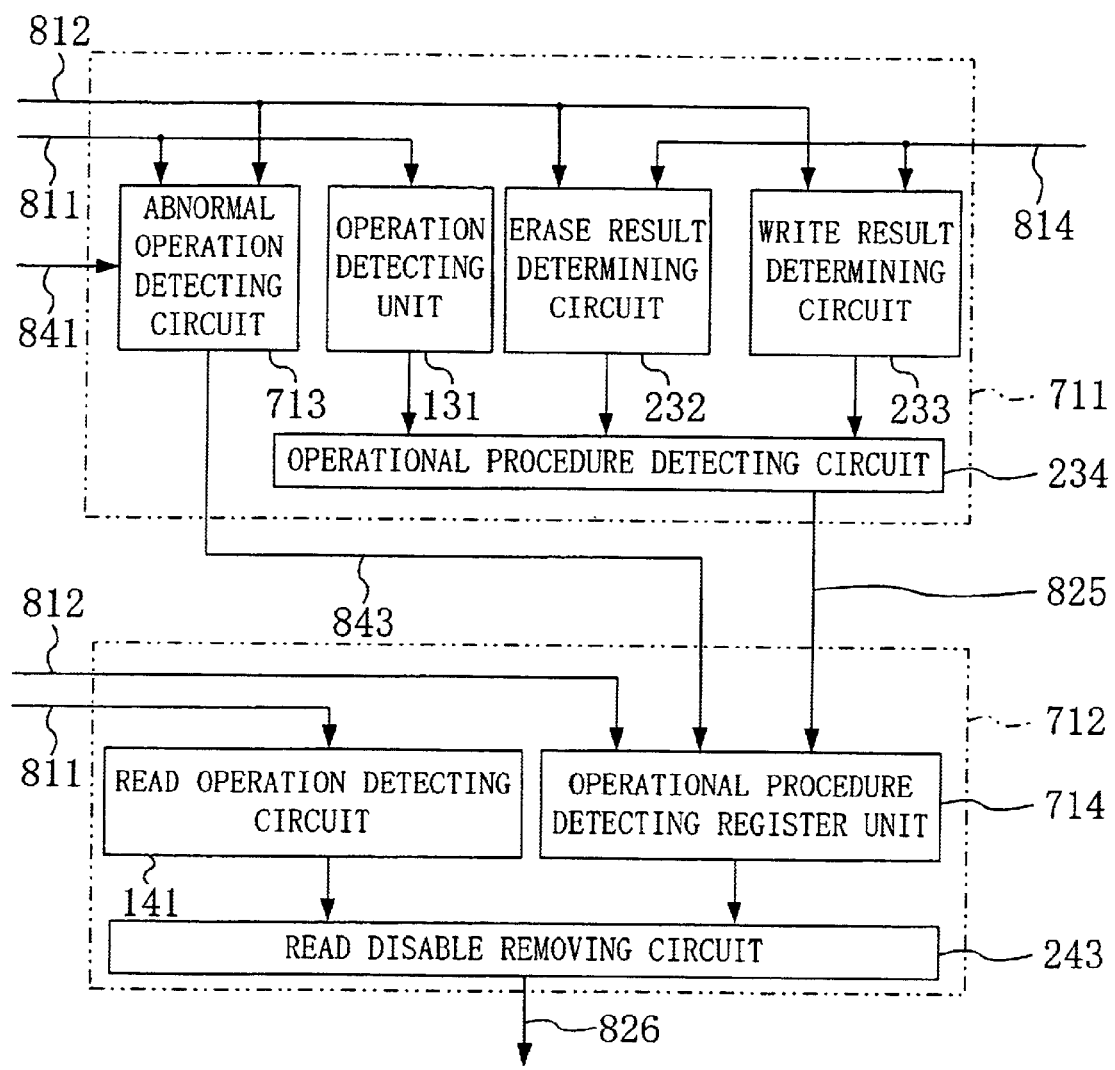
FIG. 12 is a functional block diagram showing a rewrite operation detecting unit and a read disable removal controller in a semiconductor device according to an eighth embodiment of the present invention.

The semiconductor device according to the eighth embodiment has a structure equal to that of the semiconductor device 201 according to the second embodiment shown in FIG. 5 and comprises: the CPU 102; the RAM 103; the control circuit 104; and the nonvolatile memory block 205. The nonvolatile memory block 205 is connected to the control signal input terminal 801 and to the address input terminal 802 via the rewrite control circuit 106, while it is connected to the data I/O terminal 803 via the external I/O controller 207. To disable the reading of data held in the nonvolatile memory block 205 to the outside, a write operation detecting unit 711 and a read disable removal controller 712 shown in FIG. 12 are provided in place of the write operation detecting unit 208 and the read disable removal controller 209 according to the second embodiment.

The nonvolatile memory block 205 according to the present embodiment is constituted by the memory cell array 221, the I/O controller 122, the sense amplifier 123, and the decoder 124, similarly to the nonvolatile memory block 205 shown in FIG. 5. The memory cell array 221 is composed of flash EEPROMs and divided into n (n is an integer of 2 or more) blocks of the first erase unit 261, the second erase unit 262, . . . , and the n-th erase unit 263. The external I/O controller 207 comprises the output disable control circuit 251 and the input control circuit 152, similarly to the external I/O controller 207 according to the second embodiment which is shown in FIG. 6(b).

The semiconductor device according to the present embodiment is different from the second embodiment in that the rewrite operation detecting unit 711 checks each of the erase units in the memory cell array 221 for an abnormal operation and, if it detects an abnormal operation to any of the erase units, the read disable removal controller 712 does not enable the reading of data held in the erase unit.

Referring to the drawings, a description will be given herein below to the rewrite operation detecting unit 711 and the read disable removal controller 712 in the semiconductor device according to the present embodiment.

FIG. 12 shows respective functional configurations of the rewrite operation detecting unit 711 and the read disable removal controller 712 in the semiconductor device according to the eighth embodiment.

As shown in FIG. 12, the rewrite operation detecting unit 711 according to the present embodiment has the operation detecting circuit 131, the erase result determining circuit 232, the write result determining circuit 233, and the operational procedure detecting circuit 234, which are equal to those used in the second embodiment. In addition, the rewrite operation detecting unit 711 also has an abnormal operation detecting circuit 713 for detecting an abnormal operation on a per erase-unit basis.

On the other hand, the read disable removal controller 712 is constituted by the read operation detecting circuit 141, an operational procedure detecting register unit 714, and the read disable removing circuit 243. The operational procedure register unit 714 is provided with n registers consisting of the first register, the second register, . . . , and the n-th register each composed of a nonvolatile memory cell. The n registers correspond to the first erase unit 261, the second erase unit 262, . . . , and the n-th erase unit 263, respectively.

The abnormal operation detecting circuit 713 detects, for each of the erase units, whether or not an abnormal operation has been performed to the memory cell array 221 based on the control signal 811 and the address signal 812 each inputted from the rewrite control circuit 106 and on the operating voltage 841 inputted from the nonvolatile memory block 205 and outputs the result of detection as an abnormal operation detect signal 843. The abnormal operation detect signal 843 is composed of n signals individually corresponding to the first to n-th erase units.

Specifically, the abnormal operation detecting circuit 713 determines, based on the address signal 812, the erase unit to which the operation has been performed, while detecting, based on the control signal 811, the operation performed to the memory cell array 221, and detects the presence or absence of an abnormal operation by determining whether or not the gate voltage and the power supply voltage inputted as the operating voltages 841 are the same as the voltage value set for the operation indicated by the control signal 811. If an abnormal operation is detected, the one of the signals composing the erase operation detect signal 843 which corresponds to the erase unit to which the operation has been performed is set to "1". Otherwise, the one of the signals composing the erase operation detect signal 843 which corresponds to the erase unit is set to "0".

The abnormal operation detecting circuit 713 may be constituted appropriately to detect, as an abnormal operation, an operation different from a normal operational condition or an operation not included in the operational procedure defined by the operational procedure detecting circuit 234 and set the abnormal operation detect signal 843 to "1" when it detects an abnormal operation. The detection of an abnormal operation is not limited to a method based on the operating voltage 841. It is also possible to constitute the abnormal operation detecting circuit 713 such that, e.g., a temperature detector is provided to detect an operation at an abnormal temperature.

Each of the registers in the operational procedure detecting register unit 714 is brought into a set state or a reset state by a combination of the operational procedure detect signal 815 inputted from the operational procedure detecting circuit 234 on a per erase-unit basis and the abnormal operation detect signal 843 inputted from the abnormal operation detecting circuit 713 on a per erase-unit basis. Specifically, the second register in the operational procedure detecting register unit 714 is brought into the set state only when the one of the signals composing the operational procedure detect signal 825 outputted from the operational procedure detecting circuit 234 which corresponds to the second erase unit 262 is set to "1" and the one of the signals composing the abnormal operation detect signal 843 which corresponds to the second erase unit 262 is set to "0". Otherwise, the operational procedure detecting register unit 714 is in the reset state.

The semiconductor device according to the present embodiment enables operations such as a write operation, a write verify operation, an erase operation, an erase verify operation, and a read operation to be performed from the outside to the nonvolatile memory block 205 in the same manner as in the second embodiment.

A description will be given next to a method for reading data held in the memory cell array 221 to the outside with reference to the drawings.

An operational procedure for removing the disabling of a read operation to the outside of the semiconductor device according to the eighth embodiment is the same as the operational procedure according to the second embodiment except that, if the abnormal operation detecting circuit 713 detects an abnormal operation to any of the erase units, the reading of data held in the erase unit to the outside is disabled. Referring to FIG. 3(a), the method of a read operation to the memory cell array 221 according to the present embodiment will be described herein below by using, as an example, a method for a read operation to the second erase unit 262.

First, a power supply for the semiconductor device is turned ON. At this time, each of the registers in the operational procedure detecting register unit 714 is in the reset state so that each of the signals composing the read disable remove signal 826 is set to "0". Accordingly, the output disable control circuit 251 of the external I/O controller 207 disables the outputting of the data signal 813 from each of the erase units. In short, the output disable control circuit 251 assuredly disables the outputting of the data held in each of the erase units in the memory cell array 221 to the outside when the power supply is turned ON.

Then, an erase operation, an erase verify operation, a write operation, and a write verify operation are performed successively from the outside to each of the memory cells in the second erase unit 262 in the same manner as in the second embodiment.

In the foregoing operations, if the erase operation is detected first by the operation detecting circuit 131, a normal erase operation to the second erase unit 262 is then detected by the erase result determining circuit 232, the write operation is detected thereafter by the operation detecting circuit 131, and a normal operation to the second erase unit 262 is detected subsequently by the write result determining circuit 233, the operational procedure detecting circuit 234 sets the one of the signals composing the operational procedure detect signal 825 which corresponds to the second erase unit 262 to "1" to bring the second register in the operational procedure detecting register unit 714 into the set state.

If another operation is detected by the operation detecting circuit 131 or if the normal erase operation and the write operation to the second erase unit 262 are not verified by the erase result determining circuit 232 and by the write result determining circuit 233, respectively, the operational procedure detecting circuit 234 sets the one of the signals composing the operational procedure detect signal 825 which corresponds to the second erase unit 262 to "0" so that the second register in the operational procedure detecting register unit 714 remains in the reset state and the read disable removing circuit 243 sets the one of the signals composing the read disable remove signal which corresponds to the second erase unit 262 to "0". Consequently, the output disable control circuit 251 performs a control operation such that the data signal 813 inputted from the second erase unit 262 in the memory cell array 221 is not outputted and, even if an instruction to perform a read operation is inputted from the outside, the data held in the second erase unit 262 is not outputted to the outside of the semiconductor device.

If an abnormal operation to the second erase unit 262 is detected by the abnormal operation detecting circuit 713, the one of the signals composing the abnormal operation detect signal 843 which corresponds to the second erase unit 262 is set to "1" to bring the second register in the operational procedure detecting register unit 714 into the reset state and the read disable removing circuit 243 sets the one of the signals composing the read disable remove signal 826 which corresponds to the second erase unit 262 to "0". As a result, even when the operational procedure detecting circuit 234 detects, for the second erase unit 262, the operational procedure defined as described above, the reading of the data held in the second erase unit 262 to the outside is disabled if the operational procedure is performed by operations using an abnormal voltage.

Thus, the second register in the operational procedure detecting register unit 714 is brought into the set state and the one of the signals composing the read disable remove signal 826 which corresponds to the second erase unit 262 is set to "1" only when the erase operation, the verification of a normal erase operation, a write operation, and the verification of a normal write operation are performed successively by using a normal voltage to each of the memory cells in the second erase unit 262 so that the read disabled state to the second erase unit 262 in the output disable control circuit 251 is removed and the reading of the data held in the second erase unit 262 to the outside is enabled.

It is also possible to define that the verification of a normal erase operation and the verification of a normal write operation are performed successively by changing the setting of the operational procedure detecting circuit 234 in the same manner as in the first variation of the first embodiment shown in FIG. 3(b). It is obviously possible to define that the detection of a preprogram operation, the detection of an erase operation, the verification of a normal erase operation, a write operation, and the verification of a normal write operation are performed in the same manner as in the second variation of the first embodiment shown in FIG. 4(a). It is also possible to define that the detection of an erase operation, the verification of a normal erase operation, a write operation, the verification of a normal write operation, and the detection of a reverse operation are performed successively as in the second variation of the first embodiment shown in FIG. 4(b). In spite of these definitions, a reading operation to the outside is enabled only when the operations of the specified operational procedure are performed in succession and these operations are performed by using a normal voltage.

It is also possible to perform the operational procedure limited to the method which repeatedly performs write operations and write verify operations to each specified number of memory cells starting from the leading address in succession and the operational procedure which prevents each of the memory cells in the erase unit from being brought into the same state, in the same manner as in the first embodiment.

Thus, the eighth embodiment not only achieves the same effect as achieved by the second embodiment but also brings the corresponding register in the operational procedure detecting register unit 714 into the reset state if the normal operation detecting circuit 713 detects an abnormal operation to the memory cell array 221 on a per erase unit basis. This reliably prevents an operation using false determination of a read operation caused by, e.g., an abnormal gate voltage and allows more reliable security protection.

Although the present embodiment has described the semiconductor device obtained by applying the abnormal operation detecting circuit 713 to the rewrite operation detecting unit 208 according to the second embodiment, the same effect is achievable if the abnormal operation detecting circuit 713 according to the present embodiment is applied to the rewrite operation detecting unit 208 according to each of the fourth and sixth embodiments.

Embodiment 9

A ninth embodiment of the present invention will be described herein below with reference to the drawings. The description of components having the same functional configurations as in the first embodiment will be omitted by retaining the same reference numerals.

The semiconductor device according to the ninth embodiment has a structure equal to that of the semiconductor device 101 according to the first embodiment shown in FIG. 1 and comprises: the CPU 102; the RAM 103; the control circuit 104; and the nonvolatile memory block 105. The nonvolatile memory block 105 is connected to the control signal input terminal 801 and to the address input terminal 802 via the rewrite control circuit 106, while it is connected to the data I/O terminal 803 via the external I/O controller. To disable the reading of data held in the nonvolatile memory block 105 to the outside, the write operation detecting unit 108 and the read disable removal controller 109 are provided.

The nonvolatile memory block 105 according to the present embodiment is constituted by the memory cell array 121, the I/O controller 122, the sense amplifier 123, and the decoder 124, similarly to the nonvolatile memory block 105 according to the first embodiment shown in FIG. 1.

The rewrite operation detecting unit 108 and the read disable removal controller 109 are similarly constituted to the rewrite operation detecting unit and the read disable removal controller according to the first embodiment shown in FIG. 2(a). The rewrite operation detecting unit 108 is constituted by the operation detecting circuit 131, the erase result determining circuit 132, the write result determining circuit 133, and the operational procedure detecting circuit 134. On the other hand, the read disable removal controller 109 is constituted by the read operation detecting circuit 141, the operational procedure detecting register 142, and the read disable removing circuit 143.

The semiconductor device according to the present embodiment is different from the semiconductor device according to the first embodiment in that, if a read operation is disabled by the external I/O controller, data held in the memory cell array 121 is not outputted, while dummy data different from the data held in the memory cell array 121 is outputted.

A description will be given herein below to the external I/O controller of the semiconductor device according to the present embodiment with reference to the drawings.

Figure 13A:
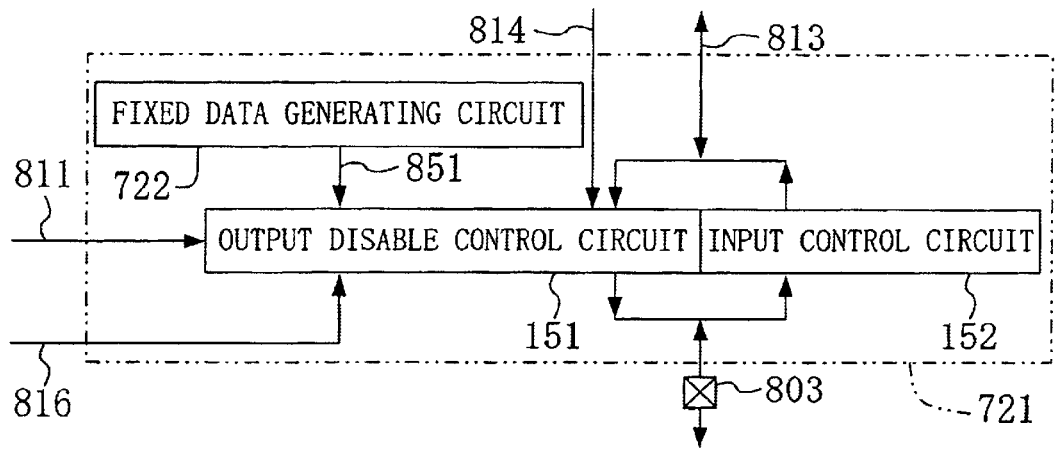
FIG. 13(a) is a functional block diagram showing an external I/O controller in a semiconductor device according to a ninth embodiment of the present invention and FIGS. 13(b) and 13(c) are functional block diagrams showing variations of the external I/O controller in the semiconductor device according to the ninth embodiment.

FIG. 13(a) shows a functional configuration of the external I/O controller of the semiconductor device according to the ninth embodiment.

As shown in FIG. 13(a), an external I/O controller 721 according to the present embodiment has the output disable control circuit 151 and the input control circuit 152 which are equal to those of the first embodiment. In addition, the external I/O controller 721 also has a fixed data generating circuit 722 as a circuit for generating dummy data.

The fixed data generating circuit 722 outputs fixed data 851 as dummy data to the output disable control circuit 151. Since data defined by the fixed data generating circuit 722 is outputted as the fixed data 851, arbitrary data can be set thereto.

The output disable control circuit 151 controls the outputting of the data signal 813 and the verify result signal 814 each inputted from the I/O controller 122 to the outside and the outputting of the fixed data 851 inputted from the fixed data generating circuit 722 to the outside based on the control signal 811 and the read disable remove signal 816. Upon receiving a signal indicative of a read operation as the control signal 811, if the read disable remove signal 816 is set to "1", the output disable control circuit 151 outputs the data signal 813 to the outside via the data I/O terminal 803 and cuts off the fixed data 851. If the read disable remove signal 816 is set to "0", the output disable control circuit 151 cuts off the data signal 813 and outputs the fixed data 851 to the outside via the data I/O terminal 803.

The output disable control circuit 151 outputs the verify result signal 814 to the outside irrespective of the read disable remove signal 816.

A description will be given next to the operation of the semiconductor device according to the present embodiment with reference to FIGS. 1, 2(a), and 13(a).

In the semiconductor device according to the present embodiment, the operational procedure detecting register 142 is in the reset state when the power supply is turned ON in the same manner as in the first embodiment and the variations thereof so that the read disable remove signal 816 is set to "0". Accordingly, the output disable control circuit 151 cuts off the data signal 813 and outputs the fixed data 851 to the outside via the data I/O terminal 803.

Then, the operational procedure detecting register 142 is brought into the set state and the read disable remove signal 816 is set to "1" only when the same operational procedure as performed in the first embodiment shown in FIG. 3(a) is performed as the operational procedure defined by the operational procedure detecting circuit 134 to each of the memory cells in the memory cell array 121 in succession. Consequently, the output disable control circuit 151 cuts off the fixed data 851 and outputs the data signal 813 to the outside via the data I/O terminal 803. If a read operation is performed without performing the defined operational procedure, on the other hand, the output disable control circuit 151 outputs the fixed data 851 outputted from the fixed data generating circuit 722 to the outside.

As the foregoing operational procedure, the same operational procedure as performed in each of the variations of the first embodiment shown in FIGS. 3(b), 4(a), and 4(b) may also be performed by changing the setting of the operational procedure detecting circuit 134.

Thus, according to the ninth embodiment, not only the same security protection as performed in the first embodiment can be performed but also the fixed data 851 is outputted from the fixed data generating circuit 722 to the outside if an outsider tries to improperly read data held in the memory cell array 121 without performing the defined operational procedure. As a result, the outsider who tries to perform an improper read operation is misled to recognize the fixed data 851 as the data held in the memory cell array 121 and find it difficult to distinguish the presence or absence of the security protecting function so that more reliable security protection is performed.

The data generating circuit for outputting the dummy data different from the data held in the memory cell array 121 is not limited to the fixed data generating circuit 722 and can be implemented in different variations. It is particularly preferred to generate data which is complicated and difficult to expect. A description will be given to variations using other circuits as the data generating circuit.

Referring to the drawings, the first variation of the present embodiment will be described herein below.

Figure 13B:
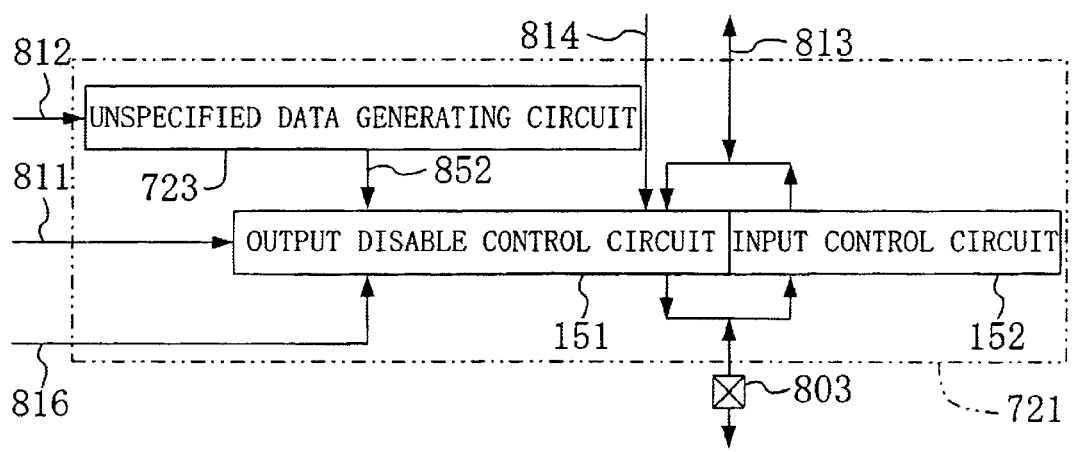
Figure 13C:
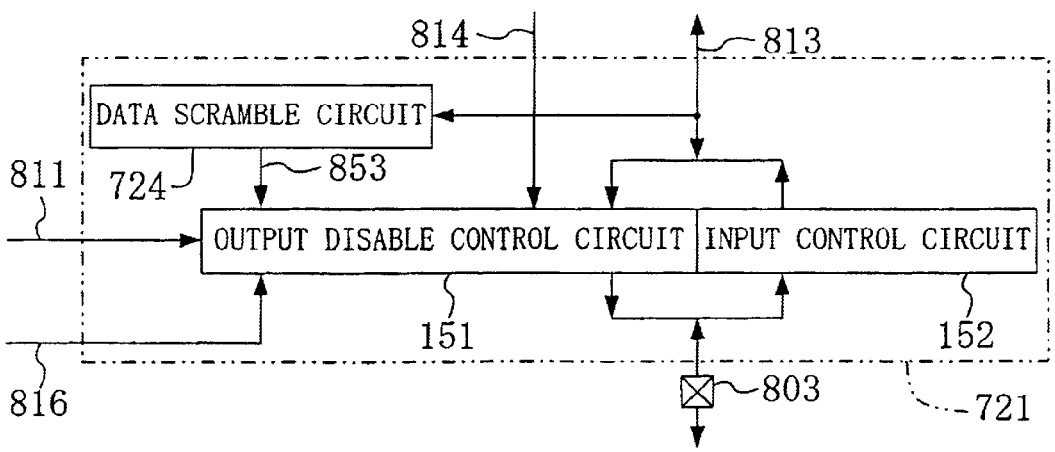

FIG. 13(*b*) shows a functional configuration of the external I/O controller 721 of the semiconductor device according to the first variation of the ninth embodiment.

As shown in FIG. 13(*b*), the external I/O controller 721 according to the first variation of the present embodiment has the output disable control circuit 151 and the input control circuit 152 which are equal to those of the first embodiment. In addition, the external I/O controller 721 also has an unspecified data generating circuit 723 as a circuit for generating dummy data.

The unspecified data generating circuit 723 generates unspecified data 852 by causing a transition in the address signal 812 and outputs the unspecified data 852 to the output disable control circuit 152.

If the read disable remove signal 816 is set to "1", the output disable control circuit 151 outputs the data signal 813 to the outside via the data I/O terminal 803 and cuts off the unspecified data 852 in the same manner as in the ninth embodiment. If the read disable remove signal 816 is set to "0", the output disable control circuit 151 cuts off the data signal 813 and outputs the unspecified data 852 to the outside via the data I/O terminal 803 in the same manner as in the ninth embodiment.

According to the first variation of the present embodiment, if an outsider tries to improperly read data held in the memory cell array 121 without performing the defined operational procedure, the unspecified data 852 outputted from the unspecified data generating circuit 723 is outputted to the outside. This makes it difficult for the outsider who tries to perform an improper read operation to distinguish whether or not the outputted unspecified data 852 is the data held in the memory cell array 121 and perform data analysis.

The second variation of the present embodiment will be described next with reference to the drawings.

FIG. 13(*c*) shows a functional configuration of the external I/O controller 721 of the semiconductor device according to the second variation of the ninth embodiment.

As shown in FIG. 13(*c*), the external I/O controller 721 according to the second variation of the present embodiment has the output disable control circuit 151 and the input control circuit 152 which are equal to those of the first embodiment. In addition, the external I/O controller 721 also has a data scramble circuit 724 as a circuit for generating dummy data.

The data scramble circuit 724 generates scramble data 853 as dummy data by a method of, e.g., rearranging or substituting data inputted as the data signal 813 from the I/O controller 122 and outputs the generated scramble data 853 to the output disable control circuit 151.

If the read disable remove signal 816 is set to "1", the output disable control circuit 151 outputs the data signal 813 to the outside via the data I/O terminal 803 and cuts off the scramble data 853 in the same manner as in the ninth embodiment. If the read disable remove signal 816 is set to "0", the output disable control circuit 151 cuts off the data signal 813 and outputs the scramble data 853 to the outside via the data I/O terminal 803 in the same manner as in the ninth embodiment.

According to the second variation of the present embodiment, if an outsider tries to improperly read data held in the memory cell array 121 without performing the defined operational procedure, the scramble data 853 outputted from the data scramble circuit 724 is outputted to the outside. This makes it difficult for the outsider to distinguish whether or not the outputted scramble data 853 is the data held in the memory cell array 121 and perform data analysis.

Although the ninth embodiment and the variations thereof have described the semiconductor devices each obtained by applying the data generating circuit for outputting the dummy data different from the data held in the memory cell array 121 to the semiconductor device according to the first embodiment, the same effects are achievable if the data generating circuit according to any of the present embodiment and the variations thereof is applied to the semiconductor device according to the seventh embodiment.

Embodiment 10

A tenth embodiment of the present invention will be described herein below with reference to the drawings. The description of components having the same functional configurations as in the second embodiment will be omitted by retaining the same reference numerals.

The semiconductor device according to the tenth embodiment has a structure equal to that of the semiconductor device 201 according to the second embodiment shown in FIG. 5 and comprises: the CPU 102; the RAM 103; the control circuit 104; and the nonvolatile memory block 205. The nonvolatile memory block 205 is connected to the control signal input terminal 801 and to the address input terminal 802 via the rewrite control circuit 106, while it is connected to the data I/O terminal 803 via the external I/O controller. To disable the reading of data held in the nonvolatile memory block 205 to the outside, the write operation detecting unit 208 and the read disable removal controller 209 are provided to be connected to the nonvolatile memory block 205.

The nonvolatile memory block 205 according to the present embodiment is constituted by the memory cell array 221, the I/O controller 122, the sense amplifier 123, and the decoder 124, similarly to the nonvolatile memory block 205 according to the second embodiment shown in FIG. 2. The memory cell array 221 is composed of flash EEPROMs and divided into n (n is an integer of 2 or more) blocks of the first erase unit 261, the second erase unit 262, . . . , and the n-th erase unit 263 such that an erase operation is performed simultaneously on a per erase-unit basis.

The rewrite operation detecting unit 208 and the read disable removal controller 209 are similarly constituted to the rewrite operation detecting unit 208 and the read disable removal controller 209 according to the second embodiment shown in FIG. 6(*a*). The rewrite operation detecting unit 208 is constituted by the operation detecting circuit 131, the erase result determining circuit 232, the write result determining circuit 233, and the operational procedure detecting circuit 234. On the other hand, the read disable removal controller 209 is constituted by the read operation detecting circuit 141, the operational procedure detecting register unit 242, and the read disable removing circuit 243.

The semiconductor device according to the present embodiment is different from the semiconductor device according to the second embodiment in that, if a read operation is disabled by the external I/O controller, data held in the memory cell array 221 is not outputted, while dummy data different from the data held in the memory cell array 221 is outputted.

A description will be given herein below to the external I/O controller of the semiconductor device according to the present embodiment with reference to the drawings.

Figure 14A:
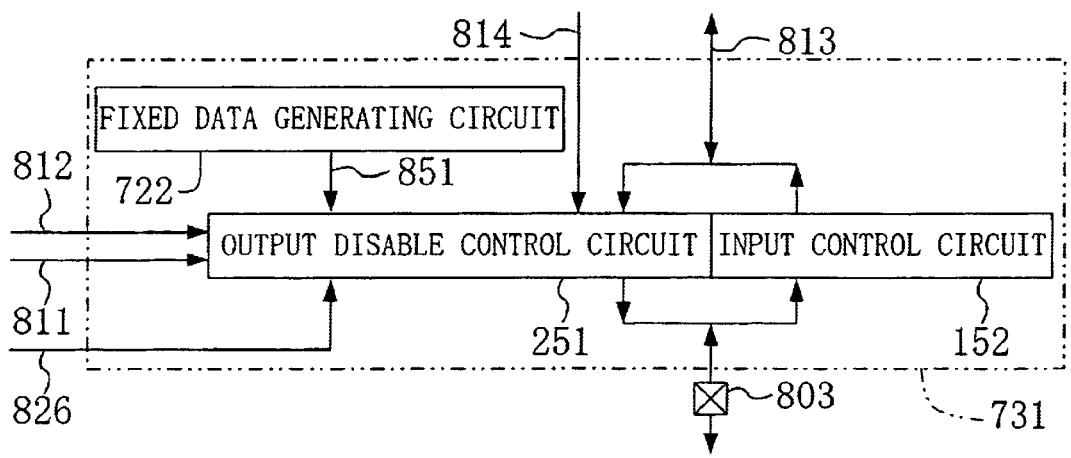
FIG. 14(a) is a functional block diagram showing an external I/O controller in a semiconductor device according to a tenth embodiment of the present invention and FIGS. 14(a) and 14(b) are functional block diagrams showing variations of the external I/O controller in the semiconductor device according to the tenth embodiment.

FIG. 14(a) shows a functional configuration of the external I/O controller of the semiconductor device according to the tenth embodiment.

As shown in FIG. 14(a), an external I/O controller 731 according to the present embodiment has the output disable control circuit 251 and the input control circuit 152 which are equal to those of the second embodiment. In addition, the external I/O controller 731 also has the fixed data generating circuit 722 as a circuit for generating dummy data.

The fixed data generating circuit 722 outputs the fixed data 851 as dummy data to the output disable control circuit 251 in the same manner as in the ninth embodiment.

The output disable control circuit 251 controls the outputting of the data signal 813 and the verify result signal 814 each inputted from the I/O controller 122 to the outside and the outputting of the fixed data 851 inputted from the fixed data generating circuit 722 to the outside based on the control signal 811 and the read disable remove signal 826. Upon receiving a signal indicative of a read operation as the control signal 811, the output disable control circuit 251 determines an erase unit to which the read operation is to be performed based on the address signal 812. If the read disable remove signal 826 is set to "1", the output disable control circuit 251 outputs the data signal 813 to the outside via the data I/O terminal 803 and cuts off the fixed data 851. If the read disable remove signal 816 to the erase unit to which the read operation is to be performed is set to "0", the output disable control circuit 251 cuts off the data signal 813 and outputs the fixed data 851 to the outside via the data I/O terminal 803.

The output disable control circuit 251 outputs the verify result signal 814 to the outside via the data I/O terminal 803 irrespective of the read disable remove signal 826.

A description will be given next to the operation of the semiconductor device according to the present embodiment with reference to FIGS. 5, 6(a), and 14(a).

In the semiconductor device according to the present embodiment, each of the registers in the operational procedure detecting register unit 242 is in the reset state when the power supply is turned ON in the same manner as in the second embodiment and the variations thereof so that the read disable remove signal 826 is set to "0" with respect to each of the erase units. Accordingly, the output disable control circuit 151 cuts off the data signal 813 outputted from each of the erase units and outputs the fixed data 851 to the outside via the data I/O terminal 803.

Then, the one of the registers in the operational procedure detecting register unit 242 which corresponds to one of the erase units is brought into the set state and the one of the signals composing the read disable remove signal 826 which corresponds to the erase unit is set to "1" only when the same operational procedure as performed in the first embodiment shown in FIG. 3(a) is performed as the operational procedure defined by the operational procedure detecting circuit 234 to each of the memory cells composing the erase unit in succession. Consequently, the output disable control circuit 251 cuts off the fixed data 851 and outputs the data signal 813 to the outside via the data I/O terminal 803 in a read operation to the erase unit. If the read operation is performed without performing the defined operational procedure to each of the memory cells in one of the erase units, on the other hand, the output disable control circuit 251 outputs the fixed data 851 outputted from the fixed data generating circuit 722 to the outside in a read operation to the erase unit.

As the foregoing operational procedure, the same operational procedure as performed in each of the variations of the first embodiment shown in FIGS. 3(b), 4(a), and 4(b) may also be performed by changing the setting of the operational procedure detecting circuit 234.

Thus, according to the tenth embodiment, not only the same effect as achieved by the second embodiment is achievable but also the fixed data 851 is outputted from the fixed data generating circuit 722 to the outside if an outsider tries to improperly read data held in the memory cell array 221 without performing the defined operational procedure. As a result, the outsider who tries to perform an improper read operation is misled to recognize the fixed data 851 as the data held in the memory cell array 221 and find it difficult to distinguish the presence or absence of the security protecting function so that more reliable security protection is performed.

The circuit for generating the dummy data different from the data held in the memory cell array 221 is not limited to the fixed data generating circuit 722 and can be implemented in different variations. It is particularly preferred to generate data which is complicated and difficult to expect. A description will be given to variations using other circuits as the data generating circuit.

Referring to the drawings, the first variation of the present embodiment will be described herein below.

Figure 14B:
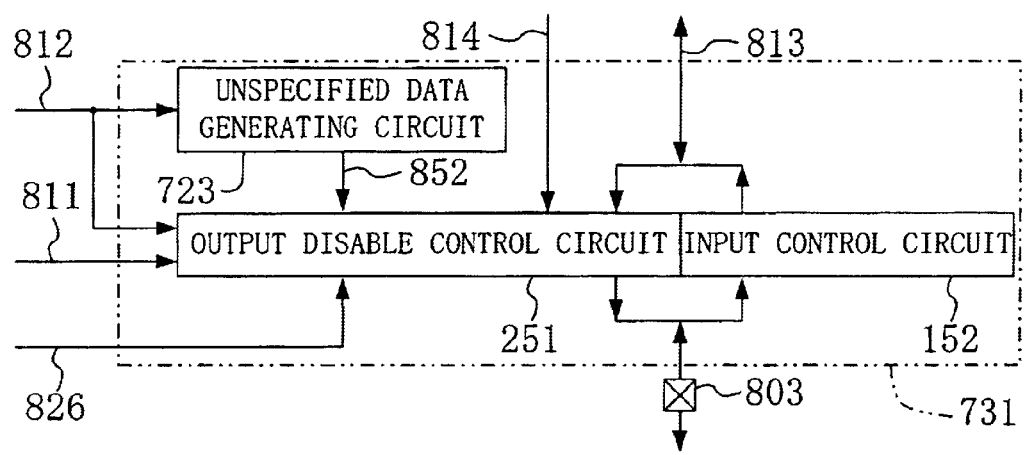

FIG. 14(b) shows a functional configuration of the external I/O controller 731 of the semiconductor device according to the first variation of the tenth embodiment.

As shown in FIG. 14(b), the external I/O controller 731 according to the first variation of the present embodiment has the output disable control circuit 251 and the input control circuit 152 which are equal to those of the first embodiment. In addition, the external I/O controller 731 also has the unspecified data generating circuit 723 as a circuit for generating dummy data.

The unspecified data generating circuit 723 generates the unspecified data 852 based on the address signal 812 and outputs the unspecified data 852 to the output disable control circuit 252.

If the read disable remove signal 826 to the erase unit indicated by the address signal is set to "1", the output disable control circuit 251 outputs the data signal 813 to the outside via the data I/O terminal 803 and cuts off the unspecified data 852 in the same manner as in the tenth embodiment. If the read disable remove signal 816 to the erase unit indicated by the address signal is set to "0", the output disable control circuit 251 cuts off the data signal 813 and outputs the unspecified data 852 to the outside via the data I/O terminal 803 in the same manner as in the tenth embodiment.

According to the first variation of the present embodiment, if an outsider tries to improperly read the data held in the memory cell array 221 without performing the defined operational procedure, the unspecified data 852 outputted from the unspecified data generating circuit 723 is outputted to the outside. This makes it difficult for the outsider who tries to perform an improper read operation to distinguish whether or not the outputted unspecified data 852 is the data held in the memory cell array 221 and perform data analysis.

The second variation of the present embodiment will be described next with reference to the drawings.

Figure 14C:
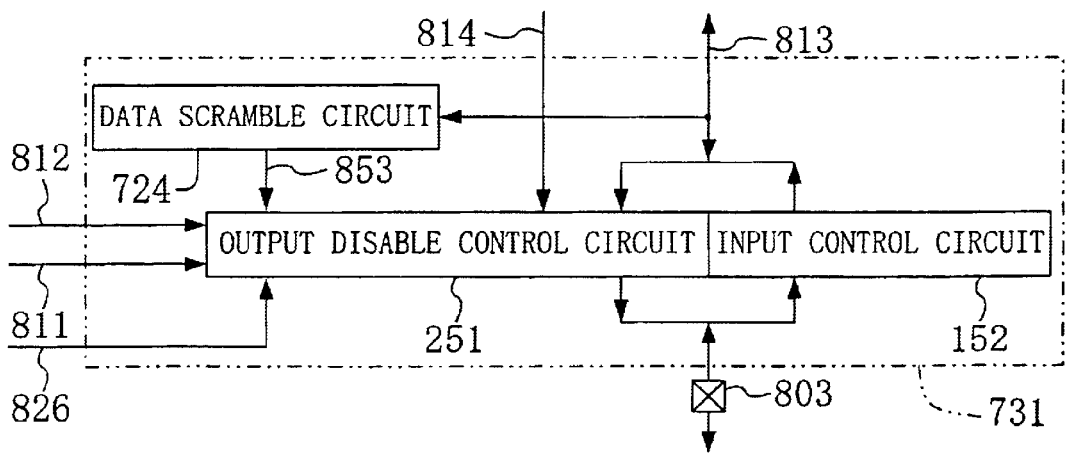

FIG. 14(c) shows a functional configuration of the external I/O controller 731 of the semiconductor device according to the second variation of the tenth embodiment.

As shown in FIG. 14(c), the external I/O controller 731 according to the second variation of the present embodiment has the output disable control circuit 251 and the input control circuit 152 which are equal to those of the first embodiment. In addition, the external I/O controller 731 also has a data scramble circuit 724 as a circuit for generating dummy data.

The data scramble circuit 724 generates scramble data 853 as dummy data by a method of, e.g., rearranging or substituting data inputted as the data signal 813 from the I/O controller 122 and outputs the generated scramble data 853 to the output disable control circuit 251.

If the read disable remove signal 826 to the erase unit indicated by the address signal 812 is set to "1", the output disable control circuit 251 outputs the data signal 813 to the outside via the data I/O terminal 803 and cuts off the scramble data 853 in the same manner as in the tenth embodiment. If the read disable remove signal 826 to the erase unit indicated by the address signal 812 is set to "0", the output disable control circuit 251 cuts off the data signal 813 and outputs the scramble data 853 to the outside via the data I/O terminal 803 in the same manner as in the tenth embodiment.

According to the second variation of the present embodiment, if an outsider tries to improperly read data held in the memory cell array 221 without performing the defined operational procedure, the scramble data 853 outputted from the data scramble circuit 724 is outputted to the outside. This makes it difficult for the outsider to distinguish whether or not the outputted scramble data 853 is the data held in the memory cell array 221 and perform data analysis.

Although the tenth embodiment and the variations thereof have described the semiconductor devices each obtained by applying the data generating circuit for outputting the dummy data different from the data held in the memory cell array 221 to the semiconductor device according to the second embodiment, the same effects are achievable if the data generating circuit according to any of the present embodiment and the variations thereof is applied to the semiconductor device according to the eighth embodiment.

Embodiment 11

An eleventh embodiment of the present invention will be described herein below with reference to the drawings. The description of components having the same functional configurations as in the third embodiment will be omitted by retaining the same reference numerals.

The semiconductor device according to the ninth embodiment has a structure equal to that of the semiconductor device 301 according to the third embodiment shown in FIG. 7(*a*) and comprises: the CPU 102; the RAM 103; the control circuit 104; and the nonvolatile memory block 305. The nonvolatile memory block 305 is connected to the control signal input terminal 801 and to the address input terminal 802 via the rewrite control circuit 106, while it is connected to the data I/O terminal 803 via the external I/O controller 307. To disable the reading of data held in the nonvolatile memory block 305 to the outside, the write operation detecting unit 108 and the read disable removal controller 109 are provided.

The nonvolatile memory block 305 according to the present embodiment is constituted by the memory cell array 121, the I/O controller, the sense amplifier 123, and the decoder 124, similarly to the nonvolatile memory block 305 according to the third embodiment shown in FIG. 7(*a*).

The rewrite operation detecting unit 108 and the read disable removal controller 109 are similarly constituted to the rewrite operation detecting unit and the read disable removal controller according to the first embodiment shown in FIG. 2(*a*). The rewrite operation detecting unit 108 is constituted by the operation detecting circuit 131, the erase result determining circuit 132, the write result determining circuit 133, and the operational procedure detecting circuit 134. On the other hand, the read disable removal controller 109 is constituted by the read operation detecting circuit 141, the operational procedure detecting register 142, and the read disable removing circuit 143.

The semiconductor device according to the present embodiment is different from the semiconductor device according to the third embodiment in that, if a read operation is disabled by the external I/O controller, data held in the memory cell array 121 is not outputted, while dummy data different from the data held in the memory cell array 121 is outputted.

A description will be given herein below to the external I/O controller of the semiconductor device according to the present embodiment with reference to the drawings.

Figure 15A:
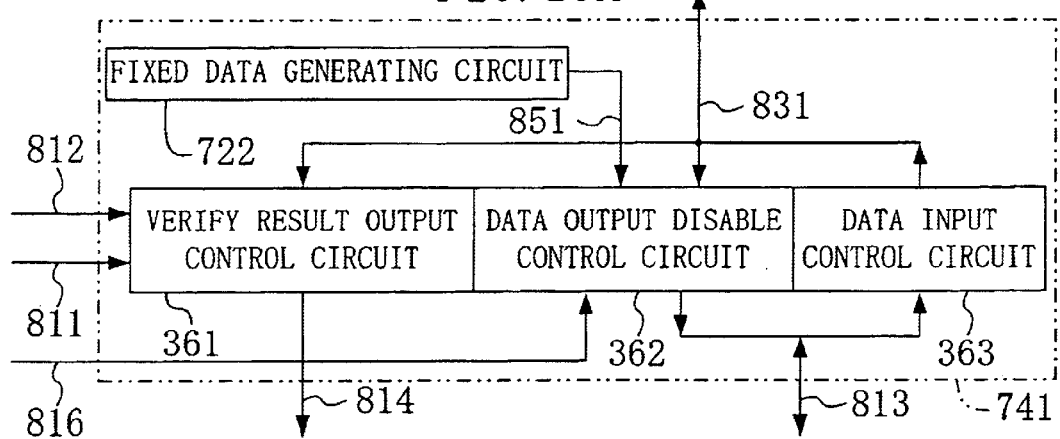
FIG. 15(a) is a functional block diagram showing an I/O controller in a semiconductor device according to an eleventh embodiment of the present invention and FIGS. 15(b) and 15(c) are functional block diagrams showing variations of the I/O controller in the semiconductor device according to the eleventh embodiment.

FIG. 15(*a*) shows a functional configuration of the external I/O controller of the semiconductor device according to the eleventh embodiment.

As shown in FIG. 15(*a*), an external I/O controller 741 according to the present embodiment has the verify result output control circuit 361, the data output disable control circuit 362, and the data input control circuit 363 which are equal to those of the third embodiment. In addition, the external I/O controller 741 also has a fixed data generating circuit 722 as a circuit for generating dummy data.

The fixed data generating circuit 722 outputs the fixed data 851 as dummy data to the output disable control circuit 362. Since data defined by the fixed data generating circuit 722 is outputted as the fixed data 851, arbitrary data can be set thereto.

The data output disable control circuit 362 controls the outputting of the sense amplifier signal 831 inputted from the memory cell array 121 and the outputting of the fixed data 851 inputted from the fixed data generating circuit 722 to the outside based on the control signal 811 and the read disable remove signal 816. Upon receiving a signal indicative of a read operation as the control signal 811, if the read disable remove signal 816 is set to "1", the data output disable control circuit 362 outputs the sense amplifier signal 831 as the data signal 813 to the external I/O controller 307 and cuts off the fixed data 851. If the read disable remove signal 816 is set to "0", the data output disable control circuit 362 cuts off the sense amplifier signal 831 and outputs the fixed data 851 as the data signal 831 to the external I/O controller 307.

A description will be given next to the operation of the semiconductor device according to the present embodiment with reference to FIGS. 7(*a*) and 15(*a*).

In the semiconductor device according to the present embodiment, the operational procedure detecting register 142 is in the reset state when the power supply is turned ON in the same manner as in the first embodiment and the variations thereof so that the read disable remove signal 816 is set to "0". Accordingly, the data output disable control circuit 362 cuts off the sense amplifier signal 831 and outputs the fixed data 851 as the data signal 813 to the external I/O controller 307.

Then, the operational procedure detecting register 142 is brought into the set state and the read disable remove signal 816 is set to "1" only when the same operational procedure as performed in the first embodiment shown in FIG. 3(*a*) is performed as the operational procedure defined by the operational procedure detecting circuit 134 to each of the memory cells in the memory cell array 121 in succession. Consequently, the data output disable control circuit 362 outputs the sense amplifier signal 831 as the data signal 813 to the external I/O controller 307. If a read operation is performed without performing the defined operational procedure, on the other hand, the data output disable control circuit 362 outputs the fixed data 851 outputted from the fixed data generating circuit 722 as the data signal 813 to the external I/O controller 307. The external I/O controller 307 outputs the inputted data signal 813 to the outside via the data I/O terminal 803.

As the foregoing operational procedure, the same operational procedure as performed in each of the variations of the first embodiment shown in FIGS. 3(b), 4(a), and 4(b) may also be performed by changing the setting of the operational procedure detecting circuit 134.

Thus, according to the eleventh embodiment, not only the same effect as achieved by the third embodiment is achievable but also the fixed data 851 is outputted from the fixed data generating circuit 722 to the outside if an outsider tries to improperly read data held in the memory cell array 121 without performing the defined operational procedure. As a result, the outsider who tries to perform an improper read operation is misled to recognize the fixed data 851 as the data held in the memory cell array 121 and find it difficult to distinguish the presence or absence of the security protecting function so that more reliable security protection is performed.

The data generating circuit for outputting the dummy data is not limited to the fixed data generating circuit 722 and can be implemented in different variations. It is particularly preferred to generate data which is complicated and difficult to expect. A description will be given to variations using other circuits as the data generating circuit.

Referring to the drawings, the first variation of the present embodiment will be described herein below.

Figure 15B:
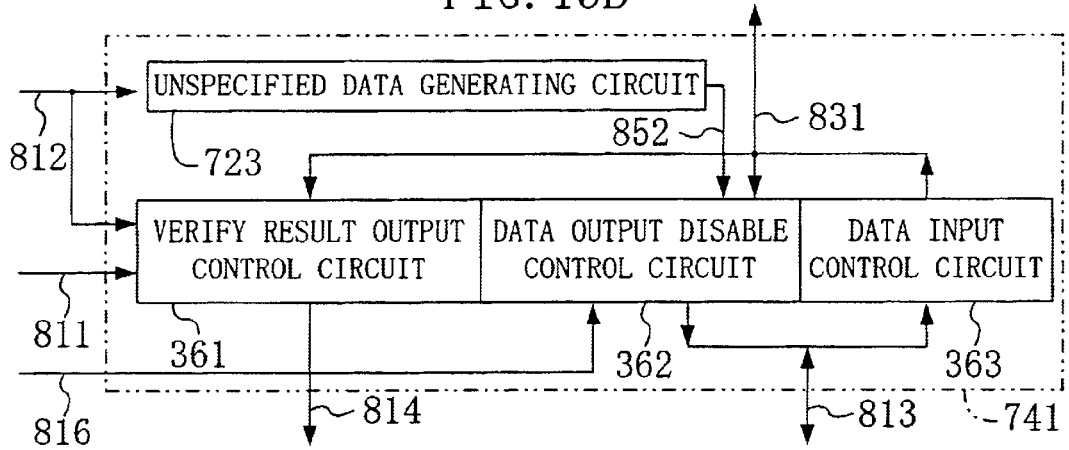

FIG. 15(b) shows a functional configuration of the I/O controller 741 of the semiconductor device according to the first variation of the eleventh embodiment.

As shown in FIG. 15(b), the I/O controller 741 according to the first variation of the present embodiment has the verify result output control circuit 361, the data output disable control circuit 362, and the data input control circuit 363 which are equal to those of the third embodiment. In addition, the I/O controller 741 also has the unspecified data generating circuit 723 as a circuit for generating dummy data.

The unspecified data generating circuit 723 generates the unspecified data 852 based on the address signal 812 and outputs the unspecified data 852 to the data output disable control circuit 362.

If the read disable remove signal 816 is set to "1", the data output disable control circuit 362 outputs the sense amplifier signal 831 as the data signal 813 to the external I/O controller 307 and cuts off the unspecified data 852 in the same manner as in the eleventh embodiment. If the read disable remove signal 816 is set to "0", the data output disable control circuit 362 cuts off the sense amplifier signal 831 and outputs the unspecified data 852 as the data signal 813 to the external I/O controller 307 in the same manner as in the eleventh embodiment.

According to the first variation of the present embodiment, if an outsider tries to improperly read data held in the memory cell array 121 without performing the defined operational procedure, the unspecified data 852 outputted from the unspecified data generating circuit 723 is outputted to the outside. This makes it difficult for the outsider who tries to perform an improper read operation to distinguish whether or not the outputted unspecified data 852 is the data held in the memory cell array 121 and perform data analysis.

The second variation of the present embodiment will be described next with reference to the drawings.

Figure 15C:
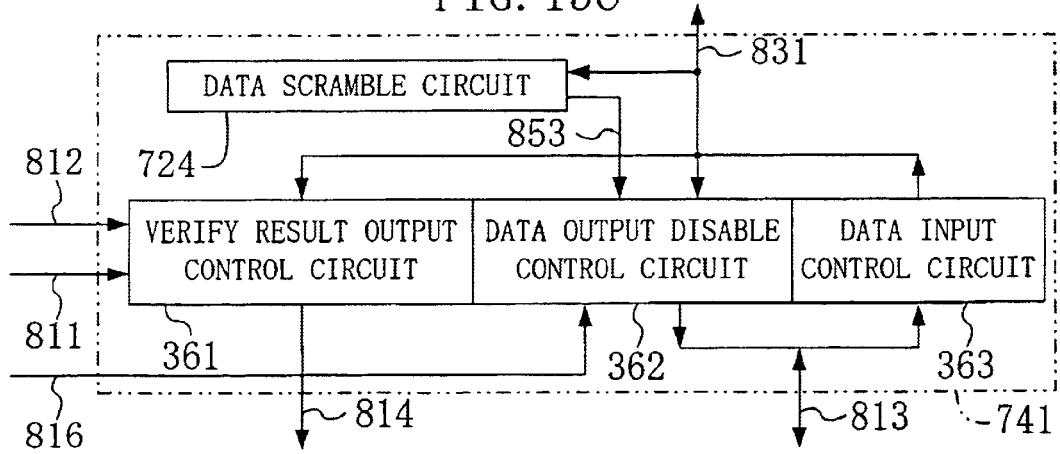

FIG. 15(c) shows a functional configuration of the I/O controller 741 of the semiconductor device according to the second variation of the eleventh embodiment.

As shown in FIG. 15(c), the I/O controller 741 according to the second variation of the present embodiment has the verify result output control circuit 361, the data output disable control circuit 362, and the data input control circuit 363 which are equal to those of the third embodiment. In addition, the I/O controller 741 also has the data scramble circuit 724 as a circuit for generating dummy data.

The data scramble circuit 724 generates the scramble data 853 as dummy data by a method of, e.g., rearranging or substituting data inputted as the sense amplifier signal 831 from the memory cell array 121 and outputs the generated scramble data 853 to the data output disable control circuit 362.

If the read disable remove signal 816 is set to "1", the data output disable control circuit 362 outputs the sense amplifier signal 831 as the data signal 813 to the external I/O controller 307 and cuts off the scramble data 853 in the same manner as in the eleventh embodiment. If the read disable remove signal 816 is set to "0", the data output disable control circuit 362 cuts off the sense amplifier signal 831 and outputs the scramble data 853 as the data signal 813 to the external I/O controller 307 in the same manner as in the eleventh embodiment.

According to the second variation of the present embodiment, if an outsider tries to improperly read the data held in the memory cell array 121 without performing the defined operational procedure, the scramble data 853 outputted from the data scramble circuit 724 is outputted to the outside. This makes it difficult for the outsider to distinguish whether or not the outputted scramble data 853 is the data held in the memory cell array 121 and perform data analysis.

Although the eleventh embodiment and the variations thereof have described the semiconductor devices each obtained by applying the data generating circuit for outputting the dummy data different from the data held in the memory cell array 121 to the semiconductor device according to the third embodiment, the same effects are achievable if the data generating circuit according to any of the present embodiment and the variations thereof is applied to the semiconductor device according to the fifth embodiment.

Embodiment 12

A twelfth embodiment of the present invention will be described herein below with reference to the drawings. The description of components having the same functional configurations as in the fourth embodiment will be omitted by retaining the same reference numerals.

The semiconductor device according to the twelfth embodiment has a structure equal to that of the semiconductor device 401 according to the fourth embodiment shown in FIG. 8(a) and comprises: the CPU 102; the RAM 103; the control circuit 104; and the nonvolatile memory block 405. The nonvolatile memory block 405 is connected to the control signal input terminal 801 and to the address input terminal 802 via the rewrite control circuit 106, while it is connected to the data I/O terminal 803 via the external I/O controller 307. To disable the reading of data held in the nonvolatile memory block 405 to the outside, the write operation detecting unit 208 and the read disable removal controller 209 are provided to be connected to the nonvolatile memory block 405.

The nonvolatile memory block 405 according to the present embodiment is constituted by the memory cell array 221, the I/O controller 122, the sense amplifier 123, and the decoder 124, similarly to the nonvolatile memory block 405 according to the fourth embodiment shown in FIG. 8(a). The memory cell array 221 is composed of flash EEPROMs and divided into n (n is an integer of 2 or more) blocks of the first erase unit 261, the second erase unit 262, . . . , and the n-th erase unit 263 such that an erase operation is performed simultaneously on a per erase-unit basis.

The rewrite operation detecting unit 208 and the read disable removal controller 209 are similarly constituted to the rewrite operation detecting unit 208 and the read disable removal controller 209 according to the second embodiment shown in FIG. 6(a). The rewrite operation detecting unit 208 is constituted by the operation detecting circuit 131, the erase result determining circuit 232, the write result determining circuit 233, and the operational procedure detecting circuit 234. On the other hand, the read disable removal controller 209 is constituted by the read operation detecting circuit 141, the operational procedure detecting register unit 242, and the read disable removing circuit 243.

The semiconductor device according to the present embodiment is different from the semiconductor device according to the second embodiment in that, if a read operation is disabled by the I/O controller, data held in the memory cell array 221 is not outputted, while dummy data different from the data held in the memory cell array 221 is outputted.

A description will be given herein below to the I/O controller of the semiconductor device according to the present embodiment with reference to the drawings.

Figure 16A:
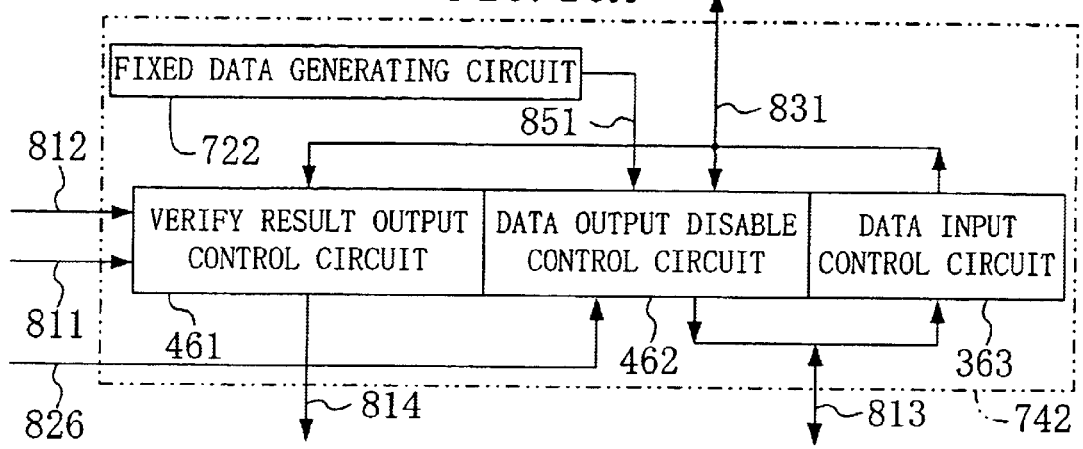
FIG. 16(a) is a functional block diagram showing an I/O controller in a semiconductor device according to a twelfth embodiment of the present invention and FIGS. 16(b) and 16(c) are functional block diagrams showing variations of the I/O controller in the semiconductor device according to the twelfth embodiment.

FIG. 16(a) shows a functional configuration of the I/O controller of the semiconductor device according to the twelfth embodiment.

As shown in FIG. 16(a), an I/O controller 751 according to the present embodiment has the verify result output control circuit 461, the data output disable control circuit 462, and the data input control circuit 363 which are equal to those of the fourth embodiment. In addition, the I/O controller 751 also has the fixed data generating circuit 722 as a circuit for generating dummy data.

The fixed data generating circuit 722 outputs the fixed data 851 as dummy data to the output disable control circuit 462 in the same manner as in the eleventh embodiment.

The data output disable control circuit 462 controls the outputting of the sense amplifier signal 831 inputted from the memory cell array 221 and the outputting of the fixed data 851 inputted from the fixed data generating circuit 722 to the outside based on the control signal 811 and the read disable remove signal 816. Upon receiving a signal indicative of a read operation as the control signal 811, the data output disable control circuit 462 determines the erase unit to which the read operation is to be performed based on the address signal 812. If the read disable remove signal 826 is set to "1", the data output disable control circuit 462 outputs the sense amplifier signal 831 as the data signal 813 to the external I/O controller 307 and cuts off the fixed data 851. If the read disable remove signal 826 to the erase unit to which the read operation is to be performed is set to "0", the data output disable control circuit 462 cuts off the sense amplifier signal 831 and outputs the fixed data 851 as the data signal 831 to the external I/O controller 307.

A description will be given next to the operation of the semiconductor device according to the present embodiment with reference to FIGS. 6(a), 8(a), and 16(a).

In the semiconductor device according to the present embodiment, each of the registers in the operational procedure detecting register unit 242 is in the reset state when the power supply is turned ON in the same manner as in the second embodiment and the variation thereof so that the read disable remove signal 816 to each of the erase units is set to "0". Accordingly, the data output disable control circuit 462 cuts off the sense amplifier signal 831 and outputs the fixed data 851 as the data signal 813 to the external I/O controller 307.

Then, the one of the registers in the operational procedure detecting register unit 242 which corresponds to one of the erase units is brought into the set state and the one of the signals composing the read disable remove signal 826 which corresponds to the erase unit is set to "1" only when the same operational procedure as performed in the first embodiment shown in FIG. 3(a) is performed as the operational procedure defined by the operational procedure detecting circuit 234 to each of the memory cells in the memory cell array 221 in succession. Consequently, the data output disable control circuit 462 cuts off the fixed data 851 in a read operation to the erase unit and outputs the sense amplifier signal 831 as the data signal 813 to the external I/O controller 307. If the read operation is performed without performing the defined operational procedure to the erase unit, on the other hand, the data output disable control circuit 462 outputs the fixed data 851 outputted from the fixed data generating circuit 722 as the data signal 813 to the external I/O controller 307.

As the foregoing operational procedure, the same operational procedure as performed in each of the variations of the first embodiment shown in FIGS. 3(b), 4(a), and 4(b) may also be performed by changing the setting of the operational procedure detecting circuit 234.

Thus, according to the fourteenth embodiment, not only the same effect as achieved by the fourth embodiment is achievable but also the fixed data 851 is outputted from the fixed data generating circuit 722 to the outside if an outsider tries to improperly read data held in the memory cell array 221 without performing the defined operational procedure. As a result, the outsider who tries to perform an improper read operation is misled to recognize the fixed data 851 as the data held in the memory cell array 221 and find it difficult to distinguish the presence or absence of the security protecting function so that more reliable security protection is performed.

The data generating circuit for outputting the dummy data is not limited to the fixed data generating circuit 722 and can be implemented in different variations. It is particularly preferred to generate data which is complicated and difficult to expect. A description will be given to variations using other circuits as the data generating circuit.

Referring to the drawings, the first variation of the present embodiment will be described herein below.

Figure 16B:
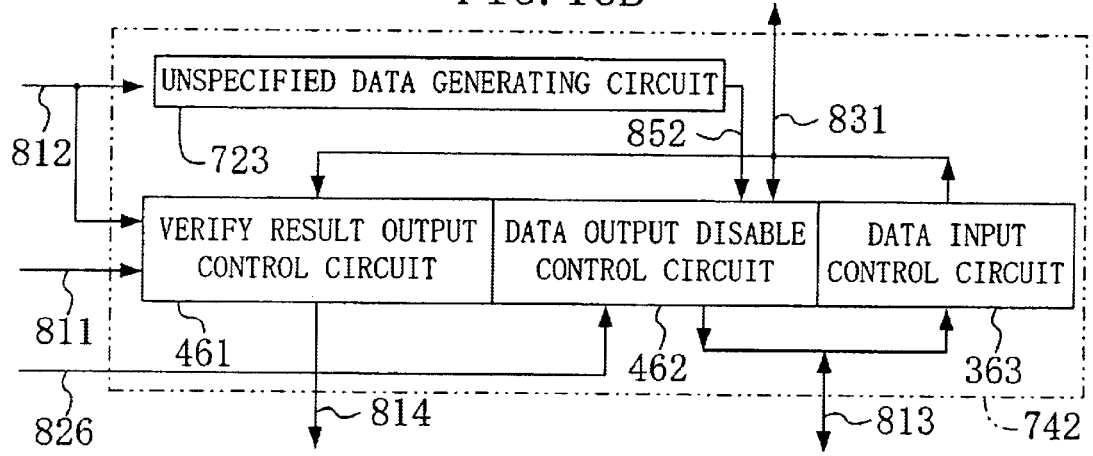

FIG. 16(b) shows a functional configuration of the I/O controller 751 of the semiconductor device according to the first variation of the twelfth embodiment.

As shown in FIG. 16(b), the I/O controller 751 according to the first variation of the present embodiment has the verify result output control circuit 461, the data output disable control circuit 462, and the data input control circuit 363 which are equal to those of the third embodiment. In addition, the I/O controller 751 also has the unspecified data generating circuit 723 as a circuit for generating dummy data.

The unspecified data generating circuit 723 generates the unspecified data 852 based on the address signal 812 and outputs the unspecified data 852 to the data output disable control circuit 462.

If the read disable remove signal 826 to the erase unit indicated by the address signal 812 is set to "1", the data output disable control circuit 462 outputs the sense amplifier signal 831 as the data signal 813 to the external I/O controller 307 and cuts off the unspecified data 852 in the same manner as in the twelfth embodiment. If the read disable remove signal 826 is set to "0", the data output disable control circuit 462 cuts off the sense amplifier signal 831 and outputs the unspecified data 852 as the data signal 813 to the external I/O controller 307 in the same manner as in the twelfth embodiment.

According to the first variation of the present embodiment, if an outsider tries to improperly read data held in the memory cell array 221 without performing the defined operational procedure, the unspecified data 852 outputted from the unspecified data generating circuit 723 is outputted to the outside. This makes it difficult for the outsider who tries to perform an improper read operation to distinguish whether or not the outputted unspecified data 852 is the data held in the memory cell array 221 and perform data analysis.

The second variation of the present embodiment will be described next with reference to the drawings.

Figure 16C:
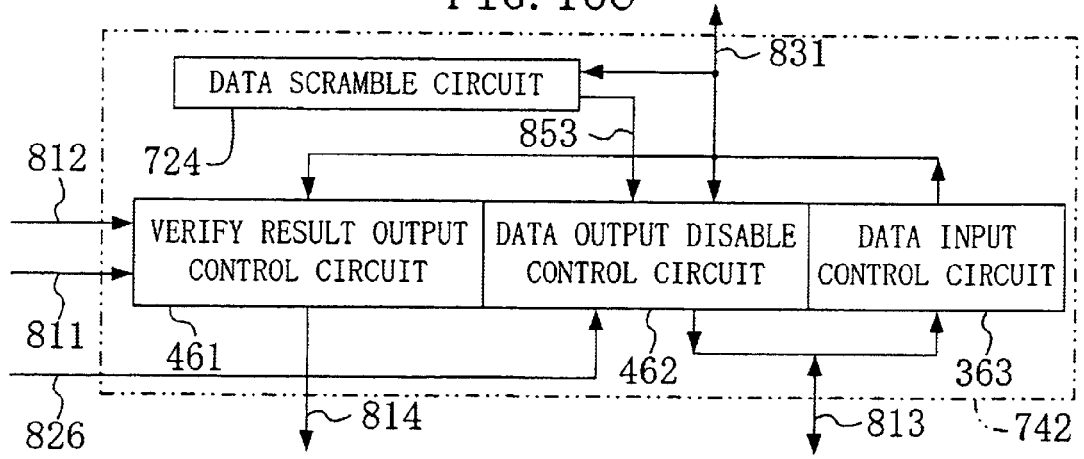
Figure 17A:
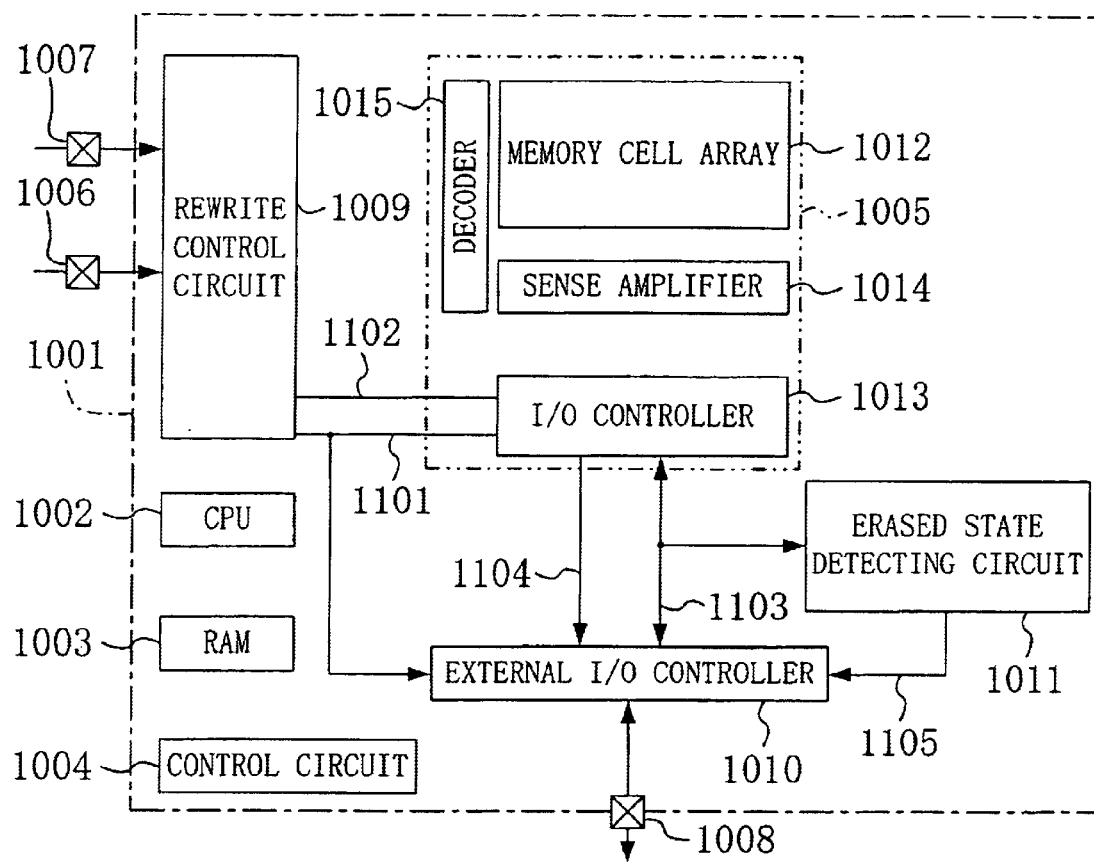
FIG. 17(a) is a functional block diagram showing a semiconductor device according to a first conventional embodiment and FIG. 17(b) is a graph showing an example of respective current characteristic in memory cells in the semiconductor device according to the first conventional embodiment, which illustrates a method for improperly reading data held in a nonvolatile memory block.
Figure 17B:
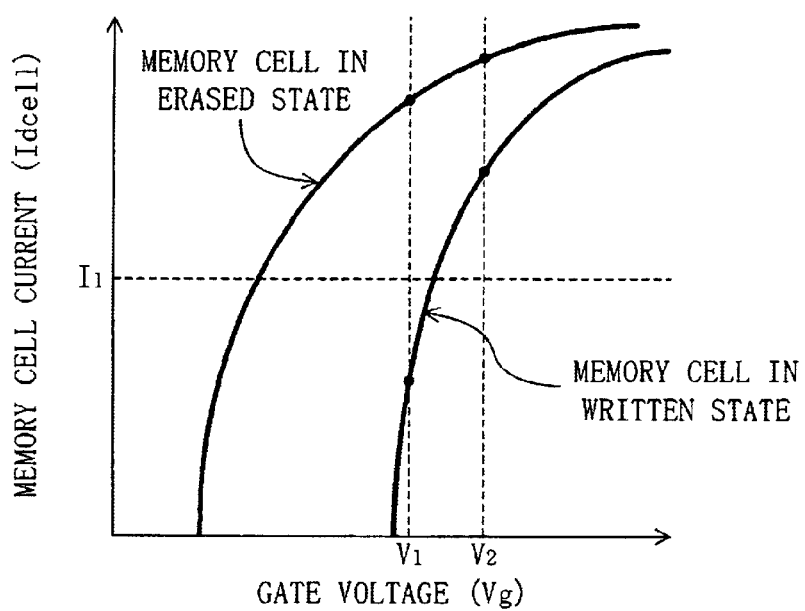

FIG. 16(*c*) shows a functional configuration of the I/O controller 751 of the semiconductor device according to the second variation of the twelfth embodiment.

As shown in FIG. 16(*c*), the I/O controller 751 according to the second variation of the present embodiment has the verify result output control circuit 461, the data output disable control circuit 462, and the data input control circuit 363 which are equal to those of the fourth embodiment. In addition, the I/O controller 751 also has the data scramble circuit 724 as a circuit for generating dummy data.

The data scramble circuit 724 generates the scramble data 853 as dummy data by a method of, e.g., rearranging or substituting data inputted as the sense amplifier signal 831 from the memory cell array 221 and outputs the generated scramble data 853 to the data output disable control circuit 462.

If the read disable remove signal 826 to the erase unit indicated by the address signal 812 is set to "1", the data output disable control circuit 462 outputs the sense amplifier signal 831 as the data signal 813 to the external I/O controller 307 and cuts off the scramble data 853 in the same manner as in the twelfth embodiment. If the read disable remove signal 826 to the erase unit indicated by the address signal is set to "0", the data output disable control circuit 462 cuts off the sense amplifier signal 831 and outputs the scramble data 853 as the data signal 813 to the external I/O controller 307 in the same manner as in the twelfth embodiment.

According to the second variation of the present embodiment, if an outsider tries to improperly read the data held in the memory cell array 221 without performing the specified operational procedure, the scramble data 853 outputted from the data scramble circuit 724 is outputted to the outside. This makes it difficult for the outsider to distinguish whether or not the outputted scramble data 853 is the data held in the memory cell array 221 and perform data analysis.

Although the twelfth embodiment and the variations thereof have described the semiconductor devices each obtained by applying the dummy data generating circuit to the semiconductor device according to the fourth embodiment, the same effects are achievable if the data generating circuit according to any of the present embodiment and the variations thereof is applied to the semiconductor device according to the sixth embodiment.

What is claimed is:

1. A method for driving a semiconductor device including a memory cell array composed of a plurality of electrically rewritable nonvolatile memory cells, and output disabling means for disabling, when a power supply is ON, data held in the nonvolatile memory cells from being outputted to the outside, the method comprising the step of:
removing the disabling of the outputting of the data by the output disabling means when a specified operational procedure is performed to the memory cell array,
wherein the specified operational procedure includes a first procedural step of verifying that the nonvolatile memory cells are in an erased state and a second procedural step of verifying that specified data has been written in the nonvolatile memory cells after the first procedural step.

2. The method of claim 1, wherein the specified operational procedure includes a third procedural step of erasing the data written in the nonvolatile memory cells before the first procedural step and a fourth procedural step of writing data in the memory cell array between the first and second procedural steps.

3. The method of claim 2, wherein the specified operational procedure repeatedly performs the second and fourth procedural steps in succession for each specified number of memory cells.

4. The method of claim 1, wherein the specified operational procedure includes a fifth procedural step of performing a write operation to each of the nonvolatile memory cells prior to the first procedural step.

5. The method of claim 2, wherein the specified operational procedure includes a fifth procedural step of performing a write operation to each of the nonvolatile memory cells prior to the third procedural step.

6. The method of claim 1, wherein the specified operational procedure includes a sixth procedural step of performing, to any one of the nonvolatile memory cells exhibiting an abnormal threshold value in the memory cell array, an operation of restoring the nonvolatile memory cell to a normal threshold value after the second procedural step.

7. A method for driving a semiconductor device including a memory cell array composed of a plurality of electrically rewritable nonvolatile memory cells, the memory cell array being divided into a plurality of erase units from which data is erased simultaneously, and output disabling means for disabling, when a power supply is turned ON, data held in the nonvolatile memory cells from being outputted to the outside on a per erase-unit basis, the method comprising the step of:
removing, if a specified operational procedure is performed to one of the plurality of erase units in the memory cell array, the disabling of the outputting of data held in the one of the erase units by the output disabling means.

8. The method of claim 7, wherein the specified operational procedure includes a first procedural step of verifying that the one of the erase units is in an erased state and a second procedural step of verifying that specified data has been written in the one of the erase units after the first procedural step.

9. The method of claim 8, wherein the specified operational procedure includes a third procedural step of erasing data written in the one of the erase units prior to the first procedural step and a fourth procedural step of writing data in the one of the erase units between the first and second procedural steps.

10. The method of claim 9, wherein the specified operational procedure includes repeatedly performing the second and fourth procedural steps in succession for each specified number of memory cells.

11. The method of claim 8, wherein the specified operational procedure includes a fifth procedural step of performing a write operation to each of the nonvolatile memory cells in the one of the erase units prior to the first procedural step.

12. The method of claim 9, wherein the specified operational procedure includes a fifth procedural step of performing a write operation to each of the nonvolatile memory cells in the one of the erase units prior to the third procedural step.

13. The method of claim 8, wherein the specified operational procedure includes a sixth procedural step of performing, to any one of the nonvolatile memory cells exhibiting an abnormal threshold voltage in the memory cell array, an operation of restoring the nonvolatile memory cell to a normal threshold value after the second procedural step.

14. A semiconductor device comprising:
a memory cell array composed of a plurality of electrically rewritable nonvolatile memory cells;
operational procedure detecting means for detecting whether or not an operation to the memory cell array has been performed in accordance with a specified operational procedure; and
output disabling means disabling the outputting of the data held in the nonvolatile memory cells when a power supply is turned ON, while removing the disabling of the outputting of the data held in the nonvolatile memory cells based on a result of the detection by the operational procedure detecting means,
wherein the specified operational procedure includes a first procedural step of verifying that the nonvolatile memory cells are in an erased state and a second procedure step of verifying that specified data has been written in the nonvolatile memory cells after the first procedural step.

15. The semiconductor device of claim 14, further comprising:
a memory controller for controlling the operation to the memory cell array; and
an external I/O (input/output) controller for controlling inputting and outputting of data held in the nonvolatile memory cells from and to the outside, wherein
the output disabling means is provided in the memory controller to disable the outputting of the data to the external I/O controller and thereby disable the outputting of the data to the outside.

16. The semiconductor device of claim 14, further comprising:
a memory I/O controller for controlling the operation to the memory cell array; and
a CPU for controlling inputting and outputting of the data held in the nonvolatile memory cells from and to the outside, wherein
the output disabling means is provided in the memory I/O controller to disable the outputting of the data to the CPU and thereby disable the outputting of the data to the outside.

17. The semiconductor device of claim 14, further comprising:
abnormal operation detecting means for detecting whether or not the operation to the memory cell array is a normal operation, wherein
the output disabling means does not remove the disabling of the outputting of the data held in the nonvolatile memory cells if the abnormal operation detecting means detects abnormality.

18. The semiconductor device of claim 17, wherein the abnormal operation detecting means detects whether or not the operation to the memory cell array is a normal operation based on a voltage used in the operation to the memory cell array.

19. The semiconductor device of claim 17, wherein the abnormal operation detecting means detects whether or not the operation to the memory cell array is a normal operation depending on whether or not the operation to the memory cell array is included in the specified operational procedure.

20. The semiconductor device of claim 14, further comprising:
a data generating circuit for generating dummy data different from the data held in the nonvolatile memory cells, wherein
the output disabling means outputs the dummy data if it disables the outputting of the data held in the nonvolatile memory cells.

21. The semiconductor device of claim 20, wherein the data generating circuit generates fixed data.

22. The semiconductor device of claim 20, wherein the data generating circuit generates unspecified data by causing a transition in address information.

23. The semiconductor device of claim 20, wherein the data generating circuit generates scramble data by rearranging the data held in the nonvolatile memory cells.

24. A semiconductor device comprising:
a memory cell array composed of a plurality of electrically rewritable nonvolatile memory cells;
output disabling means for disabling data held in the nonvolatile memory cells from being outputted to the outside;
operational procedure detecting means for detecting whether or not a specified operational procedure has been performed to the nonvolatile memory cells composing the memory cell array; and
a volatile register for storing a result of the detection by the operational procedure detecting means,
the register being brought into a set state if the operational procedure detecting means detects the specified operational procedure,
the output disabling means disabling the outputting of the data held in the nonvolatile memory cells if the register is in a reset state and enabling the outputting of the data held in the nonvolatile memory cells if the register is in the set state.

25. The semiconductor device of claim 24, further comprising:
a memory controller for controlling an operation to the memory cell array; and
an external I/O controller for controlling inputting and outputting of the data held in the nonvolatile memory cells from and to the outside, wherein
the output disabling means is provided in the memory controller to disable the outputting of the data to the external I/O controller and thereby disable the outputting of the data to the outside.

26. The semiconductor device of claim 24, further comprising:
a memory I/O controller for controlling an operation to the memory cell array; and
a CPU for controlling inputting and outputting of the data held in the nonvolatile memory cells from and to the outside, wherein
the output disabling means is provided in the memory I/O controller to disable the outputting of the data to the CPU and thereby disable the outputting of the data to the outside.

27. The semiconductor device of claim 24, further comprising:
abnormal operation detecting means for detecting whether or not an operation to the memory cell array is a normal operation, wherein
the output disabling means does not remove the disabling of the outputting of the data held in the nonvolatile memory cells if the abnormal operation detecting means detects abnormality.

28. The semiconductor device of claim 27, wherein the abnormal operation detecting means detects whether or not the operation to the memory cell array is a normal operation based on a voltage used in the operation to the memory cell array.

29. The semiconductor device of claim 27, wherein the abnormal operation detecting means detects whether or not the operation to the memory cell array is a normal operation depending on whether or not the operation to the memory cell array is included in the specified operational procedure.

30. The semiconductor device of claim 24, further comprising:
a data generating circuit for generating dummy data different from the data held in the nonvolatile memory cells, wherein
the output disabling means outputs the dummy data when it disables the outputting of the data held in the nonvolatile memory cells.

31. The semiconductor device of claim 30, wherein the data generating circuit generates fixed data.

32. The semiconductor device of claim 30, wherein the data generating circuit generates unspecified data by causing a transition in address information.

33. The semiconductor device of claim 30, wherein the data generating circuit generates scramble data by rearranging the data held in the nonvolatile memory cells.

34. A semiconductor device comprising:
a memory cell array composed of a plurality of electrically rewritable nonvolatile memory cells, the memory cell array being divided into a plurality of erase units from which data is erased simultaneously;
output disabling means for disabling data held in the nonvolatile memory cells in each of the erase units from being outputted to the outside on a per erase-unit basis;
operational procedure detecting means for detecting whether or not a specified operational procedure has been performed to one of the plurality of erase units in the memory cell array on a per erase-unit basis; and
a register unit composed of a plurality of volatile registers for storing, in a one-to-one correspondence to the plurality of erase units, results of the detection performed by the operational procedure detecting means on a per erase-unit basis,
the register unit bringing, if the operational procedure detecting means detects the specified operational procedure to one of the plurality of erase units, the one of the registers corresponding to the one of the erase units into a set state,
the output disabling means disabling, if one of the plurality of registers is in a reset state, the outputting of data held in the erase unit corresponding to the one of the registers and enabling, if the one of the registers is in the set state, the outputting of the data held in the erase unit corresponding to the one of the registers.

35. The semiconductor device of claim 34, further comprising:
a memory controller for controlling an operation to the memory cell array; and
an external I/O controller for controlling inputting and outputting of the data held in the nonvolatile memory cells from and to the outside, wherein
the output disabling means is provided in the memory controller to disable the outputting of the data to the external I/O controller and thereby disable the outputting of the data to the outside.

36. The semiconductor device of claim 34, further comprising:
a memory I/O controller for controlling an operation to the memory cell array; and
a CPU for controlling inputting and outputting of the data held in the nonvolatile memory cells from and to the outside, wherein
the output disabling means is provided in the memory I/O controller to disable the outputting of the data to the CPU and thereby disable the outputting of the data to the outside.

37. The semiconductor device of claim 34, further comprising:
abnormal operation detecting means for detecting whether or not an operation to the one of the erase units is a normal operation, wherein
the output disabling means does not remove the disabling of the outputting of the data held in the one of the erase units if the abnormal operation detecting means detects abnormality.

38. The semiconductor device of claim 37, wherein the abnormal operation detecting means detects whether or not the operation to the one of the erase units is a normal operation based on a voltage used in the operation to the one of the erase units.

39. The semiconductor device of claim 37, wherein the abnormal operation detecting means detects whether or not the operation to the one of the erase units is a normal operation depending on whether or not the operation to the one of the erase units is included in the specified operational procedure.

40. The semiconductor device of claim 34, further comprising:
a data generating circuit for generating dummy data different from the data held in the nonvolatile memory cells, wherein
the output disabling means outputs the dummy data when it disables the outputting of the data held in the nonvolatile memory cells.

41. The semiconductor device of claim 40, wherein the data generating circuit generates fixed data.

42. The semiconductor device of claim 40, wherein the data generating circuit generates unspecified data by causing a transition in address information.

43. The semiconductor device of claim 40, wherein the data generating circuit generates scramble data by rearranging the data held in the nonvolatile memory cells.

* * * * *